United States Patent
Huangfu et al.

(10) Patent No.: US 10,854,684 B2
(45) Date of Patent: Dec. 1, 2020

(54) PIXEL ARRANGEMENT STRUCTURE AND DRIVING METHOD THEREOF, DISPLAY SUBSTRATE AND DISPLAY DEVICE

(71) Applicant: BOE TECHNOLOGY GROUP CO., LTD., Beijing (CN)

(72) Inventors: Lujiang Huangfu, Beijing (CN); Xiaodan Jin, Beijing (CN); Yinan Liang, Beijing (CN); Zhenzhen Li, Beijing (CN); Wenjing Tan, Beijing (CN); Libin Liu, Beijing (CN); Qian Yang, Beijing (CN); Hongli Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 122 days.

(21) Appl. No.: 16/234,777

(22) Filed: Dec. 28, 2018

(65) Prior Publication Data
US 2019/0140030 A1    May 9, 2019

Related U.S. Application Data

(63) Continuation-in-part of application No. 15/536,347, filed as application No. PCT/CN2016/081097 on
(Continued)

(30) Foreign Application Priority Data

Feb. 18, 2016   (CN) .................... 2016 2 0127445 U
Jul. 22, 2016   (CN) .......................... 2016 1 0585894
(Continued)

(51) Int. Cl.
*H01L 27/32* (2006.01)
*G09G 3/3225* (2016.01)
(Continued)

(52) U.S. Cl.
CPC ....... *H01L 27/3218* (2013.01); *G09G 3/3225* (2013.01); *G09G 3/3233* (2013.01);
(Continued)

(58) Field of Classification Search
CPC .............. H01L 51/525; H01L 27/3218; H01L 27/3246; H01L 27/3276; H01L 27/3279; G09G 3/3225; G09G 3/3233
(Continued)

(56) References Cited

U.S. PATENT DOCUMENTS

| 4,491,863 A | 1/1985 | Kurahashi |
| 4,652,912 A | 3/1987 | Masubuchi |

(Continued)

FOREIGN PATENT DOCUMENTS

| CN | 101192382 A | 6/2008 |
| CN | 102201430 A | 9/2011 |

(Continued)

OTHER PUBLICATIONS

U.S. First Office Action in U.S. Appl. No. 15/578,481, dated Feb. 1, 2019.
(Continued)

*Primary Examiner* — William R Alexander
(74) *Attorney, Agent, or Firm* — Collard & Roe, P.C.

(57) ABSTRACT

A pixel arrangement structure, including a plurality of repeating units, wherein each of the plurality of repeating units includes one first sub-pixel, one second sub-pixel, and two third sub-pixels; in each of the plurality of repeating units, the two third sub-pixels are arranged in one of a first direction and a second direction, and the first sub-pixel and the second sub-pixel are arranged in the other one of the first direction and the second direction; the plurality of repeating units are arranged in the first direction to form a plurality of repeating unit groups, the plurality of repeating unit groups
(Continued)

are arranged in the second direction; and the first direction and the second direction are different directions.

47 Claims, 22 Drawing Sheets

Related U.S. Application Data

May 5, 2016, now Pat. No. 10,274,654, application No. 16/234,777, which is a continuation-in-part of application No. 15/578,481, filed as application No. PCT/CN2017/075957 on Mar. 8, 2017, now abandoned.

(30) Foreign Application Priority Data

| Feb. 9, 2018 | (CN) | 2018 1 0135947 |
|---|---|---|
| Feb. 9, 2018 | (CN) | 2018 1 0135948 |
| Feb. 9, 2018 | (CN) | 2018 1 0136335 |
| Feb. 9, 2018 | (CN) | 2018 1 0137012 |
| Feb. 9, 2018 | (CN) | 2018 1 0137014 |
| Feb. 9, 2018 | (CN) | 2018 1 0137016 |
| Dec. 13, 2018 | (CN) | 2018 1 1525578 |

(51) Int. Cl.
 *G09G 3/3233* (2016.01)
 *H01L 51/52* (2006.01)

(52) U.S. Cl.
 CPC ...... *H01L 27/3246* (2013.01); *H01L 27/3276* (2013.01); *H01L 27/3279* (2013.01); *H01L 51/525* (2013.01); *G09G 2300/0452* (2013.01); *G09G 2300/0842* (2013.01); *G09G 2310/0251* (2013.01); *G09G 2310/0262* (2013.01); *H01L 27/3216* (2013.01)

(58) Field of Classification Search
 USPC .......................................................... 359/891
 See application file for complete search history.

(56) References Cited

U.S. PATENT DOCUMENTS

| 5,113,274 | A | 5/1992 | Takahashi et al. |
|---|---|---|---|
| 5,341,153 | A | 8/1994 | Benzschawel et al. |
| 6,681,053 | B1 | 1/2004 | Zhu |
| 6,950,115 | B2 | 9/2005 | Brown Elliott |
| 7,663,299 | B2 | 2/2010 | Chao et al. |
| 7,733,359 | B1* | 6/2010 | Hagge ................ H01L 27/3288 |
| | | | 345/695 |
| 8,159,508 | B2 | 4/2012 | Lee |
| 8,363,072 | B2 | 1/2013 | Hong et al. |
| 8,446,435 | B2 | 5/2013 | Tomizawa et al. |
| 8,754,913 | B2 | 6/2014 | Hwang et al. |
| 8,994,015 | B2 | 3/2015 | Pyon et al. |
| 9,343,511 | B1 | 5/2016 | Feng |
| 9,424,771 | B2 | 8/2016 | Gong |
| 9,697,760 | B2 | 7/2017 | Wang |
| 9,704,926 | B2 | 7/2017 | Kim |
| 9,818,803 | B2 | 11/2017 | Lee |
| 9,871,085 | B2 | 1/2018 | Cho et al. |
| 9,905,604 | B2 | 2/2018 | Murata |
| 10,026,785 | B2 | 7/2018 | Bai et al. |
| 10,068,541 | B2 | 9/2018 | Sakaigawa |
| 10,520,775 | B2 | 12/2019 | You et al. |
| 10,579,173 | B2 | 3/2020 | Xu et al. |
| 2005/0018110 | A1* | 1/2005 | Liu .................. G02F 1/133514 |
| | | | 349/106 |
| 2007/0205423 | A1 | 9/2007 | Yamazaki et al. |
| 2007/0290973 | A1 | 12/2007 | Wei |
| 2008/0001525 | A1 | 1/2008 | Chao et al. |
| 2009/0121983 | A1 | 5/2009 | Sung et al. |
| 2009/0302331 | A1 | 12/2009 | Smith et al. |
| 2010/0289732 | A1 | 11/2010 | Ina et al. |
| 2011/0128262 | A1 | 6/2011 | Chaji et al. |
| 2011/0260951 | A1 | 10/2011 | Hwang et al. |
| 2011/0291549 | A1 | 12/2011 | Kim et al. |
| 2011/0291550 | A1 | 12/2011 | Kim et al. |
| 2012/0039034 | A1 | 2/2012 | Jepsen et al. |
| 2012/0092238 | A1 | 4/2012 | Hwang et al. |
| 2013/0234917 | A1 | 9/2013 | Lee |
| 2014/0226323 | A1 | 8/2014 | Huang et al. |
| 2014/0252321 | A1 | 9/2014 | Pyon et al. |
| 2014/0292622 | A1 | 10/2014 | Lee |
| 2015/0015465 | A1 | 1/2015 | Gong |
| 2015/0021637 | A1 | 1/2015 | Ann et al. |
| 2015/0102320 | A1 | 4/2015 | Jung |
| 2015/0162394 | A1 | 6/2015 | Tokuda et al. |
| 2015/0270317 | A1 | 9/2015 | Lee et al. |
| 2015/0364525 | A1 | 12/2015 | Lin et al. |
| 2016/0049438 | A1 | 2/2016 | Murata |
| 2016/0078807 | A1 | 3/2016 | Sun et al. |
| 2016/0126296 | A1 | 5/2016 | Feng |
| 2016/0126298 | A1 | 5/2016 | Chen |
| 2016/0155781 | A1 | 6/2016 | Chaji |
| 2016/0171918 | A1 | 6/2016 | Kim et al. |
| 2016/0190523 | A1 | 6/2016 | Kim et al. |
| 2016/0196776 | A1 | 7/2016 | Yang et al. |
| 2016/0240593 | A1 | 8/2016 | Gu et al. |
| 2016/0293678 | A1 | 10/2016 | Wang |
| 2016/0329385 | A1 | 11/2016 | Qiu et al. |
| 2016/0351119 | A1 | 12/2016 | Ono |
| 2016/0357076 | A1 | 12/2016 | Huangfu et al. |
| 2016/0358985 | A1 | 12/2016 | Bai et al. |
| 2017/0193880 | A1 | 7/2017 | Lee et al. |
| 2017/0294491 | A1* | 10/2017 | Jo ...................... G09G 3/2003 |
| 2017/0317150 | A1 | 11/2017 | Chung et al. |
| 2018/0030890 | A1 | 2/2018 | Roe et al. |
| 2018/0088260 | A1 | 3/2018 | Jin et al. |
| 2018/0308907 | A1 | 10/2018 | Jin et al. |
| 2019/0066564 | A1 | 2/2019 | Tan |
| 2019/0115399 | A1 | 4/2019 | Jo et al. |
| 2019/0206341 | A1 | 7/2019 | Liao et al. |
| 2019/0237518 | A1 | 8/2019 | Sun et al. |
| 2020/0013833 | A1 | 1/2020 | Wang et al. |
| 2020/0035172 | A1 | 1/2020 | Chen |

FOREIGN PATENT DOCUMENTS

| CN | 104037202 A | 9/2014 |
|---|---|---|
| CN | 104051493 A | 9/2014 |
| CN | 104269411 A | 1/2015 |
| CN | 104282727 A | 1/2015 |
| CN | 104332486 A | 2/2015 |
| CN | 104362170 A | 2/2015 |
| CN | 104597655 A | 5/2015 |
| CN | 104701341 A | 6/2015 |
| CN | 104795431 A | 7/2015 |
| CN | 104882464 A | 9/2015 |
| CN | 105280139 A | 1/2016 |
| CN | 205231065 U | 5/2016 |
| CN | 205355055 U | 6/2016 |
| CN | 105938266 A | 9/2016 |
| CN | 205608350 U | 9/2016 |
| CN | 205845956 U | 12/2016 |
| CN | 106293244 A | 1/2017 |
| CN | 106601167 A | 4/2017 |
| CN | 106782307 A | 5/2017 |
| CN | 106935618 A | 7/2017 |
| CN | 106935630 A | 7/2017 |
| CN | 107248378 A | 10/2017 |
| CN | 107256695 A | 10/2017 |
| CN | 107275359 A | 10/2017 |
| CN | 107393468 A | 11/2017 |
| CN | 107644888 A | 1/2018 |
| CN | 107665684 A | 2/2018 |
| CN | 107817632 A | 3/2018 |
| CN | 107910348 A | 4/2018 |
| CN | 207781607 U | 8/2018 |
| CN | 207781608 U | 8/2018 |

(56) References Cited

FOREIGN PATENT DOCUMENTS

| CN | 207883217 U | 9/2018 |
|---|---|---|
| CN | 109491158 A | 3/2019 |
| CN | 109559679 A | 4/2019 |
| EP | 2 680 310 A1 | 1/2014 |
| JP | 2008197491 A | 8/2008 |
| KR | 10-2011-0108050 A | 10/2011 |
| KR | 101347995 B1 | 1/2014 |
| KR | 10-2015-0006668 A | 1/2015 |
| KR | 20160051511 A | 5/2016 |
| RU | 2 453 879 C2 | 6/2012 |

OTHER PUBLICATIONS

Korean Office Action in Korean Application No. 10-2017-7022698, dated May 29, 2019 with English translation.

International Search Report of PCT/CN2018/124890 in Chinese, dated Mar. 27, 2019, with English translation.

Notice of Transmittal of the International Search Report of PCT/CN2018/124890 in Chinese, dated Mar. 27, 2019.

Written Opinion of the International Searching Authority of PCT/PCT/CN2018/124890 in Chinese, dated Mar. 27, 2019 with English translation.

International Search Report of PCT/CN2018/124404 in Chinese, dated Mar. 14, 2019, with English translation.

Notice of Transmittal of the International Search Report of PCT/CN2018/124404 in Chinese, dated Mar. 14, 2019.

Written Opinion of the International Searching Authority of PCT/CN2018/124404 in Chinese, dated Mar. 14, 2019 with English translation.

International Search Report of PCT/CN2018/124445 in Chinese, dated Mar. 21, 2019, with English translation.

Notice of Transmittal of the International Search Report of PCT/CN2018/124445 in Chinese, dated Mar. 21, 2019.

Written Opinion of the International Searching Authority of PCT/CN2018/124445 in Chinese, dated Mar. 21, 2019 with English translation.

International Search Report of PCT/CN2018124881 in Chinese, dated Mar. 26, 2019, with English translation.

Notice of Transmittal of the International Search Report of PCT/CN2018124881 in Chinese, dated Mar. 26, 2019.

Written Opinion of the International Searching Authority of PCT/CN2018124881 in Chinese, dated Mar. 26, 2019 with English translation.

International Search Report of PCT/CN2018/124884 in Chinese, dated Mar. 27, 2019, with English translation.

Notice of Transmittal of the International Search Report of PCT/CN2018/124884 in Chinese, dated Mar. 27, 2019.

Written Opinion of the International Searching Authority of PPCT/CN2018/124884 in Chinese, dated Mar. 27, 2019 with English translation.

International Search Report of PCT/CN2018/124386 in Chinese, dated Mar. 29, 2019, with English translation.

Notice of Transmittal of the International Search Report of PCT/CN2018/124386 in Chinese, dated Mar. 29, 2019.

Written Opinion of the International Searching Authority of PCT/CN2018/124386 in Chinese, dated Mar. 29, 2019 with English translation.

Chinese Office Action in Chinese Application No. 201810135947.1, dated Mar. 3, 2020 with English translation.

Russian Office Action in Russian Application No. 2019130488/28(059921), dated Mar. 18, 2020 with English translation.

Huang et al, RGB to RGB conversion algorithm based upon weighting factors and related FPGA realization, Chinese journal of Liquid Crystals and Displays, vol. 32 No. 7, Jul. 2017 pp. 572-579.

Messing, Dean et al, Improved Display Resolution of Subsampled Colour Images Using Subpixel Addressing, IEEE ICIP 2002, pp. 625-628.

Fang et al, Subpixel Rendering: From Font Rendering to Image Subsampling IEEE Signal Processing Magazine, May 2013, pp. 177-182, 189.

Candice Hellen Brown Elliot, Reducing Pixel Count Without Reducing Image Quality, Information Display, Dec. 1999.

International Search Report of PCT/CN2016/081097 in Chinese, dated Nov. 16, 2016 with English translation.

Notice of Transmittal of the International Search Report of PCT/CN2016/081097 in Chinese, dated Nov. 16, 2016.

Written Opinion of the International Searching Authority of PCT/CN2016/081097 in Chinese, dated Nov. 16, 2016 with English translation.

English translation of International Search Report dated Jun. 8, 2017, issued in counterpart International Application No. PCT/CN2017/075957 (12 pages).

Non Final Rejection in U.S. Appl. No. 15/536,347 dated Aug. 28, 2018 12 pages.

Notice of Allowance in U.S. Appl. No. 15/536,347 dated Dec. 18, 2018.

U.S. Non-Final Office Action in U.S. Appl. No. 16/492,930, dated Jul. 24, 2020.

Korean Office Action in Korean Application No. 10-2017-7022698, dated Mar. 6, 2020 with English translation.

Korean Office Action in Korean Application No. 10-2019-7024785, dated Jul. 30, 2020 with English translation.

English translation of Extended European Search Report in EP Application No. 17768339.8 dated Dec. 6, 2019.

U.S. Non-Final Office Action in U.S. Appl. No. 15/578,481, dated Jul. 11, 2019.

U.S. Non-Final Office Action in U.S. Appl. No. 15/578,481, dated Jul. 11, 2019 received on Jul. 11, 2019.

International Search Report of PCT/CN2019/098707 in Chinese, dated May 9, 2020, with English translation.

Notice of Transmittal of the International Search Report of PCT/CN2019/098707 in Chinese, dated May 9, 2020.

Written Opinion of the International Searching Authority of PCT/CN2019/098707 in Chinese, dated May 9, 2020 with English translation.

International Search Report of PCT/CN2019/098705 in Chinese, dated May 6, 2020, with English translation.

Notice of Transmittal of the International Search Report of PCT/CN2019/098705 in Chinese, dated May 6, 2020.

Written Opinion of the International Searching Authority of PCT/CN2019/098705 in Chinese, dated May 6, 2020 with English translation.

U.S. First Office Action in U.S. Appl. No. 16/621,918, dated Sep. 29, 2020.

U.S. First Office Action in U.S. Appl. No. 16/600,316, dated Oct. 6, 2020.

* cited by examiner

PIXEL ARRANGEMENT STRUCTURE AND DRIVING METHOD THEREOF, DISPLAY SUBSTRATE AND DISPLAY DEVICE

CROSS REFERENCE TO RELATED APPLICATIONS

This application is a continuation in part of U.S. Ser. No. 15/536,347 filed on Jun. 15, 2017 which is a national stage application of international application PCT/CN2016/081097 filed on May 5, 2016, which claims priority from CN201620127445.0 filed Feb. 18, 2016. This application is also a continuation in part application of Ser. No. 15/578,481 filed on Nov. 30, 2017 which is a national stage application of international application PCT/CN2017/075957 filed on Mar. 8, 2017 which claims priority from CN 201610585894.4 filed on Jul. 22, 2016. This application also claims priority under 35 U.SC. 119 from the following applications CN 201810135947.1 filed on Feb. 9, 2018, CN 201810137012.7 filed on Feb. 9, 2018, CN 201810136335.4 filed on Feb. 9, 2018, CN 201810135948.6 filed on Feb. 9, 2018, CN 201810137016.5 filed on Feb. 9, 2018, CN 201810137014.6 filed on Feb. 9, 2018, CN 201811525578.3 filed on Dec. 13, 2018 the disclosures of all of these applications hereby incorporated herein by reference in their entirety.

TECHNICAL FIELD

The present disclosure relates to a pixel arrangement structure and driving method thereof, display substrate and display device.

BACKGROUND

Nowadays, the continuous developments of the display technique has led to higher requirements to the display resolution and the higher display resolution in turn would increase the techniques complexity and cost for preparing and making displays. When the display resolution is at a similar level of the naked-eye resolution, the conventional mode of using three sub-pixels namely red (R), green (G) and blue (B) for defining one pixel briefly may be changed, based on the differences of naked eyes in distinguishing different colored pixels. That is, by sharing some sub-pixels which color have less sensitive resolutions at certain location in different pixels, and using relatively less sub-pixels to simulate the same pixel resolution performance, complexity and cost of the Fine Metal Mask (FMM) techniques is reduced.

SUMMARY

Embodiments of the disclosure provide a pixel arrangement structure, comprising a plurality of repeating units, wherein each of the plurality of repeating units comprises one first sub-pixel, one second sub-pixel, and two third sub-pixels; in each of the plurality of repeating units, the two third sub-pixels are arranged in one of a first direction and a second direction, and the first sub-pixel and the second sub-pixel are arranged in the other one of the first direction and the second direction; the plurality of repeating units are arranged in the first direction to form a plurality of repeating unit groups, the plurality of repeating unit groups are arranged in the second direction; and the first direction and the second direction are different directions.

Embodiments of the disclosure further provide a driving method of the pixel arrangement structure, a display substrate including the pixel arrangement structure and a display device including the display substrate.

BRIEF DESCRIPTION OF THE DRAWINGS

In order to illustrate embodiments of the disclosure clearly, drawings required for a description of the embodiments will be described briefly. Apparently, the drawings in the following description are only some embodiments of the present disclosure, rather than limitations to the present disclosure.

REFERENCE NUMBERS

10—pixel; 101—red sub-pixel; 102—blue sub-pixel; 103—green sub-pixel.

DETAILED DESCRIPTION

Solutions in the embodiments of the present disclosure will be described clearly and completely below in conjunction with the accompanying drawings of the embodiments of the present disclosure. It is obvious that the described embodiments are only part of the embodiments of the present disclosure, but not all the embodiments. Based on the embodiments of the present disclosure, other embodiments obtained by those ordinary skilled in the art without creative labors would belong to the protection scope of the present disclosure.

Figure 1:
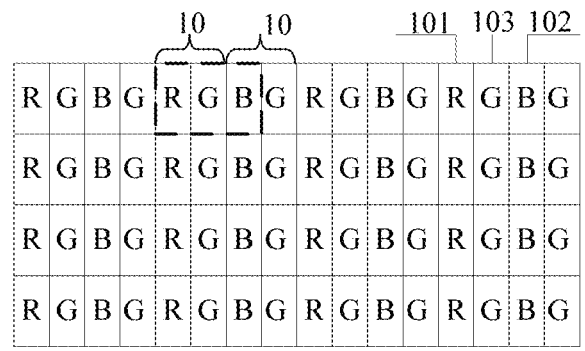
FIG. 1 is a diagram illustrating the arrangement of red, green and blue sub-pixels in the pixel arrangement structure according to some related arts.

With reference to FIG. 1, in some related arts, in the row direction, red, green, blue, and green sub-pixels are arranged in cycles, wherein in each pixel 10, there is an independent green sub-pixel 103, a red sub-pixel 101 and a blue sub-pixel 102 located on both sides and shared by the adjacent pixels 10, thus the sub-pixel density in the direction of rows is two times of the pixel density, and the sub-pixel density in the direction of columns is the same as the pixel density.

With reference to FIG. 1, one red sub-pixel 101 and one green sub-pixel 103 form a pixel 10, and one blue sub-pixel 102 and one green sub-pixel 103 form a pixel 10. The pixel here only includes two sub-pixels with different colors. It is necessary for the pixel to borrow or share a sub-pixel of other pixels to realize color display. Therefore, the pixel 10 here may be called virtual pixel.

Accordingly, although the same resolution ratio may be achieved with a few sub-pixels, in the direction of rows the sub-pixel density is still equal two times of the pixel density, which results in high requirements to the FMM technique level.

An embodiment according to the present disclosure provides a pixel arrangement structure, comprising a plurality of repeating units, each repeating unit comprising one first sub-pixel, one second sub-pixel and two third sub-pixels.

The four sub-pixels of each repeating unit constitute two pixels, the first sub-pixel and the second sub-pixel being shared by the two pixels. In a first direction of the pixel array, the sub-pixel density is equal to 1.5 times of the pixel density, in a second direction of the pixel array, the sub-pixel density is equal to 1.5 times of the pixel density. The first direction and the second direction are different directions.

It is to be noted that, in the first aspect, the pixel arrangement structure according to the embodiments of the present disclosure can be applied to any display device composed of three sub-pixels such as red, green and blue sub-pixels. Examples of the display device may be Liquid Crystal Display (LCD) and Organic Light-Emitting Diode (OLED) etc.

In the second aspect, since the first sub-pixel and the second sub-pixel of each pixel are shared by two pixels, the pixels according to the embodiments of the present disclosure cannot be considered as real pixels in a strict definition, where a pixel is defined by a complete one first sub-pixel, one second sub-pixel and one third sub-pixel. Therefore, the pixels of the present disclosure may be called virtual pixels.

Since the first sub-pixel and the second sub-pixel are shared by two pixels, the boundary of each virtual pixel is blurry. Thus, the shape of each pixel is not defined by the embodiments of the present disclosure.

In the third aspect, it is known to a person skilled in the art that, based on the pixel arrangement structure, the pixels and the first sub-pixel, the second sub-pixel and the third sub-pixels in each pixel may be distributed evenly.

In the fourth aspect, the first and second directions as illustrated in the accompanying drawings are only illustrations in a general view, that is, in order to satisfy that sub-pixel density is 1.5 times of pixel density and pixels and each sub-pixel in pixels are evenly distributed in overall, the first direction in a closer view might not be a completely straight line but wavy lines, the same applies to the second direction.

The first direction and the second direction may be for example two directions being perpendicular to each other in the same plane, such as the plane where the pixels are arranged.

Embodiments of the present disclosure provide a pixel arrangement structure, since the four sub-pixels in each repeating unit may form two pixels, wherein the first sub-pixel and the second sub-pixel are shared by two pixels, in the first direction of the pixel array, the sub-pixel density is 1.5 times of the pixel density, in the second direction of the pixel array, the sub-pixel density is 1.5 times of the pixel density. Compared to the technologies in the art where in one direction, the sub-pixel density is two times of the pixel density and in another direction, the sub-pixel density is equal to the pixel density, the embodiments of the present disclosure reduces the sub-pixel density while balancing the quantity of the sub-pixels in two directions, thus may avoid having too many sub-pixels in one particular direction. Thus when the pixel arrangement structure is applied to a display panel, the FMM techniques complexity for making the pixels of the display panel may be reduced in overall.

In an example, the first sub-pixel is red sub-pixel, the second sub-pixel is blue sub-pixel, and the third sub-pixel is green sub-pixel.

In other words, the pixel arrangement structure comprises a plurality of repeating units, wherein each repeating unit comprises one first sub-pixel, one blue sub-pixel and two green sub-pixels; the four sub-pixels of each repeating unit constitute two pixels, the red sub-pixel and the blue sub-pixel being shared by the two pixels; in a first direction of the pixel array, the sub-pixel density is equal to 1.5 times of the pixel density, in a second direction of the pixel array, the sub-pixel density is equal to 1.5 times of the pixel density; wherein, the first direction and the second direction are different directions.

It is to be noted that, in the first aspect, since the red sub-pixel and the blue sub-pixel of each pixel are shared by two pixels, the pixels according to the embodiments of the present disclosure cannot be considered as real pixels in a strict definition, where a pixel is defined by a complete one red sub-pixel, one green sub-pixel and one blue sub-pixel. Therefore, the pixels of the present disclosure may be called virtual pixels.

Since the red sub-pixel and the blue sub-pixel are shared by two pixels, the boundary of each virtual pixel is blurry. Thus, the shape of each pixel is not defined by the embodiments of the present disclosure.

In the second aspect, it is known to a person skilled in the art that, in the case of high resolution, the green sub-pixels play a critical role in deciding the perceived luminance central position of each pixel. Thus, based on the embodiments of the present disclosure, the green sub-pixels in each pixel may be in overall distributed evenly.

Since the embodiments of the present disclosure requires that whether in the first direction or in the second direction, the sub-pixel density is 1.5 times of the pixel density, causing difficulties for the green sub-pixels to be distributed with equal space in all the locations. Accordingly, the embodiments of the present disclosure may achieve the even distribution of the green sub-pixels in overall in a range of more than three pixel-spaces by slightly adjusting the relative position of the green sub-pixels in different rows and columns.

Based on this, the red sub-pixels and the blue sub-pixels shared by two adjacent pixels may be evenly distributed as much as possible together with the green sub-pixels.

Figure 2A:
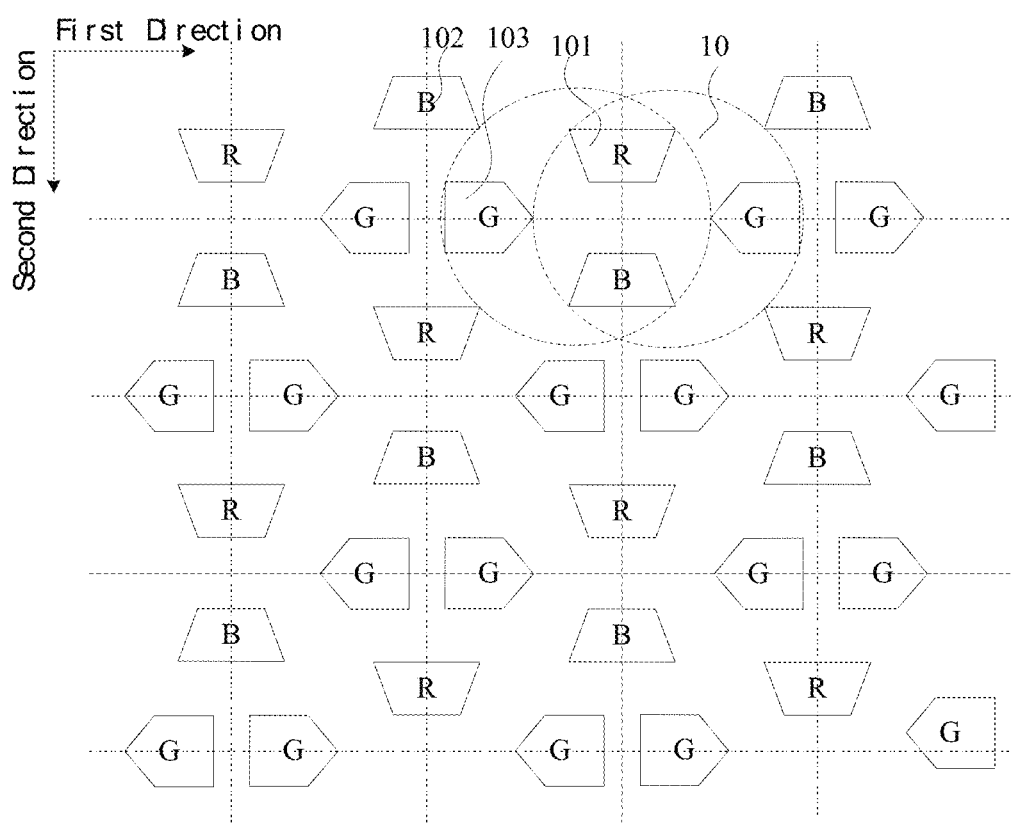
FIG. 2(a) is a first diagram illustrating the arrangement of red, green and blue sub-pixels in the pixel arrangement structure according to an embodiment of the present disclosure.
Figure 2B:
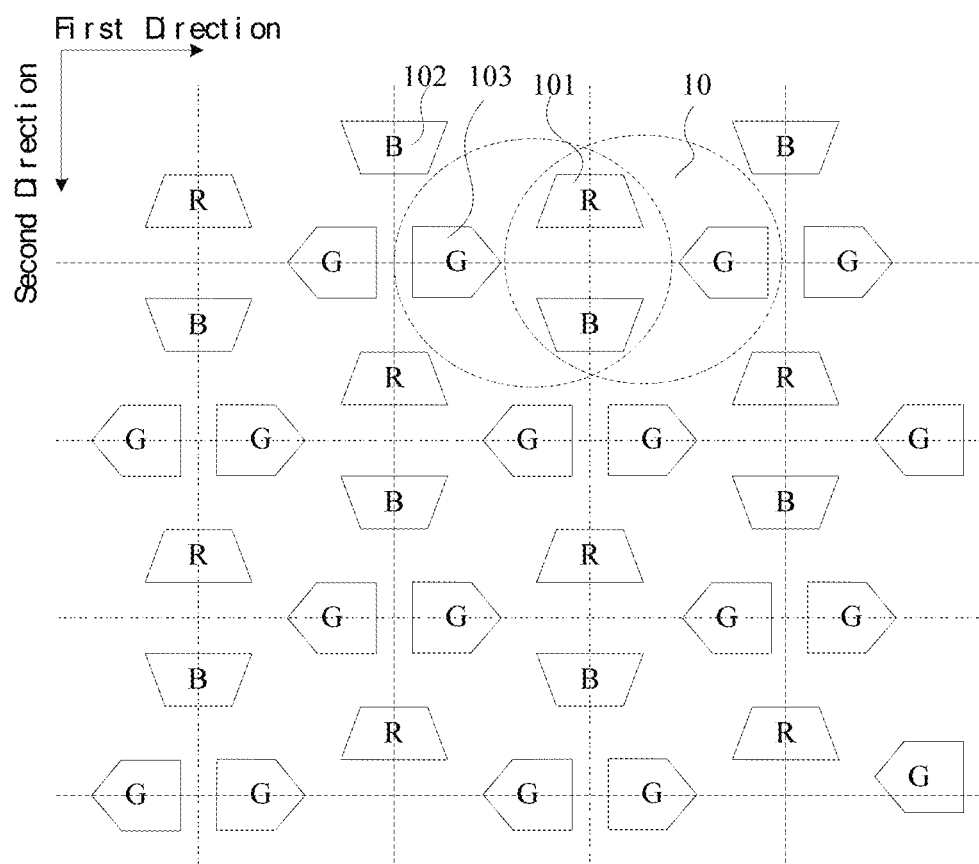
FIG. 2(b) is a second diagram illustrating the arrangement of red, green and blue sub-pixels in the pixel arrangement structure according to an embodiment of the present disclosure.

In an example illustrated in FIG. 2(a) and FIG. 2(b), in the first direction, the green sub-pixels 103 are disposed in pairs and within each pair, two green sub-pixels are adjacent to each other; a red sub-pixel 101 and a blue sub-pixel 102 is disposed between any two adjacent pairs of green sub-pixels 103. For example, the green sub-pixels disposed in pairs, in each of which two sub-pixels being adjacent to each other, forms a plurality of green sub-pixel pairs arranged in the first direction. For example, the two green sub-pixels of each green sub-pixel pair are arranged in the first direction.

With reference to FIG. 2(a) and FIG. 2(b), two adjacent green sub-pixels forming a green sub-pixel pair and one red sub-pixels and one blue sub-pixel arranged at the green sub-pixel pair form a repeating unit. A plurality of repeating units are arranged along the first direction to form a plurality of repeating unit groups. Each dash line in a horizontal direction refers to a center line of a repeating unit group or a repeating unit row formed by repeating units arranged in the first direction. In this embodiment, the red sub-pixel and the blue sub-pixel in each repeating unit are arranged in the second direction, the green sub-pixel pairs are arranged in the first direction. The arrangement of the repeating unit group is not limited in the embodiment. For example, an arrangement way is to arrange the red sub-pixel, the blue sub-pixel and the green sub-pixel pairs sequentially in the first direction, and another arrangement way is to arrange the red sub-pixel and the blue sub-pixel between the green sub-pixel pairs.

In other words, all the green sub-pixels 103 in the first direction are in pairs, within each pair the green sub-pixels are disposed adjacent to each other.

Based on this, in a preferred embodiment, a red sub-pixel 101 and a blue sub-pixel 102 between any two adjacent pairs of green sub-pixels 103 are opposed to each other in the second direction.

Here, as in the first direction, the red sub-pixel 101 and the blue sub-pixel 102 are both disposed between two adjacent pairs of green sub-pixels 103, the requirement that the sub-pixel density is 1.5 times of the pixel density may thus be satisfied. The proportion of the numbers of the red sub-pixels 101, the green sub-pixels 103 and the blue sub-pixels 102 may be 1:2:1.

For example, four sub-pixels are included in a location illustrated by the two dash circles in FIG. 2(a). The four sub-pixels are located in three sub-pixel rows and three sub-pixel columns, respectively. For example, the red sub-pixel is in the first row, the two green sub-pixels are the second row, and the blue sub-pixel is in the third row; accordingly, the green sub-pixel is in the first column, the red sub-pixel and the blue sub-pixel are in the second column, and the green sub-pixel is in the third column. The four sub-pixels may constitute two virtual pixels, i.e. a virtual pixel constituted by one red sub-pixel and one green sub-pixel and a virtual pixel constituted by one blue sub-pixel and one green sub-pixel. That is, sub-pixels in three sub-pixel rows and three sub-pixel columns constitute pixels in two pixel rows and two pixel columns; therefore, the sub-pixel density is 1.5 times of the pixel density both in the row direction and in column direction. For example, repeating units are arranged to form repeating unit rows or repeating unit columns, the rows and the columns are formed by taking the repeating unit as a whole. Each repeating unit itself includes a plurality of sub-pixel rows and a plurality of sub-pixel columns. For example, each repeating unit includes three rows of sub-pixels or three columns of sub-pixels. For example, as illustrated in FIG. 2(a), in each repeating unit, the two green sub-pixels are in a row, one red sub-pixel is in a row, and one blue sub-pixel is in a row.

In some embodiments of the present disclosure, as in the first direction all the green sub-pixels 103 are disposed in pairs in each of which two green sub-pixels are adjacent to each other, during preparation of the OLED using the FMM vapor-deposit technique, it is possible to connect the color layer of the two green sub-pixels 103 of each pair, and to form a green luminescence layer of the two green sub-pixels 103 of each pair via one FMM vapor-deposit hole, thus at some extent reducing the techniques complexity for preparing and making the color layer of the green sub-pixels 103.

Further, in the embodiments of the present disclosure, the adjacent green sub-pixels 103 may be disposed side by side along the first direction, and slight adjustments of the position of the green sub-pixels 103 may permit even distribution of the virtual pixel array. Also, by keeping certain distance between two most adjacent green sub-pixels, it may reduce the complexity of the techniques while guaranteeing the horizontal and vertical lines of the centers of the bright spots to be smooth and continuous (as illustrated in dash lines in FIG. 2(a) and FIG. 2(b)).

For example, as illustrated in FIG. 2(a) and FIG. 2(b), the shape of the red sub-pixels 101 and the blue sub-pixels 102 are both trapezoid, a base of the red sub-pixels 101 and a base of the blue sub-pixels 102 are disposed to be opposite to each other.

The shape of each green sub-pixel 103 is pentagon, the pentagon comprises a pair of parallel opposite sides and a perpendicular side, the perpendicular side being perpendicular to the pair of parallel opposite sides; wherein the perpendicular sides of each pair of the green sub-pixels 103 are disposed adjacent to each other; the bases of the red sub-pixels 101 and of the blue sub-pixels are parallel to the pair of parallel opposite sides of the green sub-pixel 103.

Figure 2C:
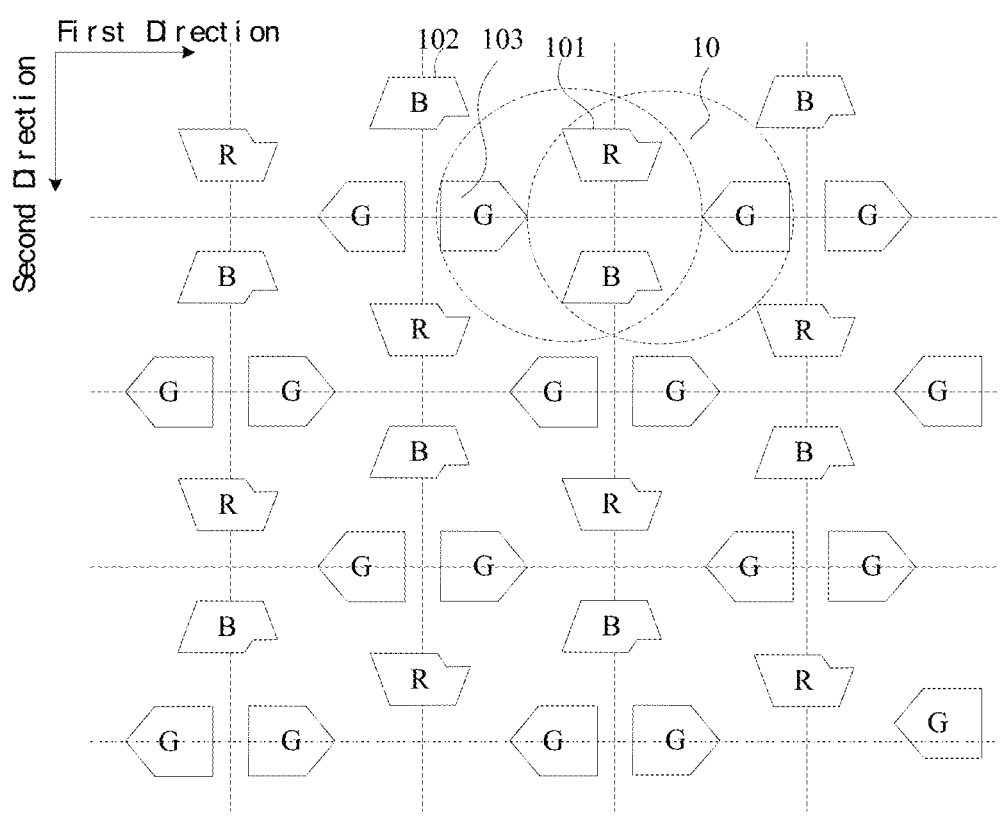
FIG. 2(c) is a diagram illustrating the actual arrangement of red, green and blue sub-pixels in the pixel arrangement structure according to an embodiment of the present disclosure.

It is to be noted that, the shape of the red sub-pixels 101 and the blue sub-pixels 102 ideally may be trapezoid, but in the actual FMM process, as the metallic etching may cause draft angles, so when using FMM vapor-deposit techniques for making read sub-pixels 101 and blue sub-pixels 102, the form of such formed red sub-pixels 101 and blue sub-pixels 102 may not be a standard trapezoid but in the shape as illustrated in FIG. 2(c). In an example illustrated in FIG. 2(c), the shape is a trapezoid with a corner being cut off.

In addition, although a shape of each sub-pixel in the drawings includes an angle formed by two standard line segments, in some embodiments, each sub-pixel may have a shape with rounded corners. That is to say, based on the above shapes of various pattern illustrated in figures, corners of each sub-pixel is rounded. For example, in the case where a light-emitting layer is vapor-deposited by a fine metal mask (FMM), a part of the light-emitting layer located at the corner may naturally form a shape with rounded corner.

In the embodiments of the present disclosure, as two green sub-pixels 103 are disposed adjacent to each other, during preparation of the OLED using the FMM vapor-deposit technique, it is possible to connect the color layer of the two green sub-pixels 103 of each pair, and to form a green luminescence layer of the two green sub-pixels 103 of each pair via one FMM vapor-deposit hole, thus reducing the techniques complexity of the FMM techniques. As illustrated in FIG. 2(a) and FIG. 2(b), the green sub-pixels 103 as the luminance center of the virtual pixels, in the first direction, all of the green sub-pixels 103 are on the vertical dash lines, in the second direction, all of the green sub-pixels 103 are on either side of the vertical dash lines, and the green sub-pixels 103 are evenly distributed in the pixel array, thus guaranteeing that the horizontal and vertical lines of the center of the luminance to be smooth and continuous (as illustrated in dash lines in FIG. 2(a) and FIG. 2(b)).

Further, as illustrated in FIG. 2(a), the shorter base of the red sub-pixel 101 and the shorter base of the blue sub-pixel 102 are disposed to be adjacent to each other. In other words, the shorter base of the red sub-pixel 101 and the shorter base of the blue sub-pixel 102 are disposed to be opposed to each other.

In the embodiments of the present disclosure, a red sub-pixel 101 and a blue sub-pixel 102 are disposed between any two adjacent pairs of green sub-pixels 103, and since the shape of the red sub-pixel 101 and of the blue sub-pixel 102 is trapezoid, the shorter base of the red sub-pixel 101 and the shorter base of the blue sub-pixel 102 are disposed adjacent to each other, such that the distance between the green sub-pixels 103 and the red sub-pixels 101 as well as the blue sub-pixels 102 is relatively far, which is advantageous for the FMM design, and for reducing the FMM techniques complexity.

For example, in the second direction, the green sub-pixels 103 are disposed in pairs in each of which two sub-pixels are adjacently disposed, and one red sub-pixel 101 and one blue sub-pixel 102 are disposed between any two adjacent pairs of the green sub-pixels 103.

In other words, in the second direction all the green sub-pixels 103 are disposed in pairs, and in each pair two green sub-pixels 103 are disposed adjacent to each other.

Based on this, in an example, one red sub-pixel 101 and one blue sub-pixel 102 between any two adjacent pairs of green sub-pixels 103 are disposed to be opposed to each other in the first direction.

Here since in the second direction, the red sub-pixels 101 and the blue sub-pixels 102 are all disposed between two adjacent pairs of green sub-pixels 103, thus the requirement that the sub-pixel density is 1.5 times of the pixel density may be satisfied. The proportion of the numbers of the red sub-pixels 101, the green sub-pixels 103 and the blue sub-pixels 102 may be 1:2:1.

It is to be noted that in the second direction, the green sub-pixels 103 are disposed in pairs and within each pair two green sub-pixels 103 are disposed adjacent to each other; one red sub-pixel 101 and one blue sub-pixel may be disposed between any two adjacent pairs of green sub-pixels 103, which allows that in the first direction and in the second direction, the sub-pixel density is 1.5 times of pixel density and the virtual pixel array is evenly distributed. For example, the green sub-pixels which are in pairs and within each pair the two green sub-pixels being adjacent to each other forms a plurality of green sub-pixel pairs arranged in the second direction. For example, the two green sub-pixels in each green sub-pixel pair are arranged in the second direction.

In the embodiments of the present disclose, in the second direction all the green sub-pixels 103 are disposed in pairs and within each pair two green sub-pixels being adjacent to each other, during preparation of the OLED using the FMM vapor-deposit technique, it is possible to connect the color layer of the two green sub-pixels 103 of each pair, and to form a green luminescence layer of the two green sub-pixels 103 of each pair via one FMM vapor-deposit hole, thus at some extent reducing the techniques complexity for preparing and making the color layer of the green sub-pixels 103.

Further, in the embodiments of the present disclosure, the adjacent green sub-pixels 103 may be disposed side by side in the second direction, and slight adjustments of the position of the green sub-pixels 103 may permit even distribution of the virtual pixel array. Also, by keeping certain distance between two most adjacent green sub-pixels 103, it may reduce the complexity of the techniques while guaranteeing the horizontal and vertical lines of the centers of the bright spots to be smooth and continuous (as illustrated in dash lines in FIG. 3(a) and FIG. 3(b)).

Figure 3A:
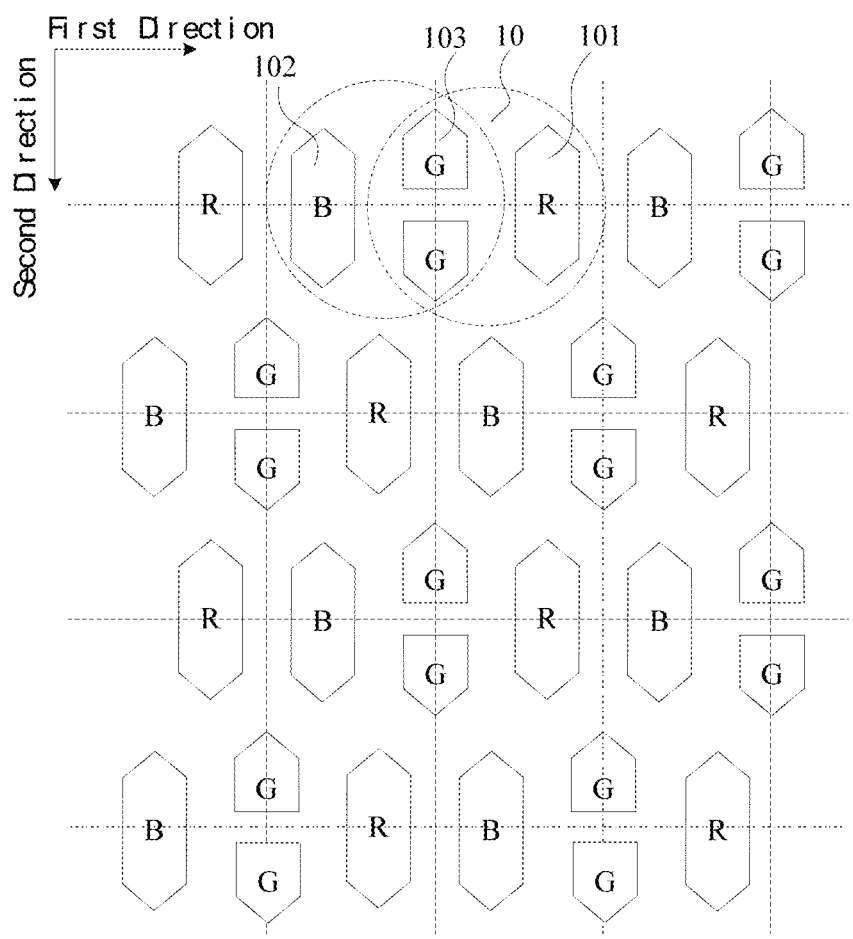
FIG. 3(a) is a third diagram illustrating the arrangement of red, green and blue sub-pixels in the pixel arrangement structure according to an embodiment of the present disclosure.
Figure 3B:
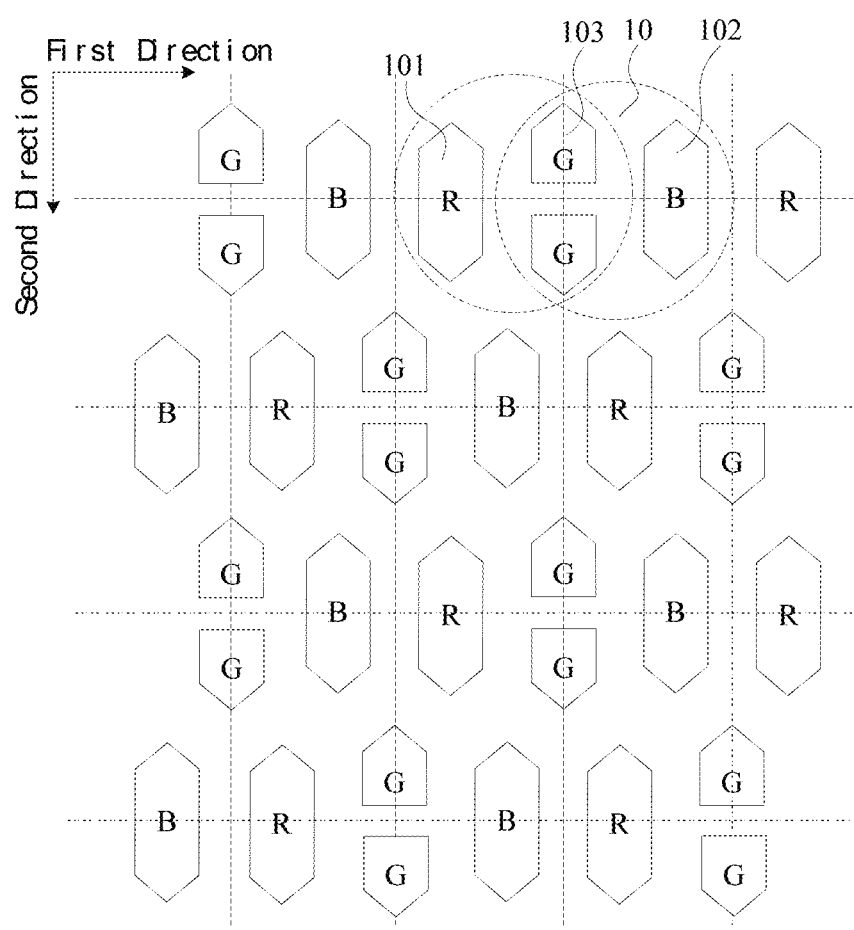
FIG. 3(b) is a fourth diagram illustrating the arrangement of red, green and blue sub-pixels in the pixel arrangement structure according to an embodiment of the present disclosure.

In some embodiments, as illustrated in FIG. 3(a) and FIG. 3(b), the shapes of the red sub-pixels 10 and the blue sub-pixels 102 are both hexagon, the three pairs of opposite sides of the hexagon having each pair of sides parallel to each other.

In addition, although a shape of each sub-pixel in the drawings includes an angle formed by two standard line segments, in some embodiments, each sub-pixel may have a shape with rounded corners. That is to say, based on the above shapes of various pattern illustrated in figures, corners of each sub-pixel is rounded. For example, in the case where a light-emitting layer is vapor-deposited by a FMM, a part of the light-emitting layer located at the corner may naturally form a shape with rounded corner.

The shape of each green sub-pixel is pentagon, the pentagon comprises a pair of parallel opposite sides and a perpendicular side, the perpendicular side being perpendicular to the pair of parallel opposite sides; wherein the perpendicular sides of each pair of the green sub-pixels 103 are disposed adjacent to each other.

The pair of parallel opposite sides of the red sub-pixels 101 with longer length and the pair of parallel opposite sides of the blue sub-pixels 102 with longer length, are parallel to a pair of parallel opposite sides of the green sub-pixels 103.

Here it is to be noted that, positions of the red sub-pixels 101, the blue sub-pixels 102 and the green sub-pixels 103 in each repeating unit may be adjusted in an arbitrary manner as long as in the first direction and in the second direction of the pixel array, the sub-pixel density is 1.5 times of the pixel density, for example, as those illustrated in FIG. 3(a) or in FIG. 3(b).

It is noted that although some shapes of the sub-pixels in accordance with the embodiments of the present disclosure are described with reference to FIG. 2(a)-FIG. 3(b), the embodiments according to the present disclosure shall not be limited to those drawings and the sub-pixels according to the present disclosure may be in the any other shapes that may be suitable.

In the embodiments of the present disclosure, given that the pair of parallel opposite sides of the red sub-pixels 101 with longer length and the pair of parallel opposite sides of the blue sub-pixels 102 with longer length, are parallel to a pair of parallel opposite sides of the green sub-pixels 103, in one aspect, each FMM opening may be designed to be quasi-hexagon, thus favoring the FMM design; in another aspect, when FMM vapor-deposit techniques is adopted to vapor-deposit the sub-pixels, the net tensile force will be mainly applied on the longer side, thus avoiding damages to the FMM and favoring the success rate of net tension.

For example, as illustrated in FIG. 3(a) and FIG. 3(b), the red sub-pixel and the blue sub-pixel in each repeating unit are arranged in the first direction, and a pair of green sub-pixels are arranged in the second direction. In addition, the red sub-pixel, the blue sub-pixel and the green sub-pixel pair may be arranged in the first direction in sequence, or the green sub-pixel pair is arranged between one red sub-pixel and one blue sub-pixel.

As illustrated in FIG. 3(a) and FIG. 3(b), a plurality of repeating units arranged in the first direction form a plurality of repeating unit groups (repeating unit rows). For example, a dash line in the first direction refers to a central line of each of the plurality of repeating unit groups. The plurality of repeating unit groups are arranged in the second direction to form the pixel arrangement structure.

For example, in the above pixel arrangement structure, adjacent repeating unit groups are shifted in the first direction. That is, adjacent repeating unit groups have an offset in the first direction; therefore, sub-pixels of the same color in adjacent repeating unit groups are not aligned in the second direction. In some examples, an offset of adjacent repeating unit groups in the first direction is a half of a size of the repeating unit in the first direction. For example, the size of the repeating unit in the first direction is a pitch of the repeating units in the first direction.

As illustrated in FIG. 3(a) and FIG. 3(b), the repeating unit groups in odd-numbered rows have the same pixel arrangement manner, and the repeating unit groups in even-numbered rows have the same pixel arrangement manner. For example, except the edge portion of the pixel arrangement structure, a line passing through centers of the two green sub-pixels in each repeating unit is located between centers of adjacent red sub-pixel and blue sub-pixel in adjacent repeating unit groups. Moreover, edges of the two green sub-pixels are located at an inner side of the outermost edges of the above-mentioned adjacent red sub-pixel and blue sub-pixel, and the outermost edges are the edges away from each other along the first direction of the two sub-pixels. For example, if the two sub-pixels are arranged along the first direction from a left side to a right side, the outermost edges of the two sub-pixels are the left edge of the sub-pixel at the left side and the right edge of the sub-pixels at the right side. That is, in the first direction, an extending range of one green sub-pixel pairs in the first direction is not beyond an extending range of the above-mentioned adjacent red sub-pixel and blue sub-pixel in the first direction.

For example, for the above-mentioned pixel arrangement structure, a ratio of the sub-pixels of red, blue and green is 1:1:2. One red sub-pixel and one green sub-pixel constitute a pixel, and one blue sub-pixel and one green sub-pixel constitute a pixel. The specific combinations of sub-pixels in each pixel are not limited in the embodiments of the present disclosure. For example, one red sub-pixel and one green sub-pixel in a repeating unit constitute a pixel, and one blue sub-pixel and one green sub-pixel in the repeating unit constitute a pixel. Alternatively, for the green sub-pixel pairs in the same repeating unit, one of the green sub-pixels and one red sub-pixel in the repeating unit form a pixel, and the other of the green sub-pixels and one blue sub-pixel in an adjacent repeating unit form a pixel.

For example, as illustrated in FIG. 3(a) and FIG. 3(b), green sub-pixels are arranged in the second direction, a size of the red sub-pixel in the second direction is greater than that of the red sub-pixel in the first direction, similarly, a size of the blue sub-pixel in the second direction is greater than that of the blue sub-pixel in the first direction.

Figure 4:
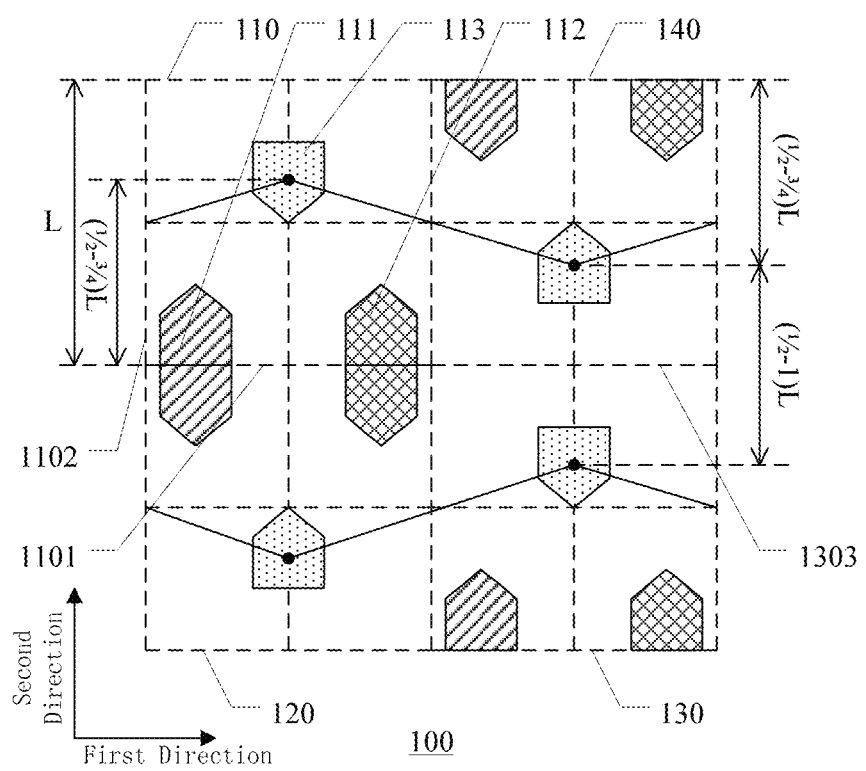
FIG. 4 is a diagram illustrating a pixel arrangement structure according to an embodiment of the present disclosure.

At least one embodiment of the present disclosure provides a pixel arrangement structure. FIG. 4 is a diagram illustrating a pixel arrangement structure provided by an embodiment of the present disclosure. The pixel arrangement structure includes a plurality of third sub-pixels 113, a plurality of second sub-pixels 112 and a plurality of first sub-pixels 111 distributed in a plurality of minimum repeating regions 100. FIG. 4 illustrates one minimum repeating region 100, as illustrated in FIG. 4, each minimum repeating region 100 includes a first virtual rectangle 110, one first virtual rectangle 110 includes one third sub-pixel 113, one second sub-pixel 112 and one first sub-pixel 111. The first virtual rectangle 110 includes a first side 1101 extending in a first direction and a second side 1102 extending in a second direction. The second sub-pixel 112 and the first sub-pixel 111 are distributed on two sides of a perpendicular bisector of the first side 1101. A distance between the second sub-pixel 112 and the first side 1101 and a distance between the first sub-pixel 111 and the first side are both less than a distance between the third sub-pixel 113 and the first side 1101. That is to say, the second sub-pixel 112 and the first sub-pixel 111 are closer to the first side 1101 than the third sub-pixel 113. A center of the third sub-pixel 113 is located on the perpendicular bisector of the first side 1101 and a distance between the center of the third sub-pixel 113 and the first side 1101 is ½-¾ of a length of the second side 1102. For example, as illustrated in FIG. 4, the length of the second side 1102 is L, the distance between the center of the third sub-pixel 113 and the first side 1101 is (½-¾)L. It should be noted that, the abovementioned first virtual rectangle is for better description of a position of the third sub-pixel, not an actual structure. In addition, a range of the abovementioned first virtual rectangle can be greater than a light emitting region of the third sub-pixel, the first sub-pixel, and the second sub-pixel in the first virtual rectangle.

Furthermore, in embodiments of the present disclosure, unless otherwise specified, the "center" of a sub-pixel refers to the geometric center of a shape of the sub-pixel (eg, the first sub-pixel, the second sub-pixel, or the third sub-pixel); the abovementioned distance between the second sub-pixel and the first side refers to a distance between a center of the second sub-pixel and the first side, the abovementioned distance between the first sub-pixel and the first side refers to a distance between a center of the first sub-pixel and the first side.

It should be noted that, upon designing a pixel arrangement structure, the sub-pixel is generally designed in a regular shape, such as a hexagon, a pentagon, a trapezoid or other shapes. The center of the sub-pixel may be the geometric center of the above regular shape upon designing. However, in an actual manufacturing process, the shape of the formed sub-pixels generally deviates from the regular shape of the above design. For example, corners of the abovementioned regular shape may be rounded; therefore, the shape of the sub-pixel can be a figure with rounded angle. Furthermore, the shape of the actually fabricated sub-pixel can also have other variations from the shape of the design. For example, the shape of a sub-pixel designed as a hexagon may become approximately elliptical in actual fabrication. Therefore, the center of the sub-pixel may also not be the strict geometric center of the irregular shape of the formed sub-pixel. In embodiments of the present disclosure, the center of the sub-pixel may have a certain offset from the geometric center of the shape of the sub-pixel. The center of a sub-pixel refers to any point in a region surrounded by specific points on radiation segments each of which is from a geometric center of the sub-pixel to a point on the edge of the sub-pixel, each of the specific points is located on a corresponding radiation segment at location ⅓ of length of the radiant section from the geometric center. The definition of the center of the sub-pixel is applicable to the center of the sub-pixel having the regular shape, and is also applicable to the center of the sub-pixel having the irregular shape.

In the pixel arrangement structure provided by the present embodiment, because the first sub-pixel and the second sub-pixel are distributed on two sides of the perpendicular bisector of the first side, the center of the third sub-pixel is located on the perpendicular bisector of the first side, and the distance between the center of the third sub-pixel and the first side is ½-¾ of the length of the second side. A distance between centers of two adjacent third sub-pixels is greater than ½ of the length of the second side, thereby avoiding that the adjacent third sub-pixels are difficult to distinguish due to the proximity of the adjacent third sub-pixels, and are visually combined into one by the human eye, so as to avoid the graininess. Thus, the pixel arrangement structure can improve the distribution uniformity of the third sub-pixels, thereby improving the visual resolution and the display quality. For example, the distance between the center of the third sub-pixel and the first side is ½ of the length of the second side. In this case, the third sub-pixels are arranged uniformly along the second direction, every two adjacent green sub-pixels have a distance between centers of them of ½ of the length of the second side, which is further facilitate to avoid the graininess.

For example, in some examples, as illustrated in FIG. 4, each minimum repeating region 100 further includes a second virtual rectangle 120, a third virtual rectangle 130 and a fourth virtual rectangle 140. A 2×2 matrix is formed by the first virtual rectangle 110, the second virtual rectangle 120, the third virtual rectangle 130 and the fourth virtual rectangle 140 in a side-sharing manner to constitute the minimum repeating region 100. The second virtual rectangle 120 shares the first side 1101 with the first virtual rectangle 110, and is mirror symmetrical with the first virtual rectangle 110 with respect to the first side 1101; the first virtual rectangle 110 coincides with the third virtual rectangle 130 by translating a distance of a length of a diagonal line thereof along the diagonal line. The third virtual rectangle 130 includes a third side 1303 extending in the first direction, the fourth virtual rectangle 140 shares the third side 1301 with the third virtual rectangle 130, and is mirror symmetrical with the third virtual rectangle 130 with respect to the third side 1303. It should be noted that, the first virtual rectangle, the second virtual rectangle, the third rectangle and the fourth rectangle are closely arranged to form the minimum repeating region having a rectangle shape. It should be noted that, the abovementioned repetition refers that three sub-pixels in the third virtual rectangle have the same shape and position with three sub-pixels in the first virtual rectangle translating the distance of the length of the diagonal line thereof along the diagonal line. The repetition here only refers to the repetition of the sub-pixels, other structures can be the same or different. In addition, the abovementioned repetition means that the positions, shapes, and sizes are approximate to each other. In some cases, the shapes may be slightly different for the purpose of wiring or opening, for example, there are openings at different positions.

It should be noted that, the coincidence described in the present disclosure means that at least 70% of areas of the corresponding sub-pixels or other components can be overlapped. The mirror symmetry described in the present disclosure means that after the mirroring operation, areas of the corresponding sub-pixels can be overlapped by at least 70%.

Figure 5:
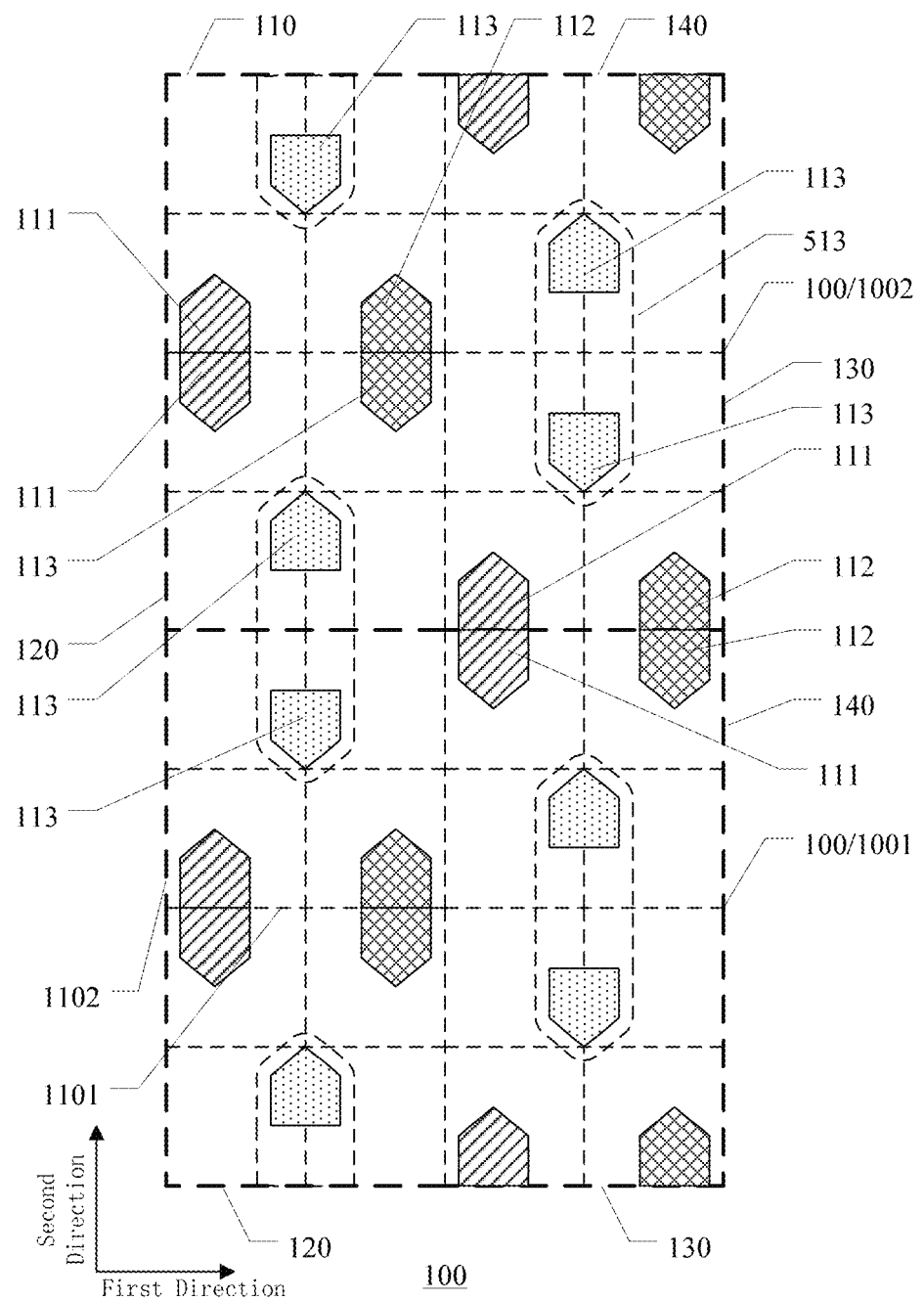
FIG. 5 is a diagram illustrating a pixel arrangement structure according to an embodiment of the present disclosure.

For example, in the abovementioned embodiments, each virtual rectangle includes three sub-pixels, however, upon the first to fourth virtual rectangles putting together, in adjacent virtual rectangles, two adjacent first sub-pixels can be merged into one first sub-pixel, two adjacent second sub-pixels can be merged into one second sub-pixel. FIG. 5 illustrates two minimum repeating regions 100. As illustrated in FIG. 5, in the same minimum repeating region 100, the second sub-pixel 112 in the first virtual rectangle 110 and the second sub-pixel 112 in the second virtual rectangle 120 are merged into the same sub-pixel; in the second direction, two adjacent minimum repeating regions 100 include a first minimum repeating region 1001 and a second minimum repeating region 1002 that are sequentially disposed in the second direction, the second sub-pixel 112 in the fourth virtual rectangle 140 of the first minimum repeating region 1001 and the second sub-pixel 112 in the third virtual rectangle 130 of the second minimum repeating region 1002 are merged into the same sub-pixel. Furthermore, the merger of the first sub-pixels is similar to that of the second sub-pixels. Thus, the first or second sub-pixel which is merged into the same sub-pixel can reduce the difficulty of the manufacturing process of the first or second sub-pixel. In addition, upon the pixel arrangement structure being used for a display panel, a sub-pixel rendering (SPR) algorithm can be used for driving the sub-pixels.

It also can be seen from FIG. 4 and FIG. 5, upon adjacent sub-pixels with the same color in adjacent virtual rectangles or repeating regions being merged into the same sub-pixel, one repeating unit is formed by one first sub-pixel, one second sub-pixel and two third sub-pixels. In the repeating unit, the first sub-pixel and the second sub-pixel are arranged in the first direction, the third sub-pixels are arranged in the second direction. Furthermore, a plurality of repeating unit groups (rows) are formed by the repeating units arranged in the first direction, and the plurality of repeating unit groups (rows) are arranged in the second direction to form the pixel arrangement structure. That is, the pixel arrangement provided by the embodiments illustrated in FIG. 4 and FIG. 5 is similar to the pixel arrangement in the abovementioned embodiments. It can also be seen from FIG. 4 and FIG. 5, two lines passing through centers of the first sub-pixel and the second sub-pixel in two adjacent ones of the repeating unit groups have a distance of L therebetween (equal to a side length L of the abovementioned virtual rectangle). It can be seen from FIG. 4, in a case that two first sub-pixels in two virtual rectangles are merged into one first sub-pixel, two second sub-pixels in two virtual rectangles are merged into one second sub-pixels, a line passing through centers of the first sub-pixel and the second sub-pixel is in the same line as a side 1101 of the virtual rectangle. Similarly, for adjacent repeating unit groups, for example, an upper side of the virtual rectangle in FIG. 4 is in the same line as the line passing through centers of the first sub-pixel and the second sub-pixel of the repeating unit group. Therefore, two lines passing through centers of the first sub-pixel and the second sub-pixel in two adjacent ones of the repeating unit groups have a distance of L therebetween. Therefore, a center of the third sub-pixel in any one of the plurality of repeating unit groups and the line passing through centers of the first sub-pixel and the second sub-pixel in an adjacent one of the repeating unit groups have a distance of about ½ L-¾ L therebetween.

For example, a distance between adjacent edges of the two third sub-pixels is greater than or equal to 12 micrometers, or greater than or equal to 14 micrometers. As illustrated in figures, two third sub-pixels in each repeating unit refer to, for example, one third sub-pixel in the fourth virtual rectangle 140 and one third sub-pixel in the third virtual rectangle 130. The adjacent edges of the two third sub-pixels are a lower edge of an upper third sub-pixel and an upper edge of a lower third sub-pixel. The above distances between the two third sub-pixels may set different values according to different resolution conditions. For example, a distance between the adjacent edges of the two third sub-pixels is greater than or equal to 12 micrometers in a case of a quarter full high definition resolution, and is greater than or equal to 14 micrometers in a case of full high definition resolution.

Furthermore, it can be seen from a relationship between the virtual rectangle and the repeating unit group in FIG. 4 and FIG. 5, a pitch of the repeating units in the first direction is about two side lengths of the virtual rectangles, that is, the pitch of the repeating units in the first direction is about 2 L. As illustrated in FIG. 4, the first sub-pixel in the first virtual rectangle 110 and the first sub-pixel in the second virtual rectangle are merged into one first sub-pixel, the second sub-pixel in the first virtual rectangle 110 and the second sub-pixel in the second virtual rectangle are merged into one second sub-pixel. The abovementioned one first sub-pixel, the abovementioned one second sub-pixel, one third sub-pixel in the third virtual rectangle 130 and one third sub-pixel in the fourth virtual rectangle 140 can form one repeating unit. That is, a size of one repeating unit in the first direction or the pitch of the repeating units in the first direction is twice the side length of the virtual rectangle in the first direction. Assuming that the virtual rectangle is a square, the pitch of the repeating units in the first direction is about 2 L.

It can be seen from FIG. 4 and FIG. 5 that the first sub-pixel and the second sub-pixel have an elongated shape, that is, they have an elongated shape extending in the second direction. Furthermore, the first sub-pixel and the second sub-pixel can also have an elliptical shape. For the first sub-pixel, assuming that the first sub-pixel is separated to be two portions by a center line of the first sub-pixel in the first direction (for example, the two portions are a portion of the first sub-pixel in the first virtual rectangle 110 and a portion of the first sub-pixel in the second virtual rectangle), and then centers of the two portions have a distance less than 0.3 L therebetween. Furthermore, a size of the first sub-pixel in the second direction is less than 0.6 L. For example, the first sub-pixel is a red sub-pixel, the second sub-pixel is a blue sub-pixel, and the third sub-pixel is a green sub-pixel.

For the first sub-pixel and the second sub-pixel, a ratio of a size in the second direction to a size in the first direction is σ, and σ>1. That is, the first sub-pixel and the second sub-pixel have an elongated shape extending in the second direction.

Figure 6:
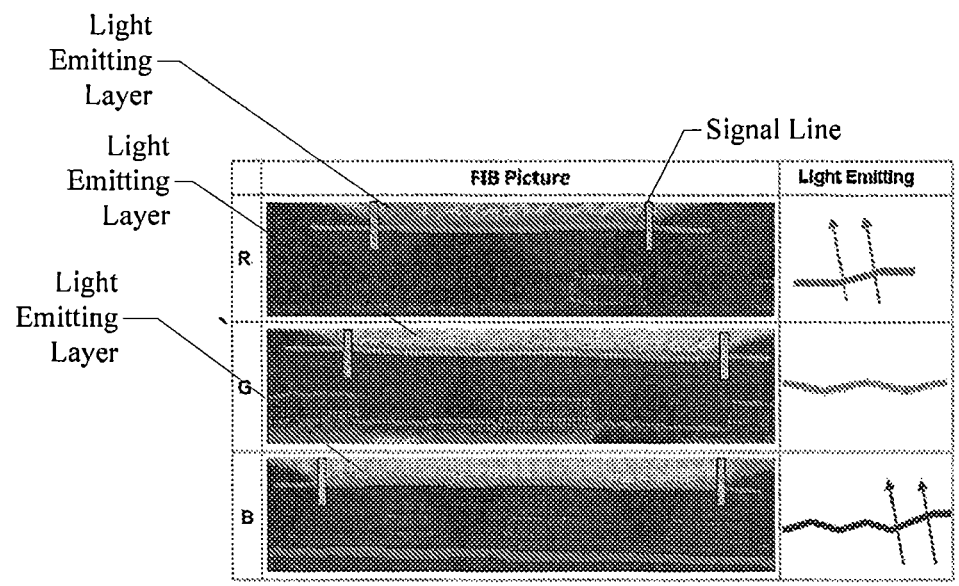
FIG. 6 is a cross-sectional view illustrating a part of red, green and blue sub-pixels, respectively, in the pixel arrangement structure according to an embodiment of the present disclosure.

For example, the first sub-pixel is a red sub-pixel, the second sub-pixel is a blue sub-pixel. The lifetime of the red sub-pixel is generally longer than the blue sub-pixel. Therefore, an area of the red sub-pixel may be smaller than an area of the blue sub-pixel, but a ratio of a size of the red sub-pixel in the first direction and a size in the second direction cannot be too small; if the ratio is too small, the horizontal and vertical differences may be affected. Furthermore, as illustrated in FIG. 6, because various signal lines are usually arranged under a pixel structure, if a width of the red sub-pixel is too small, the signal lines arranged below may cause unevenness, which may cause the light of the red sub-pixel to be tilted to one side, resulting in a difference in left-right viewing angle. The abovementioned σ of the red sub-pixel can be designed to be greater than the abovementioned σ of the blue sub-pixel.

Figure 7:
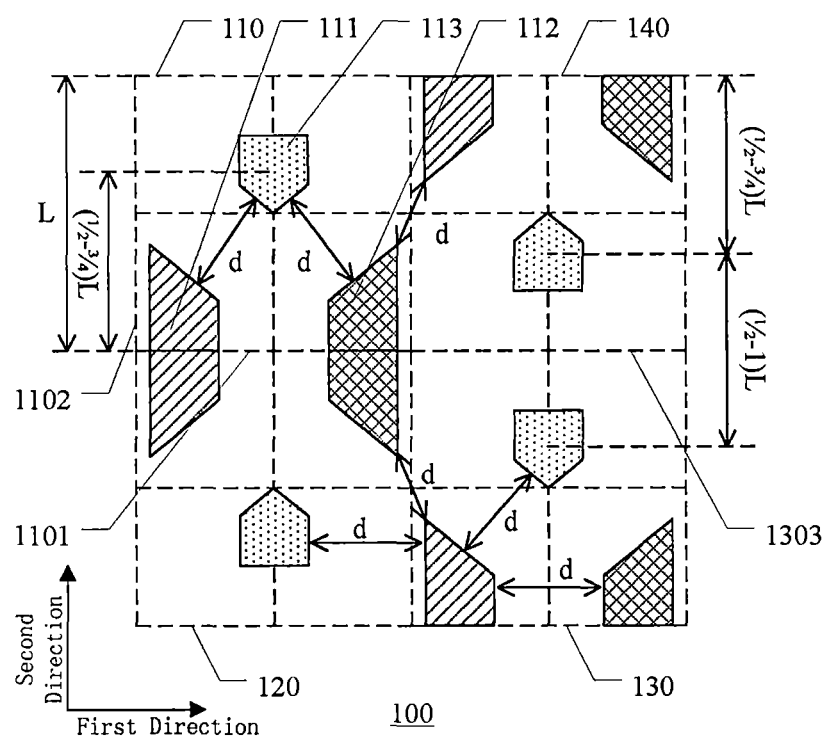
FIG. 7 is a diagram illustrating a pixel arrangement structure according to an embodiment of the present disclosure.

For example, as illustrated in FIG. 7, in adjacent repeating unit groups (rows), a distance between the third sub-pixel and the first sub-pixel which are adjacent to each other is equal to a distance between the third sub-pixel and the second sub-pixel which are adjacent to each other, and both of the distances are d. In some examples, in adjacent repeating unit groups (rows), a distance between the first sub-pixel and the second sub-pixel which are adjacent to each other is equal to d. The sub-pixels which are adjacent to each other refer that one sub-pixel is selected in each of adjacent repeating unit groups, for example, one first sub-pixel and one second sub-pixel are selected, the distance between the selected first sub-pixel and the selected second sub-pixel is less than or equal to a distance between other first sub-pixel and second sub-pixel selected from the two adjacent repeating unit groups.

Furthermore, as illustrated in FIG. 7, the first sub-pixel and the second sub-pixel can also be an asymmetrical structure; for example, the first sub-pixel and the second sub-pixel are asymmetric with respect to a straight line passing through a center thereof in the second direction.

In some embodiments of the present disclosure, the abovementioned pixel arrangement structure can be rotated 45° overall. For example, the abovementioned first direction and second direction can be at an angle of 45° to a horizontal direction or a vertical direction. For example, the horizontal direction here can be a direction parallel or perpendicular to an extending direction of a driving line for driving the pixel arrangement structure. Or, upon a user viewing a display screen normally, the horizontal direction can refer to a direction substantially parallel to a line passing through two eyes of the user. The vertical direction is a direction perpendicular to the horizontal direction. Furthermore, embodiments of the present disclosure are not limited to 45°, for example, the abovementioned first direction and second direction can be at an angle of 40°-50° to the horizontal direction or the vertical direction. By the above angle setting, it is possible to better eliminate the occurrence of a color edge on the edge of the screen and a zigzag in the horizontal direction or a vertical direction upon a display portion displaying images.

In another embodiments of the present disclosure, the whole pixel arrangement structure can rotate at an angle of less than 40° counterclockwise or clockwise, for example, the angle can be 30°, 20°, 15°, 10° and so on, so as to adjust the distribution of a brightness center and optimize the display of specific directions such as the horizontal direction or the vertical direction. For example, assuming that a lateral direction on the paper surface is regarded as the horizontal direction, the pixel arrangement structures of these embodiments can be obtained by rotating the pixel arrangement structure of FIGS. 2a-5 and 8-11 and the like by abovementioned corresponding angles. For example, since the above mentioned angle of 40°-50° means that the angle between the first direction and the horizontal direction and the angle between the first direction and the vertical direction are both not too large. At the same time, both the horizontal direction and the vertical direction of the image display are beneficial to alleviate the appearance of color edges and zigzag at the edges of the image extending in the horizontal direction or the vertical direction, thereby reducing the recognition of the human eye on the deficiencies. However, in the case of displaying a certain image or other displaying situations, an angle range of greater or equal to 10° and less than 40° can also be used because it can be selected to be more advantageous in accordance with the frequency of occurrence of the edge of the image extending in the horizontal direction or the vertical direction. For example, the angle between the horizontal direction and the first direction can be selected to be greater or equal to 10° and less than 40°, so as to be benefit to eliminate the phenomenon of color edge extending in the vertical direction; or the angle between the horizontal direction and the first direction can be selected to be greater or equal to 10° and less than 40°, so as to be benefit to eliminate the phenomenon of color edge extending in the vertical direction.

It should be noted that, the "horizontal direction" and the "row (column) direction" in the present specification are not the same term. The row (column) direction refers a direction in which the repeating units or sub-pixels are arranged, and the "horizontal direction" is the direction explained above. For example, the row (column) direction can have a certain angle with the horizontal direction, as mentioned above.

For example, in some embodiments, the pixel arrangement structure is formed in a display substrate or display panel has a rectangle shape, the horizontal direction is substantially an extending direction of either side of the rectangle, or the horizontal direction is substantially the extending direction of the long side of the rectangle.

In addition, in some embodiments, a method for fabricating the above mentioned pixel arrangement structure which is wholly rotated by a certain angle includes: evaporating by using a fine metal mask (FMM) to form the pixel arrangement structure. For example, the stretch direction of the fine metal mask has a non-zero angle with respect to the above mentioned horizontal or vertical direction. For example, the stretch direction of the fine metal mask may be parallel to the first direction or the second direction. The manufacturing method allows that the stretch direction of the fine metal mask conforms to the extending direction of the openings corresponding to each sub-pixel, so that the direction of the force applied to the fine metal mask is consistent with the extending direction of the openings corresponding to each sub-pixel, which is beneficial to reduce the process difficulty and improve the process precision. In the manufacturing process, for example, in the evaporation process, the stretch direction of the fine metal mask can have an angle with respect to one side of the substrate, so that the above mentioned pixel arrangement structure can be formed.

Figure 8:
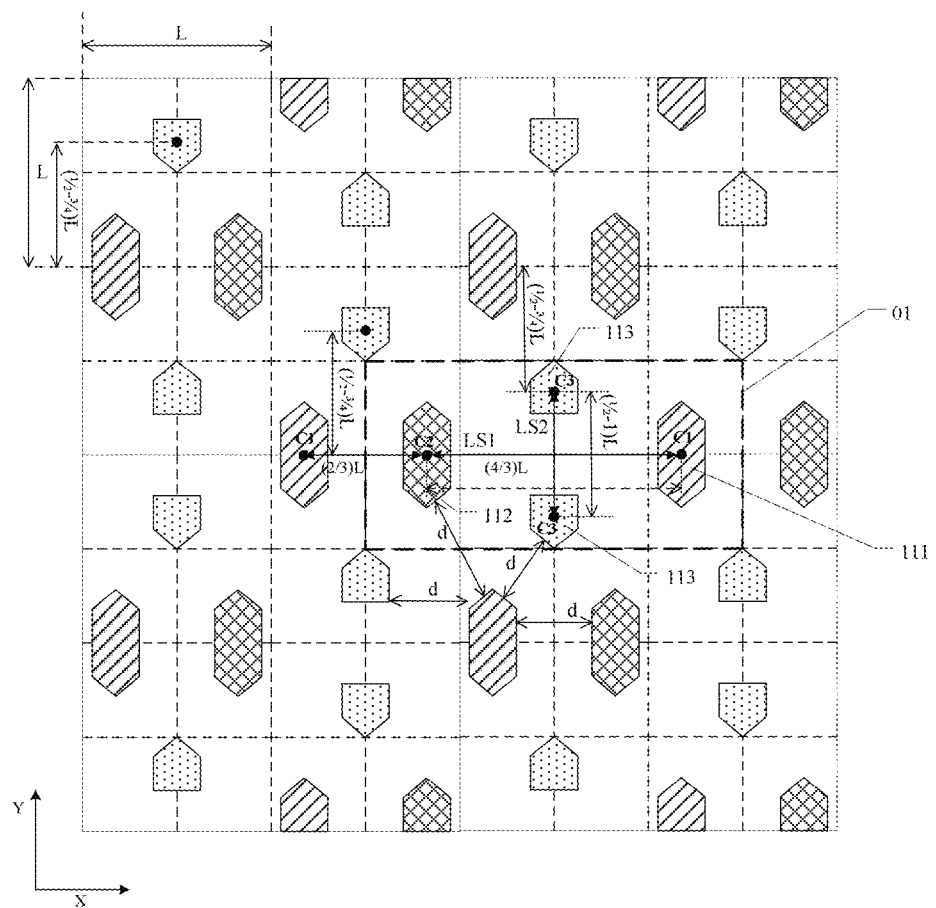
FIG. 8 is a diagram illustrating a pixel arrangement structure according to an embodiment of the present disclosure.

As illustrated in FIG. 8, at least one embodiment of the present disclosure provides a pixel arrangement structure, which includes a plurality of repeating units 01. Each repeating unit 01 includes one first sub-pixel 111, one second sub-pixel 112 and two third sub-pixels 113. For example, the first sub-pixel 111 can be a red pixel, the second sub-pixel can be a blue sub-pixel, the third pixel 113 can be a green sub-pixel. In the repeating unit group 01, a line segment connecting a center C2 of the second sub-pixel and a center C1 of the first sub-pixel is a first line segment LS1; two third sub-pixels are located between the second sub-pixel 112 and the first sub-pixel 111, and respectively located at two sides of the first line segment LS1. A line segment connecting centers of the two third sub-pixels is a second line segment LS2; a length of the second line segment LS2 is less than a length of the first line segment LS1. For example, in order to achieve a better tight alignment of the pixel arrangement structure, a length ratio of the second line segment LS2 to the first line segment LS1 is less than or equal to ¾.

For example, the second line segment LS2 and the first line segment LS1 are substantially perpendicular to each other and equally halved by each other.

It should be noted that, a shape of an actual fabricated sub-pixel may deviate from the designed sub-pixel shape because of various manufacturing errors. Therefore, in the present disclosure, there may be a certain error about a position of the center of the sub-pixel and a relationship between the positions of the sub-pixel center and other objects. For example, assuming that a line connecting the centers of the sub-pixels or a line passing through the centers of the sub-pixels satisfies other corresponding definitions (for example, the extending direction), the lines may pass through the region enclosed by the above-mentioned specific points of the radiation segments. For example, a center of a sub-pixel is located on a certain line, which means that the line can pass through the region enclosed by the above-mentioned specific points of the radiation segments.

Figure 9:
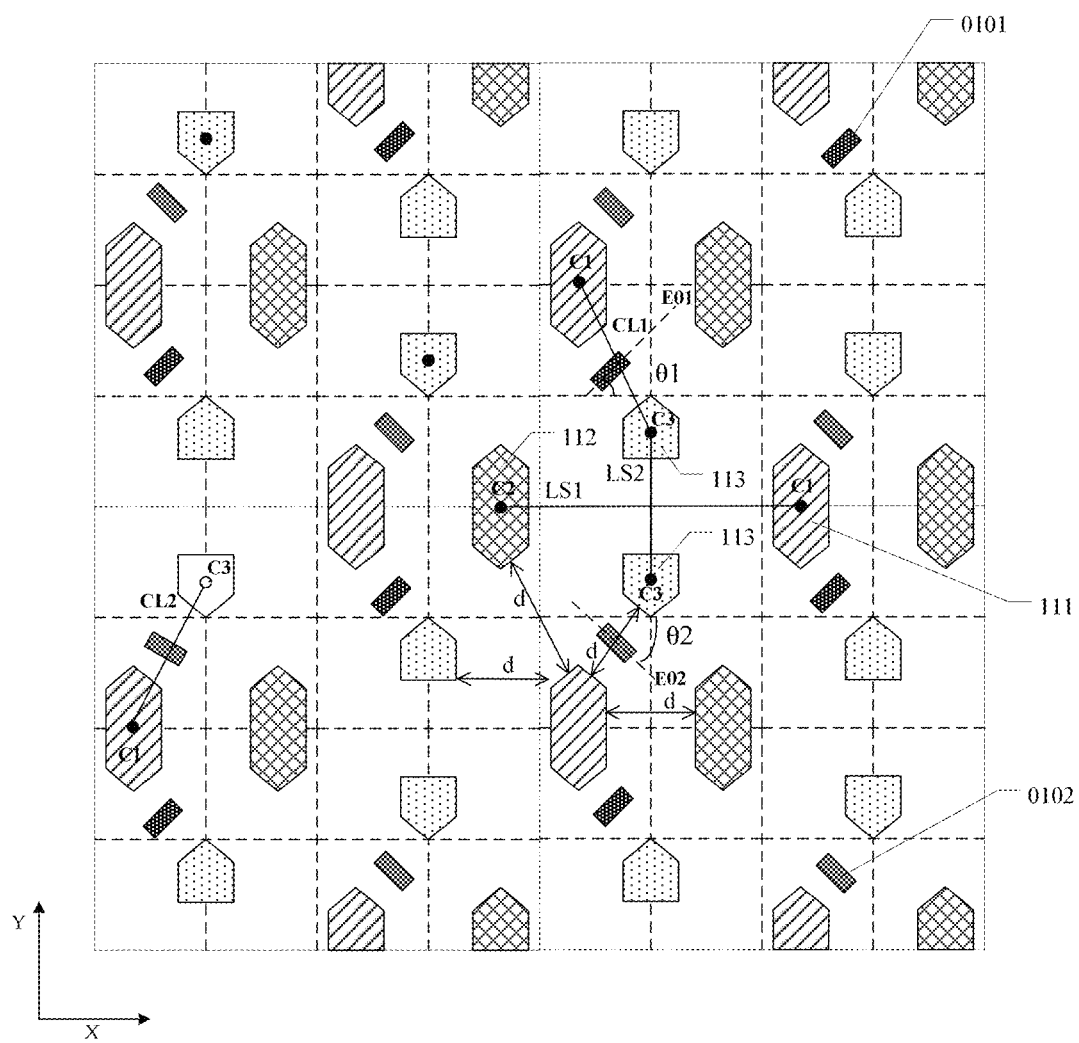
FIG. 9 is a plan view illustrating a display substrate according to an embodiment of the present disclosure.

FIG. 9 illustrates a display substrate including the pixel arrangement structure provided by any of the abovementioned embodiments. As illustrated in FIG. 9, the arrangement structure can adopt the arrangement structure provided by any of the abovementioned embodiments, which is not repeated herein.

As illustrated in FIG. 9, the display substrate further includes a spacer except the abovementioned pixel arrangement structure. For example, the spacer can be used to support a package substrate or other component combined with the display substrate. It can be seen from FIG. 9 that spacers 0101 and 0102 are disposed between the third sub-pixel (a green sub-pixel) and the adjacent first sub-pixel (a red sub-pixel) in the adjacent repeating unit group (row). For example, in addition, a line segment connecting centers of sub-pixels (a green sub-pixel and a red sub-pixel) located on two sides of each spacer can pass through the spacer. For example, as illustrated in FIG. 9, the first sub-pixel 111 is a red sub-pixel, the second sub-pixel 112 is blue sub-pixel, and the third sub-pixel 113 is a green sub-pixel.

By arranging the position between the spacer and the sub-pixel, shading of a sensitive pixel of the human eye (for example, a green sub-pixel) can be reduced, so that the color shift at different viewing angles can be reduced.

For example, as illustrated in FIG. 9, the spacers 0101 and 0102 have an elongated shape, an extending direction of the elongated shape is different from both the first direction and the second direction. For example, the shape of the spacer is a shape of an orthographic projection of the spacer on a substrate. For example, the extending directions E01 and E02 of the spacers are both different from the first direction and the second direction. For example, an angle θ1 between the extending direction E01 and the first direction is 40°-50° or 130°-140°, an angle θ2 between the extending direction E02 and the first direction is 40°-50° or 130°-140°. For example, the angle θ1 and the angle θ2 can be 45° or 135°. By disposing the extending direction, shading of a sensitive pixel of the human eye (for example, a green sub-pixel) can be further reduced, so that the color shift at different viewing angles can be greatly reduced. For example, the extending direction of the spacer between the first sub-pixel and the third sub-pixel which are adjacent to each other in adjacent ones of the repeating unit groups (rows) is approximately parallel to edges of each sub-pixel adjacent to the spacer, according to different extending directions of the spacers, the spacers can include a spacer 0101 and a spacer 0102 having different angles with the first direction.

For example, as illustrated in FIG. 9, the spacers 0101 and 0102 are not overlapped with a line passing through centers of the second sub-pixel and the third sub-pixel which are adjacent to each other in adjacent ones of the repeating unit groups. That is, the spacers 0101 and 0102 are not overlapped with a line passing through centers of the blue sub-pixel and the green sub-pixel.

For example, a projection of the spacer 0101 on a line in the first direction and a projection of the first sub-pixel and the second sub-pixel on the line in the first direction are not overlapped with each other, or partially overlapped with each other.

The embodiment in FIG. 9 is described above as an example, and the spacer is disposed between the third sub-pixel (the green sub-pixel) and the first sub-pixel (the red sub-pixel) which are adjacent to each other in adjacent ones of the repeating unit groups (rows). However, the embodiments of the present disclosure are not limited thereto, for example, the spacers can include at least one of the following spacers: a first spacer, located between the first sub-pixel and the third sub-pixel which are adjacent to each other in adjacent ones of the repeating unit groups; a second spacer, located between the second sub-pixel and the third sub-pixel which are adjacent to each other in adjacent ones of the repeating unit groups; and a third spacer, located between the two third sub-pixels in each of the repeating units. For example, the first spacer and the second spacer have an elongated shape, and an extending direction of the elongated shape is different from both the first direction and the second direction. For example, an angle θ1 between the extending direction E01 and the first direction is 40°-50° or 130°-140°, an angle θ2 between the extending direction E02 and the first direction is 40°-50° or 130°-140°. For example, the angle θ1 and the angle θ2 can be 45° or 135°. Furthermore, the spacer located between the two third sub-pixels can also have an elongated shape, and its extending direction may be perpendicular to a direction in which the two third sub-pixels are arranged.

For example, a ratio of a number of the abovementioned spacers to a number of the sub-pixels (including the first, second and third sub-pixels) is in a range from 0.3 to 1.

The above describes a position design of the spacer to prevent a problem of angular color shift. However, an embodiment of the present disclosure further provides a another solution for the spacer. For example, a transparent spacer can be used to prevent the angular color shift. A position of the transparent spacer is not limited to the abovementioned positions. For example, the transparent spacer can use a material with high transmittance or even full transparency and meeting other alternative requirements to replace the traditional polyimide material with poor transmittance. In this case, no matter from which angle the screen is viewed, because the material has characteristics of high transmittance and non-selective transmission of light of different wavelengths, both red and blue light can be emitted normally without being sheltered by the spacer. The normal light output is independent of the viewed angle, thereby alleviating the angular color shift and the left and right viewing angle asymmetry problem under a white screen of the screen to a certain extent.

An alternative material for the spacer may be silicone. A silicone film has excellent heat resistance, low temperature flexibility, high dielectric constant, and insulation properties or the like. Furthermore, the silicone film, for example, polymer film (PDMS) using dimethyl siloxane as a raw material has colorless and optical full transparency, and can achieve high or even more than 90% light transmittance in millimeter thickness, thereby allowing the spacer to have good transparency in a visible range. A silicone material N-(trimethoxysilylpropyl)-4-azido-2,3,5,6-tetrafluorobenzamide (PFPA-silane) is taken as an example for description, the silicone material has high light transmittance (close to 80%), and the transmittance of light at different wavelengths is not much different.

Furthermore, a material of the spacer may also be a modified material, for example, new polyimide material with colorless and transparent. Because many excellent characteristics of the polyimide itself, and a modified characteristic of high transmittance for an entire range of visible light, the polyimide can be used as a material for the transparent spacer. For example, a composite film of polyimide and silica PI/SiO$_2$ can be used. After the modified PI/SiO$_2$ composite film is optimized, the light transmittance is greatly improved compared to the pure polyimide, and the modified PI/SiO$_2$ composite film has almost no selectivity for wavelength in the visible range, and the light transmittance at different wavelengths is almost the same. Characteristics of the high transmittance and the non-selectivity for wavelength in light transmission are beneficial to the alleviation of the angular color shift.

Figure 10:
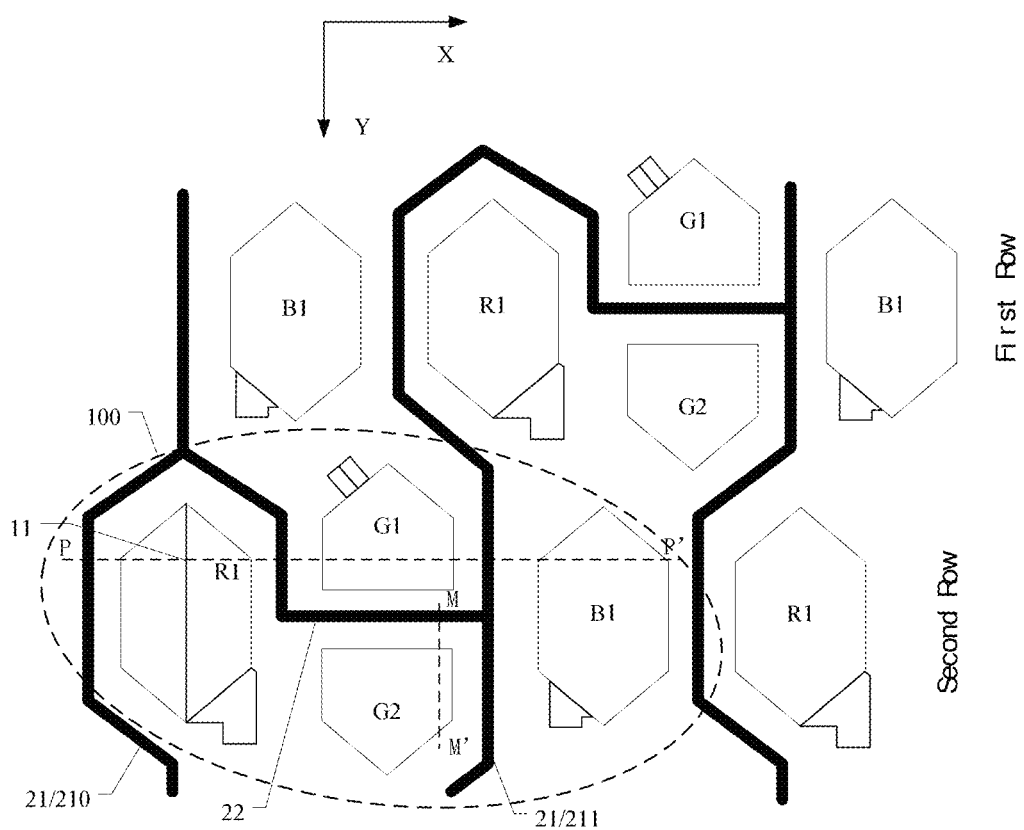
FIG. 10 is a plan view illustrating a display substrate according to an embodiment of the present disclosure.

FIG. 10 is a partial view of a display substrate according to an embodiment of the present disclosure. As illustrated in FIG. 10, the display substrate includes a pixel arrangement structure which can be the pixel arrangement structure in any of the abovementioned embodiments. For example, the pixel arrangement structure includes a plurality of repeating units 100, a plurality of main signal lines 21 and a plurality of auxiliary signal lines 22. Each repeating unit 100 includes one first sub-pixel R1, one second sub-pixel B1, and two third sub-pixels G1 and G2 which are spaced apart. The two third sub-pixels G1 and G2 are located between two adjacent ones of the main signal lines 21, at least one auxiliary signal line 22 is provided between the two adjacent ones of the main signal lines 21, and the auxiliary signal line 22 is connected with the two adjacent ones of the main signal lines 21, and passes through a gap between the two third sub-pixels G1 and G2.

For example, in each repeating unit 100, one auxiliary signal line 22 is provided in the gap between the two third sub-pixels G1 and G2, and passes through the gap between the two third sub-pixels G1 and G2.

Figure 11:
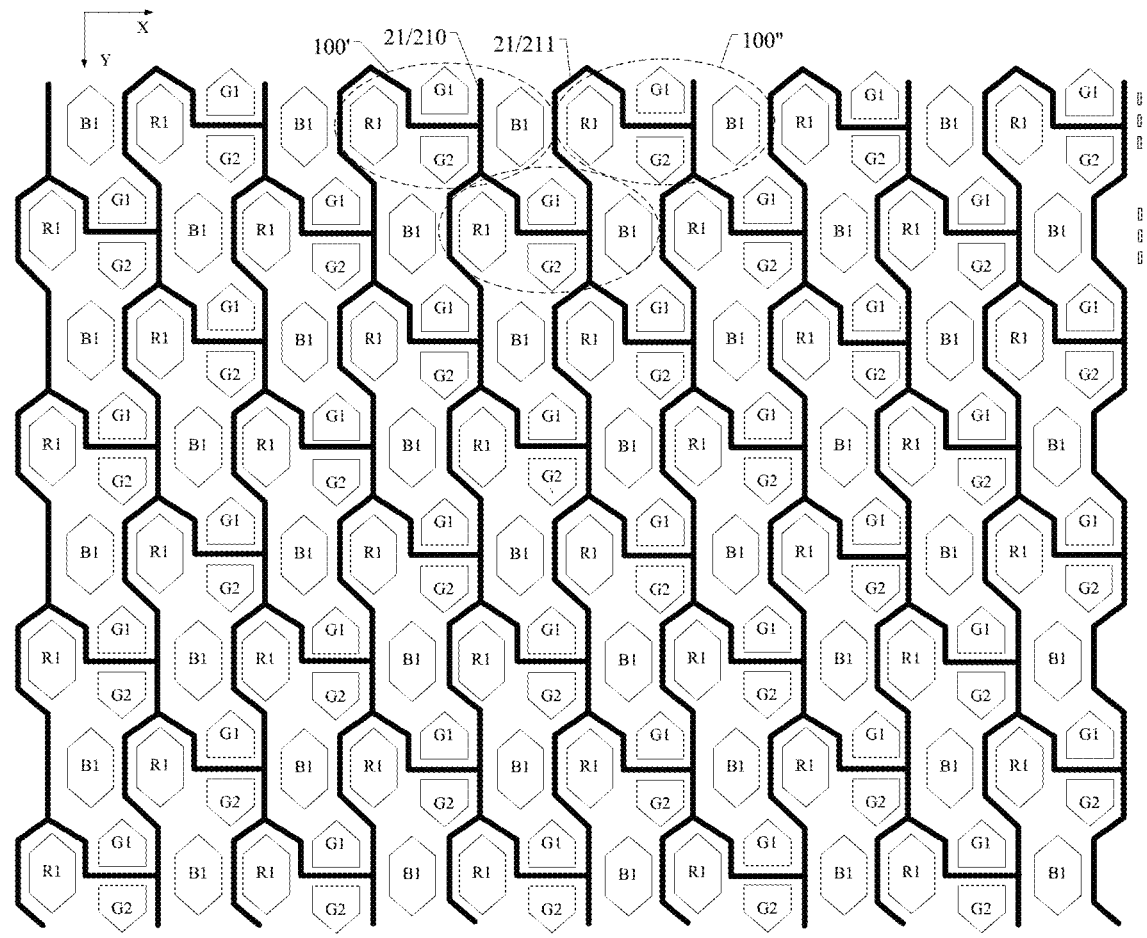
FIG. 11 is a plan view illustrating a display substrate according to an embodiment of the present disclosure.

For example, the plurality of main signal lines 21 extend in the same direction, an extending direction of the auxiliary signal line 22 is different from an extending direction of the plurality of main signal lines 21. As illustrated in FIG. 11, in the entire display substrate, the plurality of main signal lines 21 and the plurality of auxiliary lines 22 are arranged in a mesh pattern, and the plurality of main signal lines 21 and the plurality of auxiliary lines 22 are electrically connected. For example, as illustrated in FIG. 10 and FIG. 11, the auxiliary signal line 22 extends in the first direction (X direction), the plurality of main signal lines 21 extend in the second direction (Y direction). In the present disclosure, the "extension" means a general routing direction of the plurality of main signal lines 21 and the plurality of auxiliary lines 22. However, as illustrated in FIG. 11, the plurality of main signal lines 21 are not linear at a microscopic level but extend in the second direction (Y direction) in a wave shape; the plurality of auxiliary lines 22 are not linear at a microscopic level but extend in the first direction (X direction) in a curved shape. FIG. 11 illustrates the repeating units 100' and 100".

For example, as illustrated in FIG. 10, the extending direction of each main signal line 21 is the second direction (the Y direction), each main signal line 21 has a wave shape. In the same side of the main signal line 21 (for example, a right side illustrated in FIG. 10), assuming that a wave peak portion of the wave shape is adjacent to the first sub-pixel R1, a wave trough portion of the wave shape is adjacent to the second sub-pixel B1. For example, in another side of the main signal line 21 (for example, a left side illustrated in FIG. 10), assuming that the wave peak portion of the wave shape is adjacent to the second sub-pixel B1, the wave trough portion of the wave shape is adjacent to the two third sub-pixel G1 and G2. That is, the wave peak portion of the wave shape is located between the first sub-pixel R1 and the third sub-pixel B1 which are adjacent to each other in the same repeating unit row, the wave trough portion of the wave shape is located between the two third sub-pixels and the second sub-pixel which are adjacent to each other in the same repeating unit row. It should be noted that, as illustrated in FIG. 10, in some embodiments of the present disclosure, a portion of the main signal line 21 having the wave shape protruded to the right side represents the wave trough, and a portion of the main signal line 21 having the wave shape protruded to the left side represents the wave peak. The present disclosure is not limited thereto, the portion of the main signal line 21 having the wave shape protruded to the right side can also represent the wave peak, in this case, the portion of the main signal line 21 having the wave shape protruded to the left side represents the wave trough, so that in the same side of the main signal line 21 (for example, the right side illustrated in FIG. 10), the wave peak portion of the wave shape is adjacent to the second sub-pixel B1, and the wave trough portion of the wave shape is adjacent to the first sub-pixel R1.

For example, a portion of one main signal line 21 corresponding to an even-numbered row of the repeating units is a wave peak, and a portion of the main signal line 21 corresponding to an odd-numbered row of the repeating units is a wave trough; or, a portion of one main signal line 21 corresponding to an odd-numbered row of the repeating units is the wave peak, and a portion of the main signal line 21 corresponding to an even-numbered row of the repeating units is the wave trough.

For example, in the first direction (the X direction), the plurality of main signal lines 21 are arranged in sequence, the wave peak and the wave trough of two adjacent main signal lines 21 are correspond to each other. For example, the plurality of main signal lines 21 include a first main signal line 210, a second main signal line 211. A portion of the first main signal line 210 located in a first row of the repeating units is the wave trough, a portion of the second main signal line 211 located in the first row of the repeating units is the wave peak. correspondingly, a portion of the first main signal line 210 located in a second row of the repeating units is the wave peak, a portion of the second main signal line 211 located in the second row of the repeating units is the wave trough.

For example, the first sub-pixel R1 includes a first light emitting element, the first light emitting element includes a first anode, a first cathode and a first light emitting layer, the first emitting layer is disposed between the first anode and the first cathode. The second sub-pixel B1 includes a second light emitting element, the second light emitting element includes a second anode, a second cathode and a second light emitting layer, the second emitting layer is disposed between the second anode and the second cathode. The two third sub-pixels G1 and G2 each include a third light emitting element, the third light emitting element includes a third anode, a third cathode and a third light emitting layer, the third emitting layer is disposed between the third anode and the third cathode.

Figure 12:
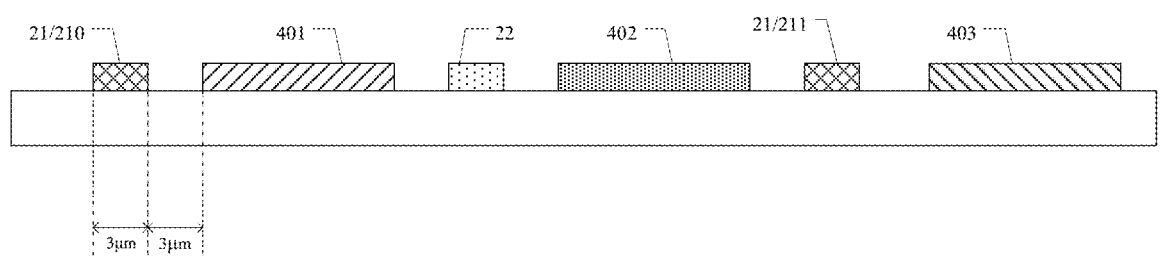
FIG. 12 is a cross-sectional view illustrating a part of a display substrate according to an embodiment of the present disclosure.

For example, the main signal line 21 and the auxiliary signal line 22 can be disposed at the same layer as the anode of the light emitting element. FIG. 12 is a sectional view taken along PP' line of FIG. 10. As illustrated in FIG. 12, the first light emitting element includes a first anode 401, the second light emitting element includes a second anode 402, and the third light emitting element includes a third anode 403. The main signal line 21, the auxiliary signal line 22, the first anode 401, the second anode 402 and the third anode 403 are located in the same layer. Here, different components are located in the "same layer" means that they are on a surface of the same layer structure or they are formed by patterning the same material layer.

For example, a line width of the main signal line 21 and the auxiliary signal line 22 can be 3 μm. A minimum length between a boundary of the main signal line 210 adjacent to the first sub-pixel R1 and a boundary of the first anode 401 can be 3 μm. A minimum length between a boundary of the auxiliary signal line 22 and boundaries of the first anode 401 and the second anode 402 which are adjacent to the auxiliary signal line 22 can be 3 μm. A minimum length between the boundary of the main signal line 21 and boundaries of the second anode 402 and the third anode 403 which are adjacent to the main signal line 21 can also be 3 μm.

For example, the main signal line 21 and the auxiliary signal line 22 can be formed of the same conductive material as the anode of the light emitting element (for example, the first anode 401, the second anode 402 and the third anode 403). The conductive material can be indium tin oxide (ITO), silver (Ag) and so on.

Figure 13:
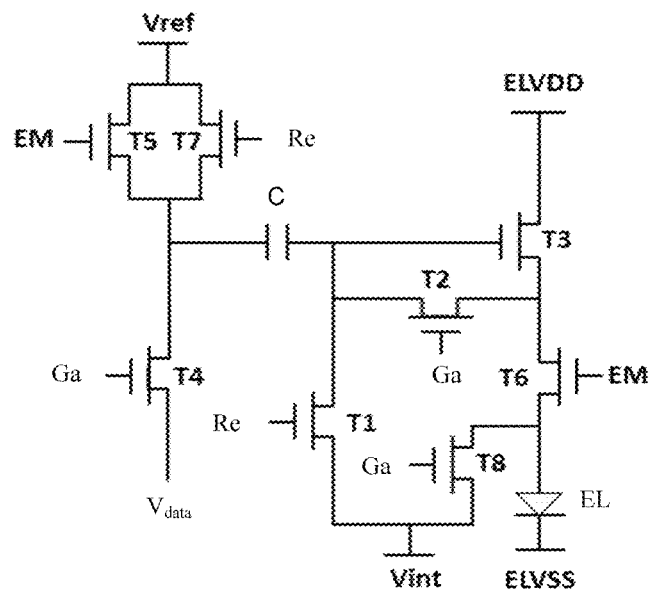
FIG. 13 is a diagram illustrating a structure of a pixel circuit.

FIG. 13 is a structure view of a pixel circuit. For example, as illustrated in FIG. 13, for an organic light emitting diode display substrate, the pixel circuit can be achieved by 8T1C mode. The pixel circuit includes a driving transistor T3, a data input transistor T4, a storage capacitance C, a reset transistor T1, a first threshold value compensation transistor T2, a second threshold value compensation transistor T8, a first voltage drop compensation transistor T5, a second voltage drop compensation transistor T7, and an illumination control transistor T6. The driving transistor T3 is used to drive the light emitting element EL to emit light, the data input transistor T4 is configured to write a data voltage $V_{data}$ to a gate electrode of the driving transistor T3 under the control of a scan signal Ga; the storage capacitance C is configured to store a data signal $V_{data}$ and preserve it in the gate electrode in the driving transistor T3. The first threshold value compensation transistor T2 and the second threshold value compensation transistor T8 are configured to write a threshold value compensation signal to the gate electrode of the driving transistor T3, so as to compensate for the threshold voltage drift of the driving transistor T3. The first voltage drop compensation transistor T5 and the second voltage drop compensation transistor T7 are configured to write a reference voltage signal $V_{ref}$ to the gate electrode of the driving transistor T3. The reset transistor T1 is configured to write a reset voltage $V_{int}$ to the gate electrode of the driving transistor T3 under the control of a reset signal Re. The illumination control transistor T6 is configured to control to turn on or off the light emitting element EL and the driving transistor T3 under the control of a light emitting signal EM.

For example, in the 8T1C pixel circuit, based on the saturation current formula of the driving transistor T3, the illumination current $I_{OLED}$ flowing through the driving transistor T3 can be expressed as: $I_{OLED}=0.5\mu_n C_{ox}(W_0/L_0)(V_{data}-V_{ref})^2$, wherein, $V_{data}$ represents the data voltage, $V_{ref}$ represents the reference voltage, $\mu_n$ is the electron mobility of the driving transistor T3, $C_{ox}$ is a gate unit capacitance of the driving transistor $T_3$, $W_0$ is a channel width of the driving transistor T3, and $L_0$ is a channel length of the driving transistor T3. As can be seen from the above formula, the illumination current $I_{OLED}$ is related to the reference voltage $V_{ref}$ and the data voltage $V_{data}$ The illumination current $I_{OLED}$ is related to the stability of the reference voltage $V_{ref}$, and the fluctuation of the reference voltage $V_{ref}$ causes the illumination current $I_{OLED}$ to change, thereby causing the display brightness of the display panel to change. In the present disclosure, the main signal line 21 and the auxiliary signal line 22 are used to provide the reference voltage $V_{ref}$ to the pixel circuit. Because the main signal line 31 and the auxiliary signal line 32 can be routed in a meshed pattern, the resistance of the signal lines is small, the resistance interconnection is good, and the voltage drop of the reference voltage signal $V_{ref}$ is lower, the control capability is better, and then the stability of the reference voltage signal $V_{ref}$ and the display effect of the display panel can be improved.

The abovementioned driving circuit structure is merely exemplary, the display device according to embodiments of the present disclosure is not limited thereto, and any suitable driving circuit structure may be employed.

For example, the plurality of main signal lines are configured to provide the reference voltage or a common voltage to the plurality of repeating units.

For example, all of the first sub-pixel, the second sub-pixel and the third sub-pixel include the anodes, the plurality of main signal lines and the plurality of auxiliary signal lines are on the same layer as the anode.

Figure 14:
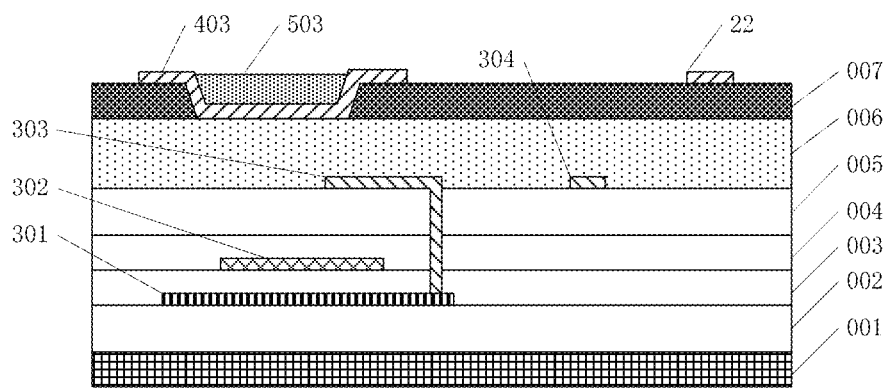
FIG. 14 is a cross-sectional view illustrating a part of a display substrate according to an embodiment of the present disclosure.

FIG. 14 is a sectional view taken along MM' line of FIG. 10. As illustrated in FIG. 14, a sectional structure around one green sub-pixel (the third sub-pixel) is illustrated in FIG. 14. The structure includes a base substrate 001 and a buffer layer 002, a first gate insulating layer 003, a second gate insulating layer 004, an interlayer dielectric layer 005, a planarization layer 006, and a pixel defining layer 007 sequentially disposed on the base substrate. As can be seen from FIG. 14, there is a thin film transistor structure under the third sub-pixel. The thin film transistor structure includes a gate electrode 302, an active layer 301, and a drain electrode 303. The thin film transistor is one of thin film transistors in the abovementioned pixel driving electrodes, and the connection relationship with other components may be set according to a specific pixel circuit arrangement, which will not be shown in detail here. Furthermore, a signal line 304 may also be included at a position in the same layer as the drain electrode 303, and the signal line 304 can also be used as a signal line of a specific function according to different pixel circuit arrangements, for example, the signal line 304 can be used as a data line or a gate line or the like. As can be seen from FIG. 14, the pixel defining layer 007 can include an opening that defines a sub-pixel. The anode 403 of the third sub-pixel and the light emitting layer 503 of the third sub-pixel are located in the opening of the pixel defining layer 007.

For example, as illustrated in FIG. 10, each sub-pixel includes a convex portion, for example, a convex portion protruding from a hexagonal blue sub-pixel and a hexagonal red sub-pixel, and a convex portion protruding from a pentagonal green sub-pixel. The convex portion is a portion where the anode is connected to the anode signal line, for example, in the convex portion, the anode can be connected to the anode signal line through the via hole penetrating the dielectric layer, but the embodiment of the present disclosure is not limited thereto. Upon describing the overall shape of the sub-pixel, the convex portion is not counted, and therefore, the convex portion is not displayed in other drawings. However, during the arrangement of the main signal line and the auxiliary signal line, it is necessary to avoid the convex portion to prevent the abovementioned signal line from being short-circuited with the anode.

For example, the anode 403 and the light emitting layer 503 are in contact with each other, so that the sub-pixel can be driven to emit light at a portion where the anode and the light emitting layer are in contact with each other. Therefore, the portion where the anode 403 and the light emitting layer 503 are in contact with each other is an effective portion that the sub-pixel can emit light. Here, the anode 403 is used as a pixel electrode, so that different data voltages can be applied to different sub-pixels. But in the embodiments of the present disclosure, the electrode serving as the pixel electrode of the sub-pixel is not limited to the anode, and the cathode of the light emitting diode can also be used as the pixel electrode. Therefore, in the embodiments of the present disclosure, a shape of the sub-pixel may refer to a shape of the portion where the pixel electrode and the light emitting layer are in contact with each other. For example, for each sub-pixel, an area of the pixel electrode may be slightly larger than an area of the light emitting layer, or the area of the light emitting layer may be slightly larger than the area of the pixel electrode, which is not particularly limited in the embodiment of the present disclosure. For example, the light emitting layer herein may include the electroluminescent layer itself and other functional layers on both sides of the electroluminescent layer, for example, a hole injection layer, a hole transport layer, an electron injection layer, an electron transport layer, and the like. In some embodiments, the shape of the sub-pixel can also be defined by the pixel defining layer. For example, a lower electrode (for example, the anode) of the light emitting diode can be disposed below the pixel defining layer, the pixel defining layer includes the opening that defines a sub-pixel, the opening exposes a portion of the lower electrode. Upon the light emitting layer being formed in the opening of the abovementioned pixel defining layer, the light emitting layer is in contact with the lower electrode, so that the portion of the light emitting layer can be driven to emit light. Therefore, in this case, the opening of the pixel defining layer defines the shape of the sub-pixel.

For example, shapes of the various sub-pixels described in the embodiments of the present disclosure are all substantial shapes. Upon forming the light emitting layer or various electrode layers, the edges of the sub-pixels are not guaranteed to be strictly straight lines and the angles of the sub-pixels are not guaranteed to be strictly angled shape. For example, the light emitting layer can be formed by an evaporation process through a mask, and therefore, a corner portion thereof can be a rounded shape. In some cases, as mentioned above, an etched metal has a draft angle, and therefore, upon the light emitting layer of the sub-pixel being formed by an evaporation process, a corner of the light emitting layer may be removed.

As described above, the signal lines formed by the main signal line 21 and the auxiliary signal line 22 can be used as a reference voltage line, and as illustrated in FIG. 13, it is connected to the pixel driving circuit of each sub-pixel. For example, around each sub-pixel, the signal line can be connected to the underlying pixel circuit through a via penetrating through the underlying insulating layer(s). For example, as illustrated in FIG. 14, the signal line can be connected to the pixel circuit through a via in the insulating layers under the auxiliary signal line 22, and the specific location of the via can be selected according to the design needs. In the cross section illustrated in FIG. 14, the via structure is not shown. Furthermore, for the mesh structure formed by the above signal lines, the whole structure can be connected to a reference voltage source in a peripheral region of the display substrate. For example, an annular reference voltage signal line is included at the periphery of the display substrate, and the mesh-like signal line is connected to the annular signal line, thereby inputting a reference voltage into the pixel electrode structure of each sub-pixel. For example, the pixel circuit includes at least one transistor including a gate electrode, an active layer, a source electrode and a drain electrode. In one example, the signal line is electrically connected to the source electrode or the drain electrode of the corresponding transistor through a via penetrating through the underlying insulating layer(s). In one example, the active layer of the transistor is formed of a polysilicon layer, and on both sides of the channel region of the active layer, the polysilicon layer is treated to be conductive to form a source region and a drain region. For example, the signal line is electrically connected to the source region and the drain region of the polysilicon through the via hole. For example, the transistor includes the source electrode and the drain electrode, the source electrode and the drain electrode are respectively connected to the source region and the drain region, and the signal line is electrically connected with the source electrode or the drain electrode of the transistor through the via hole. For example, the transistor is a top gate transistor, a via for electrically connecting the signal line to the source electrode or the drain electrode of the corresponding transistor penetrates through a gate metal layer and a data metal layer, and a portion of a metal pattern of the gate metal layer and the data metal layer can serve as a relay connection element for the via electrical connection, but the embodiments of the present disclosure are not limited thereto.

For the above embodiments, various aspects of the pixel arrangement structure and the display substrate including the pixel arrangement structure are described; however, various structural features of the various embodiments can be combined with each other. For example, a basic structure of the abovementioned pixel arrangement is the pixel arrangement structure including a plurality of repeating units. Each of the repeating units includes one first sub-pixel, one second sub-pixel, and two third sub-pixels; in each of the repeating units, the two third sub-pixels are arranged in one of a first direction and a second direction, and the first sub-pixel and the second sub-pixel are arranged in the other one of the first direction and the second direction; the plurality of repeating units are arranged in the first direction to form a plurality of repeating unit groups, the plurality of repeating unit groups are arranged in the second direction; and the first direction and the second direction are different directions. However, the embodiments of the present disclosure are not limited thereto. For example, according to FIG. 2 and FIG. 3, a pixel arrangement structure in the embodiments of the present disclosure can also be the pixel arrangement structure including a plurality of first sub-pixels, a plurality of second sub-pixels, and a plurality of third sub-pixels. The plurality of third sub-pixels are arranged in pairs to form a plurality of third sub-pixel pairs, each of which includes two adjacent third sub-pixels, the plurality of third sub-pixel pairs are arranged in a first direction, and one first sub-pixel and one second sub-pixel are provided between any two third sub-pixel pairs adjacent in the first direction to form a plurality of sub-pixel rows, the plurality of sub-pixel rows are arranged in a second direction, the first direction and the second direction are different directions, two third sub-pixels in each of the plurality of third sub-pixel pairs are arranged in one of the first direction and the second direction, the first sub-pixels and the second sub-pixels between the two third sub-pixel pairs adjacent in the first direction are arranged in the other one of the first direction and the second direction. Or, according to FIG. 2 and FIG. 3, a pixel arrangement structure including a plurality of first sub-pixels, a plurality of second sub-pixels, and a plurality of third sub-pixels. The plurality of third sub-pixels are arranged in pairs to form a plurality of third sub-pixel pairs, each of which includes two adjacent third sub-pixels, one first sub-pixel and one second sub-pixel form one mixed sub-pixel pairs, the plurality of third sub-pixel pairs and a plurality of mixed sub-pixel pairs are alternately arranged in a row direction and a column direction, three first sub-pixels and three second sub-pixels are disposed around each of the plurality of third sub-pixel pairs, the three first sub-pixels and the three second sub-pixels are alternately arranged in a circumferential direction, four third sub-pixel pairs are disposed around each of the plurality of mixed sub-pixel pairs, and are respectively located at two sides of each of the plurality of mixed sub-pixel pairs in the row direction and two sides of each of the plurality of mixed sub-pixel pairs in the column direction. Furthermore, various detail descriptions for the basic structure of the pixel arrangement in the abovementioned various embodiments can be combined into the three basic pixel arrangement structures described herein without conflicts.

Embodiments according to the present disclosure provide the following structures.

(1) A pixel arrangement structure, including a plurality of repeating units, wherein each of the plurality of repeating units includes one first sub-pixel, one second sub-pixel, and two third sub-pixels; in each of the plurality of repeating units, the two third sub-pixels are arranged in one of a first direction and a second direction, and the first sub-pixel and the second sub-pixel are arranged in the other one of the first direction and the second direction; the plurality of repeating units are arranged in the first direction to form a plurality of repeating unit groups, the plurality of repeating unit groups are arranged in the second direction; and the first direction and the second direction are different directions.

(2) The pixel arrangement structure according to item (1), wherein the first direction and the second direction are respectively two directions which are substantially perpendicular to each other in a same plane.

(3) The pixel arrangement structure according to item (1), wherein adjacent ones of the plurality of repeating unit groups are shifted from each other in the first direction.

(4) The pixel arrangement structure according to item (3), wherein the two third sub-pixels are arranged in the second direction, and the first sub-pixel and the second sub-pixel are arranged in the first direction.

(5) The pixel arrangement structure according to item (4), wherein two lines passing through centers of the first sub-pixel and the second sub-pixel in two adjacent ones of the plurality of repeating unit groups have a distance of L therebetween, and a line passing through centers of the first sub-pixel and the second sub-pixel in any one of the plurality of repeating unit groups and a center of the third sub-pixel in an adjacent one of the plurality of repeating unit groups have a minimum distance of about ½ L-¾ L therebetween.

(6) The pixel arrangement structure according to item (5), wherein, in each of the plurality of repeating units, centers of the two third sub-pixels have a distance of about ½ L-1 L therebetween.

(7) The pixel arrangement structure according to item (4), wherein, in each of the plurality of repeating units, adjacent edges of the two third sub-pixels have a distance greater than 12 micrometers.

(8) The pixel arrangement structure according to item (7), wherein, in each of the plurality of repeating units, adjacent edges of the two third sub-pixels have a distance greater than 14 micrometers.

(9) The pixel arrangement structure according to item (5), wherein a pitch of the plurality of repeating units in the first direction is about 2 L.

(10) The pixel arrangement structure according to item (5), wherein the first sub-pixel includes two portions separated by a center line of the first sub-pixel in the first direction, and centers of the two portions have a distance less than 0.3 L therebetween.

(11) The pixel arrangement structure according to item (4), wherein each of the first sub-pixel and the second sub-pixel is asymmetric with respect to a straight line passing through a center thereof in a second direction.

(12) The pixel arrangement structure according to item (4), wherein each of the first sub-pixel and the second sub-pixel substantially has an elongated shape or an elliptical shape extending in the second direction.

(13) The pixel arrangement structure according to item (12), wherein a ratio of a size of the first sub-pixel or the second sub-pixel in the second direction to a size of the first sub-pixel or the second sub-pixel in the first direction is σ, and σ>1.

(14) The pixel arrangement structure according to item (13), wherein the first sub-pixel is a red sub-pixel, the second sub-pixel is a blue sub-pixel, and the ratio σ of the first sub-pixel is greater than the ratio σ of the second sub-pixel.

(15) The pixel arrangement structure according to item (14), wherein the size of the first sub-pixel in the second direction is less than 0.6 L.

(16) The pixel arrangement structure according to item (4), wherein a minimum distance between one third sub-pixel of any one of the plurality of repeating unit groups and an adjacent first sub-pixel of an adjacent one of the plurality of repeating unit groups is a first distance, a minimum distance between one third sub-pixel in any one of the plurality of repeating unit groups and an adjacent second sub-pixel of an adjacent one of the plurality of repeating unit groups is a second distance, the first distance is substantially the same as the second distance.

(17) The pixel arrangement structure according to item (16), wherein a minimum distance between one first sub-pixel of any one of the plurality of repeating unit groups and an adjacent second sub-pixel of an adjacent one of the plurality of repeating unit groups is a third distance, the third distance is substantially the same as the first distance. For example, the "minimum distance" refers to a distance between two intersections of the center connecting line of two sub-pixels and the sides of the two sub-pixels.

(18) The pixel arrangement structure according to item (4), wherein the first direction and a horizontal direction or a vertical direction have an angle of about 40°-50°.

(19) The pixel arrangement structure according to item (18), wherein the first direction and a horizontal direction have an angle of about 45° therebetween.

(20) The pixel arrangement structure according to item (4), wherein, in each of the plurality of repeating units, the first sub-pixel and the second sub-pixel are respectively located at two sides of the two third sub-pixels, a line segment connecting centers of the first sub-pixel and the second sub-pixel is a first line segment, a line segment connecting centers of the two third sub-pixels is a second line segment, a length ratio of the second line segment to the first line segment is less than or equal to ¾.

(21) The pixel arrangement structure according to item (20), wherein the second line segment and the first line segment are substantially perpendicular to each other and equally halved by each other.

(22) The pixel arrangement structure according to item (1), wherein each of the plurality of repeating unit groups includes repeating units arranged in a row direction, and the plurality of the repeating unit groups are arranged in a column direction, in a middle portion of the pixel arrangement structure, repeating unit groups of odd-numbered rows have the same arrangement, repeating unit groups of even-numbered rows have the same arrangement, a line passing through centers of the two third sub-pixels located in a same one of the plurality of repeating units in each row of repeating unit groups is located between centers of the first sub-pixel and the second sub-pixel which are directly adjacent to the two third sub-pixels in an adjacent row of repeating unit groups, the first direction is the row direction, and the second direction is the column direction; or, each of the plurality of repeating unit groups includes repeating units arranged in a column direction, and the plurality of the repeating unit groups are arranged in a row direction, in a middle portion of the pixel arrangement structure, repeating unit groups of odd-numbered columns have the same arrangement, repeating unit groups of even-numbered columns have the same arrangement, a line passing through centers of the two third sub-pixels located in a same one of the plurality of repeating units in each column of repeating unit groups is located between centers of the first sub-pixel and the second sub-pixel which are directly adjacent to the two third sub-pixels in an adjacent column of repeating unit groups, the first direction is the column direction, and the second direction is the row direction.

(23) The pixel arrangement structure according to item (1), wherein the two third sub-pixels are arranged in the first direction, a center line extending in the second direction of the first sub-pixel or the second sub-pixel located in one of two adjacent ones of the plurality of repeating unit groups is located between two adjacent third sub-pixels in the other one of the two adjacent repeating unit groups; or, the two third sub-pixels are arranged in the second direction, a center line extending in the second direction of the third sub-pixel located in one of two adjacent ones of the plurality of repeating unit groups is located between the first sub-pixel and the second sub-pixel which are adjacent to each other in the other one of the two adjacent repeating unit groups.

It is to be noted that, a center line extending in the second direction of the third sub-pixel refers to a straight line extending in the second direction and passing through a center of the third sub-pixel. The description that the center line is located between the first sub-pixel and the second sub-pixel which are adjacent to each other in other one of the two adjacent repeating unit groups refers to that the center line is located in a gap between the first sub-pixel and the second sub-pixel, or located between an edge of the first sub-pixel and an edge of the second sub-pixel which are opposite to each other. Here, the two adjacent third sub-pixels in "the other one" of two adjacent repeating unit groups are located in different repeating units, the first sub-pixel and the second sub-pixel which are adjacent to each other in "the other one" of the two adjacent repeating unit groups are located in different repeating units.

(24) The pixel arrangement structure according to item (1), wherein the two third sub-pixels in a same one of the plurality of repeating units are arranged in the second direction, a range in which the two third sub-pixels extend in the first direction is not beyond a maximum range between two edges away from each other in the first direction of one first sub-pixel and one second sub-pixel, which are adjacent to one of the two third sub-pixels in the second direction; or, the two third sub-pixels in a same one of the plurality of repeating units are arranged in the first direction, a range in which the two third sub-pixels extend in the second direction is not beyond a maximum range between two edges away from each other in the second direction of one first sub-pixel and one second sub-pixel, which are adjacent to one of the two third sub-pixels in the first direction.

(25) The pixel arrangement structure according to item (1), wherein the first sub-pixel and the second sub-pixel are arranged in the same order in each of the plurality of repeating units.

(26) The pixel arrangement structure according to item (1), wherein one first sub-pixel and one third sub-pixel which are adjacent to each other form a virtual pixel, one second sub-pixel and one third sub-pixel which are adjacent to each other form a virtual pixel.

(27) The pixel arrangement structure according to item (1), wherein the two third sub-pixels are arranged in the first direction, in the first direction, the first sub-pixel and the second sub-pixel are located between the two third sub-pixels, four sub-pixels in each of the plurality of repeating units form two virtual pixels, one of the two third sub-pixels and the first sub-pixel form one of the two virtual pixels, the other one of the two third sub-pixels and the second sub-pixel form other one of the two virtual pixels; or, the two third sub-pixels are arranged in the second direction, in the first direction, the two third sub-pixels are located between the first sub-pixel and the second sub-pixel, four sub-pixels in each of the plurality of repeating units form two virtual pixels, one of the two third sub-pixels and the first sub-pixel form one of the two virtual pixels, and the other one of the two third sub-pixels and the second sub-pixel form other one of the two virtual pixels.

(28) The pixel arrangement structure according to item (4), wherein the first direction is a row direction, the second direction is a column direction, the first sub-pixel of one of the plurality of repeating units in a repeating unit group of a xth row and one of the third sub-pixels of the one of the plurality of repeating units close to a repeating unit group of a (x+1)th row form a virtual pixel, the second sub-pixel of the one of the plurality of repeating units and one of the third sub-pixels in a repeating unit group of a (x+1)th row which is adjacent to the second sub-pixel form a virtual pixel; or, the first direction is a column direction, the second direction is a row direction, the first sub-pixel of one of the plurality of repeating units in a repeating unit group of a xth column and one of the third sub-pixels of the one of the plurality of repeating units close to a repeating unit group of a (x+1)th column form a virtual pixel, the second sub-pixel in the one of the plurality of repeating units and one of the third sub-pixels in a repeating unit group of a (x+1)th column which is adjacent to the second sub-pixel form a virtual pixel, wherein x is a positive integer.

(29) The pixel arrangement structure according to item (27), wherein the first sub-pixel and the second sub-pixel are respectively shared by two pixels.

(30) The pixel arrangement structure according to item (1), wherein, in one of the plurality of repeating units, the two third sub-pixels are arranged in the first direction, the first sub-pixel and the second sub-pixel in a same one of the plurality of repeating units are located in a same column or a same row, the two third sub-pixels are respectively located in two columns located on two sides of a column where the first sub-pixel and the second sub-pixel are located, or two rows located on two sides of a row where the first sub-pixel and the second sub-pixel are located; or, in one of the plurality of repeating unit, the two third sub-pixels are arranged in the second direction, the two third sub-pixels are located in a same column or a same row, the first sub-pixel and the second sub-pixel are respectively located in two columns located on two sides of a column where the two third sub-pixels are located or two rows located on two sides of a row where the two third sub-pixels are located.

(31) The pixel arrangement structure according to item (30), wherein, the sub-pixels have a density in the first direction 1.5 times of that of the pixels, the sub-pixels have a density in the second direction 1.5 times of that of the pixels, wherein each of the plurality of repeating units includes three columns of sub-pixels, or two columns of pixels, or each of the repeating units includes three rows of sub-pixels, or two rows of pixels.

(32) The pixel arrangement structure according to item (1), wherein, in each of the plurality of repeating units, the two third sub-pixels are arranged in the first direction, a size of the first sub-pixel and the second sub-pixel in the first direction is greater than a size of the first sub-pixel and the second sub-pixel in the second direction; or, in each of the plurality of repeating units, the two third sub-pixels are arranged in the second direction, a size of the first sub-pixel and the second sub-pixel in the second direction is greater than a size of the first sub-pixel and the second sub-pixel in the first direction.

(33) The pixel arrangement structure according to item (1), wherein the first sub-pixel and the second sub-pixel both have a trapezoidal shape, two bases of the first sub-pixel and the second sub-pixel are opposite to each other; each of the two third sub-pixels has a pentagon shape, the pentagon shape includes a set of opposite sides which are parallel to each other and a perpendicular side, the perpendicular edge is perpendicular to the set of opposite sides, two perpendicular sides of the two third sub-pixels are adjacent to each other; and the bases of the first sub-pixel and the second sub-pixel are parallel to the set of opposite sides of each of the two third sub-pixels.

(34) The pixel arrangement structure according to item (1), wherein the first sub-pixel and the second sub-pixel both have a trapezoidal shape, of which a corner at an end point of a long base of the trapezoidal shape being removed, short bases of the first sub-pixel and the second sub-pixel are opposite to each other; each of the two third sub-pixels has a pentagon shape, the pentagon shape includes a set of opposite sides which are parallel to each other and a perpendicular side, the perpendicular side is perpendicular to the set of parallel sides, two perpendicular sides of the two third sub-pixels are adjacent to each other; and the bases of the first sub-pixel and the second sub-pixel are parallel to the set of opposite sides of each of the two third sub-pixels.

(35) The pixel arrangement structure according to item (1), wherein both the first sub-pixel and the second sub-pixel have a hexagonal shape, and three sets of opposite sides of the hexagonal shape are respectively parallel; each of the two third sub-pixels has a pentagon shape, the pentagon shape includes a set of opposite sides which are parallel to each other and a perpendicular side, the perpendicular side is perpendicular to the set of parallel sides, perpendicular sides of the two third sub-pixels are adjacent to each other; and one of the three sets of opposite sides with the largest length of the first sub-pixel and one of the three sets of opposite sides with the largest length of the second sub-pixel are parallel to the set of opposite sides of each of the two third sub-pixels which are parallel to each other.

(36) The pixel arrangement structure according to item (33), wherein each of sub-pixels has a shape with rounded corners.

(37) A pixel arrangement structure, including a plurality of first sub-pixels, a plurality of second sub-pixels, and a plurality of third sub-pixels, wherein the plurality of third sub-pixels are arranged in pairs to form a plurality of third sub-pixel pairs each of which includes two adjacent third sub-pixels, the plurality of third sub-pixel pairs are arranged in a first direction, and one first sub-pixel and one second sub-pixel are provided between any two third sub-pixel pairs adjacent in the first direction to form a plurality of sub-pixel rows, the plurality of sub-pixel rows are arranged in a second direction, the first direction and the second direction are different directions, two third sub-pixels in each of the plurality of third sub-pixel pairs are arranged in one of the first direction and the second direction, the first sub-pixels and the second sub-pixels between the two third sub-pixel pairs adjacent in the first direction are arranged in the other one of the first direction and the second direction.

(38) The pixel arrangement structure according to item (37), wherein the first sub-pixel and the second sub-pixel are arranged in the same order between the two adjacent third sub-pixels.

(39) The pixel arrangement structure according to item (37), wherein the first direction and the second direction are respectively two directions which are substantially perpendicular to each other in a same plane.

(40) The pixel arrangement structure according to item (37), wherein adjacent ones of the plurality of sub-pixel rows are shifted from each other in the first direction.

(41) The pixel arrangement structure according to item (37), wherein the two third sub-pixels in each of the plurality of third sub-pixel pair are arranged in the first direction, a size of the first sub-pixel and the second sub-pixel in the first direction is greater than a size of the first sub-pixel and the second sub-pixel in the second direction; or, the two third sub-pixels in each of the plurality of third sub-pixel pair are arranged in the second direction, a size of the first sub-pixel and the second sub-pixel in the second direction is greater than a size of the first sub-pixel and the second sub-pixel in the first direction.

(42) The pixel arrangement structure according to item (37), wherein, in an arrangement direction of the two third sub-pixels in each of the plurality of third sub-pixel pairs, a size of each of the plurality of third sub-pixel pairs is greater than a size of the first sub-pixel and the second sub-pixel.

It is to be noted that, in each of the plurality of repeating units, light emitting layers of the two third sub-pixels can be integrated, that is, the two third sub-pixels are provided with an integral light emitting layer. For example, as shown in FIG. 5, the light emitting layer 513 can be used for the two third sub-pixels 113. In the arrangement direction of the two third sub-pixels, a size of the integral light emitting layer is greater than a size of a light emitting layer of the first sub-pixel or the second sub-pixel. As for the mask for forming the third sub-pixels, for example, the fine metal mask used for evaporation, it may be formed to include openings each of which is used for forming the two third sub-pixels. For example, one opening may be used for forming one pair of third sub-pixels. For example, each opening of the mask can be used to form the light emitting layer of the two third sub-pixels, so that the light emitting layer is an integral layer for the two third sub-pixels.

(43) The pixel arrangement structure according to item (37), wherein the first sub-pixel and the second sub-pixel both have a trapezoidal shape, two bases of the first sub-pixel and the second sub-pixel are opposite to each other; each of the two third sub-pixel has a pentagon shape, the pentagon shape includes a set of opposite sides which are parallel to each other and a perpendicular side, the perpendicular edge is perpendicular to the set of opposite sides, two perpendicular sides of the two third sub-pixels are adjacent to each other; and the bases of the first sub-pixel and the second sub-pixel are parallel to the set of opposite sides of each of the two third sub-pixels.

(44) The pixel arrangement structure according to item (37), wherein the first sub-pixel and the second sub-pixel both have a trapezoidal shape, of which a corner at an end point of a long base of the trapezoidal shape being removed, short bases of the first sub-pixel and the second sub-pixel are opposite to each other; each of the two third sub-pixels has a pentagon shape, the pentagon shape includes a set of opposite sides which are parallel to each other and a perpendicular side, the perpendicular side is perpendicular to the set of parallel sides, two perpendicular sides of the two third sub-pixels are adjacent to each other; and the bases of the first sub-pixel and the second sub-pixel are parallel to the set of opposite sides of each of the two third sub-pixels.

(45) The pixel arrangement structure according to item (37), wherein both the first sub-pixel and the second sub-pixel have a hexagonal shape, and three sets of opposite sides of the hexagonal shape are respectively parallel; each of the two third sub-pixels has a pentagon shape, the pentagon shape includes a set of opposite sides which are parallel to each other and a perpendicular side, the perpendicular side is perpendicular to the set of parallel sides, perpendicular sides of the two third sub-pixels are adjacent to each other; and one of the three sets of opposite sides with the largest length of the first sub-pixel and one of the three sets of opposite sides with the largest length of the second sub-pixel are parallel to the set of opposite sides of each of the two third sub-pixels which are parallel to each other.

(46) The pixel arrangement structure according to item (43), wherein each of sub-pixels has a shape with rounded corners.

(47) A pixel arrangement structure, including a plurality of first sub-pixels, a plurality of second sub-pixels, and a plurality of third sub-pixels, wherein the plurality of third sub-pixels are arranged in pairs to form a plurality of third sub-pixel pairs each of which includes two adjacent third sub-pixels, one first sub-pixel and one second sub-pixel form one mixed sub-pixel pair, the plurality of third sub-pixel pairs and a plurality of mixed sub-pixel pairs are alternately arranged in a row direction and a column direction, three first sub-pixels and three second sub-pixels are disposed around each of the plurality of third sub-pixel pairs, the three first sub-pixels and the three second sub-pixels are alternately arranged in a circumferential direction, four third sub-pixel pairs are disposed around each of the plurality of mixed sub-pixel pairs, and are respectively located at two sides of each of the plurality of mixed sub-pixel pairs in the row direction and two sides of each of the plurality of mixed sub-pixel pairs in the column direction.

(48) The pixel arrangement structure according to item (47), wherein an interval between two sub-pixels in the mixed sub-pixel pair is greater than that in the third sub-pixel pair.

(49) The pixel arrangement structure according to item (47), wherein the third sub-pixels in the third sub-pixel pair are arranged in one of a first direction and a second direction, the first sub-pixel and the second sub-pixel in the mixed sub-pixel pair are arranged in the other one of the first direction and the second direction.

(50) The pixel arrangement structure according to item (49), wherein the first sub-pixel and the second sub-pixel are arranged in the same order in each of the plurality of mixed sub-pixel pairs.

(51) The pixel arrangement structure according to item (47), wherein the first sub-pixel and the second sub-pixel both have a trapezoidal shape, two bases of the first sub-pixel and the second sub-pixel are opposite to each other; each of the two third sub-pixel has a pentagon shape, the pentagon shape includes a set of opposite sides which are parallel to each other and a perpendicular side, the perpendicular edge is perpendicular to the set of opposite sides, two perpendicular sides of the two third sub-pixels are adjacent to each other; and the bases of the first sub-pixel and the second sub-pixel are parallel to the set of opposite sides of each of the two third sub-pixels.

(52) The pixel arrangement structure according to item (47), wherein the first sub-pixel and the second sub-pixel both have a trapezoidal shape, of which a corner at an end point of a long base of the trapezoidal shape being removed, short bases of the first sub-pixel and the second sub-pixel are opposite to each other; each of the two third sub-pixels has a pentagon shape, the pentagon shape includes a set of opposite sides which are parallel to each other and a perpendicular side, the perpendicular side is perpendicular to the set of parallel sides, two perpendicular sides of the two third sub-pixels are adjacent to each other; and the bases of the first sub-pixel and the second sub-pixel are parallel to the set of opposite sides of each of the two third sub-pixels.

(53) The pixel arrangement structure according to item (47), wherein both the first sub-pixel and the second sub-pixel have a hexagonal shape, and three sets of opposite sides of the hexagonal shape are respectively parallel; each of the two third sub-pixels has a pentagon shape, the pentagon shape includes a set of opposite sides which are parallel to each other and a perpendicular side, the perpendicular side is perpendicular to the set of parallel sides, perpendicular sides of the two third sub-pixels are adjacent to each other; and one of the three sets of opposite sides with the largest length of the first sub-pixel and one of the three sets of opposite sides with the largest length of the second sub-pixel are parallel to the set of opposite sides of each of the two third sub-pixels which are parallel to each other.

(54) The pixel arrangement structure according to item (53), wherein each of sub-pixels has a shape with rounded corners.

(55) A display substrate, including the pixel arrangement structure according to item (1).

(56) The display substrate according to item (55), further including: a plurality of main signal lines and a plurality of auxiliary signal lines, wherein the two third sub-pixels are located between two adjacent ones of the plurality of main signal lines, at least one auxiliary signal line is provided between the two adjacent ones of the plurality of main signal lines, and the at least one auxiliary signal line is connected with the two adjacent ones of the plurality of main signal lines, and passes through a gap between the two third sub-pixels.

(57) The display substrate according to item (56), wherein the plurality of main signal lines are configured to supply a reference voltage or a common voltage to the plurality of repeating units.

(58) The display substrate according to item (56), wherein the first sub-pixel, the second sub-pixel and the third sub-pixel each includes an anode, the plurality of main signal lines and the plurality of auxiliary signal lines are located in a same layer with the anode.

(59) The display substrate according to item (55), further including at least one of the following spacers:

a first spacer, located between the first sub-pixel and the third sub-pixel which are adjacent to each other in adjacent ones of the plurality of repeating unit groups;

a second spacer, located between the second sub-pixel and the third sub-pixel which are adjacent to each other in adjacent ones of the plurality of repeating unit groups; and a third spacer, located between the two third sub-pixels in each of the repeating units.

(60) The display substrate according to item (59), wherein the first spacer and the second spacer have an elongated shape, an extending direction of the elongated shape is different from both the first direction and the second direction.

(61) The display substrate according to item (59), wherein the extending direction and the first direction have an angle of 40°-50° or 130°-140° therebetween.

(62) The display substrate according to item (59), wherein the first sub-pixel is a red sub-pixel, the second sub-pixel is a blue sub-pixel, the third sub-pixel is a green sub-pixel, the first spacer is not overlapped with a line passing through centers of the second sub-pixel and the third sub-pixel which are adjacent to each other in adjacent ones of the plurality of repeating unit groups.

(63) The display substrate according to item (59), wherein a projection of the first spacer on a line in the first direction and a projection of the first sub-pixel and the second sub-pixel on the line in the first direction are not overlapped with each other, or partially overlapped with each other.

(64) The display substrate according to item (59), wherein a ratio of a number of the spacers to a number of sub-pixels is in a range from 0.3 to 1.

(65) A display device, including the display substrate according to item (55).

The embodiments of the present disclosure provides a display panel, pixels of the display panel are arranged according to the above-described pixel arrangement structure.

The embodiment of the present disclosure also provides a display device, which comprises the above-described display panel.

The display device in accordance with the embodiments of the present disclosure can be applied to any display device including three sub-pixels such as red, green and blue sub-pixels, for example, liquid crystal display (LCD) and organic light-emitting diode (OLED), etc.

Embodiments of the present disclosure further provide a driving method of a pixel arrangement structure.

Figure 15A:
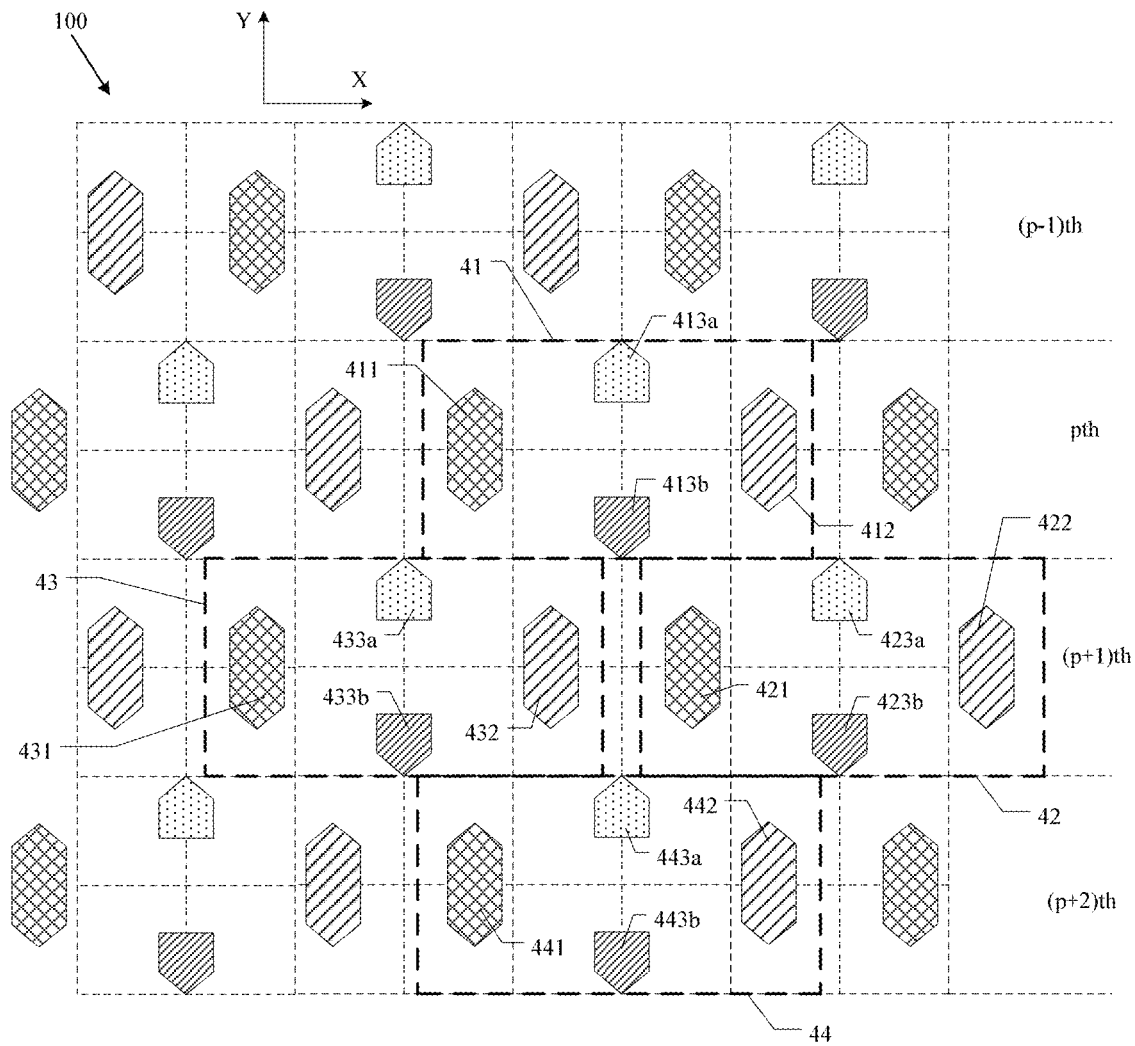
FIG. 15A is a structural diagram illustrating a part of a pixel arrangement structure according to an embodiment of the present disclosure.
Figure 15B:
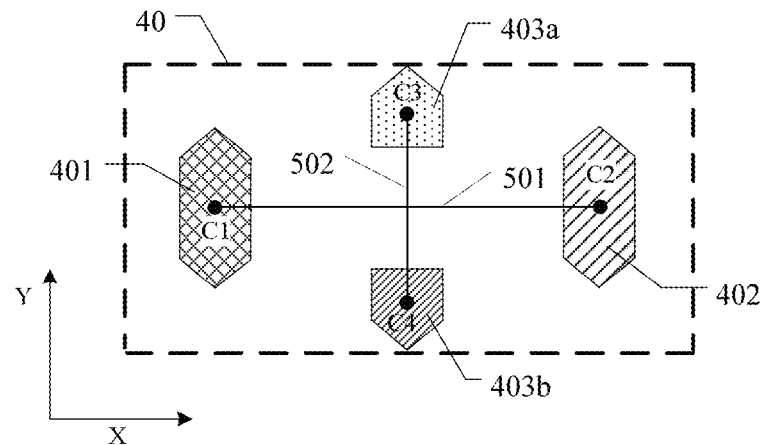
FIG. 15B is a structural diagram illustrating a repeating unit in a pixel arrangement structure according to an embodiment of the present disclosure.
Figure 15C:
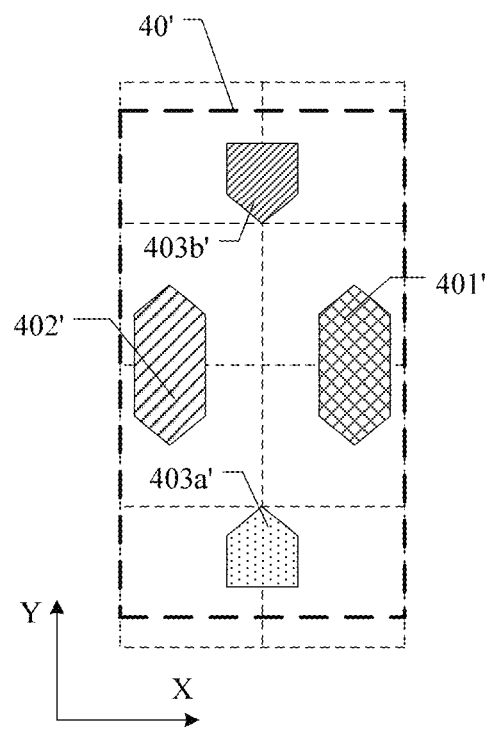
FIG. 15C is a structural diagram illustrating another repeating unit in a pixel arrangement structure according to an embodiment of the present disclosure.

FIG. 15A is a structural diagram illustrating a part of a pixel arrangement structure according to an embodiment of the present disclosure, FIG. 15B is a structural diagram illustrating a repeating unit in a pixel arrangement structure according to an embodiment of the present disclosure, and FIG. 15C is a structural diagram illustrating another repeating unit in a pixel arrangement structure according to an embodiment of the present disclosure. In FIGS. 15A-15C, "41", "42", "43", and "44" refers to repeating units. "411", "412", "413a" and "413b" refers to the first sub-pixel, the second sub-pixel and the two third sub-pixels in the repeating unit 41. "421", "422", "423a" and "423b" refers to the first sub-pixel, the second sub-pixel and the two third sub-pixels in the repeating unit 42. "431", "432", "433a" and "433b" refers to the first sub-pixel, the second sub-pixel and the two third sub-pixels in the repeating unit 43. "441", "442", "443a" and "443b" refers to the first sub-pixel, the second sub-pixel and the two third sub-pixels in the repeating unit 44.

For example, as illustrated in FIG. 15A and FIG. 15B, the pixel arrangement structure 100 provided by embodiments of the present disclosure includes a plurality of repeating units 40. The plurality of repeating units 40 are arranged in a row direction X to form a plurality of repeating unit groups. FIG. 15A illustrates four repeating unit groups, which are a (p−1)th repeating unit group, a pth repeating unit group, a (p+1)th repeating unit group, and a (p+2)th repeating unit group. For example, p is a positive integer greater than or equal to 2. The plurality of repeating unit groups are arranged in a column direction Y. That is, the plurality of repeating units are arranged in an array in the row direction and the column direction.

For example, the row direction is not parallel to the column direction. For example, in some embodiments, the row direction and the column direction are two directions perpendicular to each other in the same plane.

For example, as illustrated in FIG. 15B, each of the plurality of repeating units 40 includes one first sub-pixel 401, one second sub-pixel 402, and two third sub-pixels 403a and 403b.

For example, a plurality of sub-pixels in the pixel arrangement structure 100 form a plurality of virtual pixels arranged in an array. The virtual pixels include first type virtual pixels and second type virtual pixels. Each of the first type virtual pixels include one first sub-pixel and one third sub-pixel, and each of the second type virtual pixels include one second sub-pixel and one third sub-pixel. For example, as illustrated in FIG. 15A, the pth repeating unit group includes a first repeating unit 41, the (p+1)th repeating unit group includes a second repeating unit 42, a first sub-pixel 411 and a third sub-pixel 413b which are in the first repeating unit 41 form a virtual pixel, a second sub-pixel 412 in the first repeating unit 41 and a third sub-pixel 423a in the second repeating unit 42 form a virtual pixel.

It should be understood that, the division of virtual pixels is related to driving manner. The division manner of the virtual pixels illustrated in FIG. 15A and FIG. 15B is only exemplary. The specific division manner of the virtual pixels may be determined according to the actual driving manner, which is not specifically limited in the present disclosure.

Figure 16A:
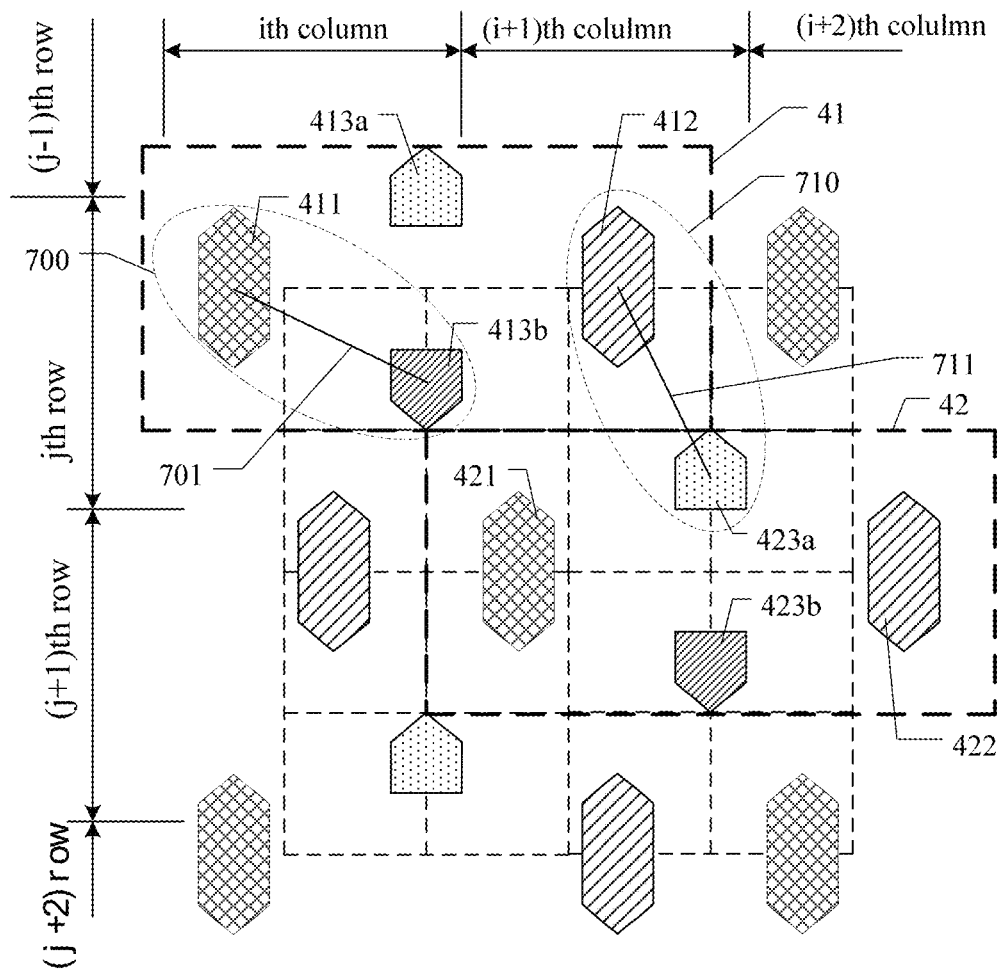
FIG. 16A is a structural diagram illustrating a part of a pixel array in a pixel arrangement structure according to an embodiment of the present disclosure.
Figure 16B:
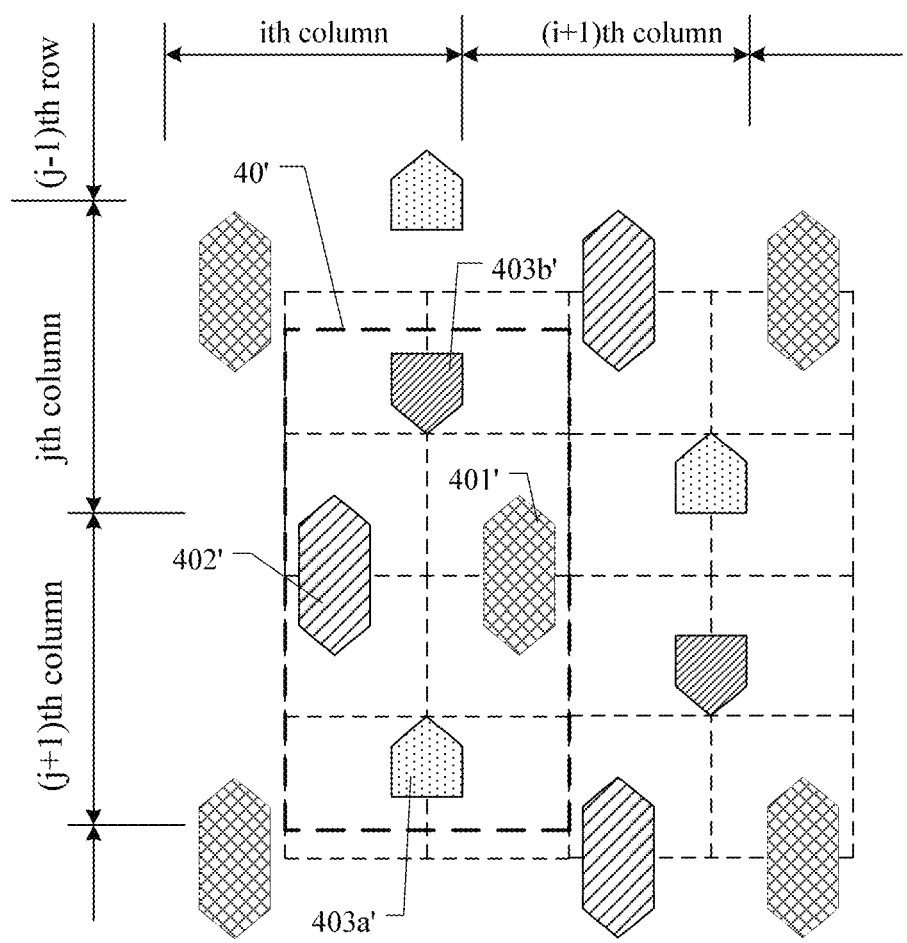
FIG. 16B is a structural diagram illustrating a part of another pixel array in a pixel arrangement structure according to an embodiment of the present disclosure.

FIG. 16A is a structural diagram illustrating a part of a pixel array in a pixel arrangement structure according to an embodiment of the present disclosure; and FIG. 16B is a structural diagram illustrating a part of another pixel array in a pixel arrangement structure according to an embodiment of the present disclosure.

For example, as illustrated in FIG. 16A, a plurality of virtual pixels are arranged in the row direction and the column direction to form a pixel array. If the first sub-pixel (for example, the first sub-pixel 401 as illustrated in FIG. 15B) and a first one of the two third sub-pixels (for example, the third sub-pixel 403b as illustrated in FIG. 15B) in one repeating unit belongs to a virtual pixel of ith column and jth row, the second sub-pixel (for example, the second sub-pixel 402 as illustrated in FIG. 15B) in one repeating unit belongs to a virtual pixel of (i+1)th column and the jth row, and the other one of the two third sub-pixels (for example, the third sub-pixel 403a as illustrated in FIG. 15B) in one repeating unit belongs to a virtual pixel of the ith column and (j−1)th row. That is to say, four sub-pixels in each repeating unit belongs to three virtual pixels.

The positional relationship between the respective sub-pixels in each repeating unit is described by taking the first repeating unit 41 as an example. For example, as illustrated in FIG. 16A, in the first repeating unit 41, the first sub-pixel 411 and the third sub-pixel 413b belong to a virtual pixel of ith column and jth row, the second sub-pixel 412 belongs to a virtual pixel of (i+1)th column and the jth row, and the third sub-pixel 413a belongs to a virtual pixel of the ith column and (j−1)th row. That is to say, in the first repeating unit 41, the first sub-pixel 411, the third sub-pixel 413a and the third sub-pixel 413b are in the same pixel column such as in the ith column, while the second sub-pixel 412 is in the (i+1)th column. The first sub-pixel 411, the second sub-pixel 412, and the third sub-pixel 413b are in the same pixel row such as in the jth row, while the third sub-pixel 413a is in the (j−1)th row.

It should be understood that, in the pixel arrangement structure, the positional relationship in other repeating units is the same as that of the first repeating unit, and repeated portions will be omitted here.

For example, the pixel arrangement structure provided by the embodiments of the present disclosure includes a first type virtual pixel and a second type virtual pixel. As illustrated in FIG. 16A, a first type virtual pixel 700 includes one first sub-pixel 411 and one third sub-pixel 413b, and a second type virtual pixel 710 includes one second sub-pixel 412 and one third sub-pixel 423a. The two sub-pixels in the first type virtual pixel 700 belong to the same repeating unit. For example, the first sub-pixel 411 and the third sub-pixel 413b belong to the first repeating unit 41. However, the two sub-pixels in the second type virtual pixel 710 belong to two different repeating units. The two different repeating units are in adjacent rows. For example, the second sub-pixel 412 is in the first repeating unit 41, while the third sub-pixel 423a is in the second repeating unit 42. For example, in the row direction and the column direction, the third sub-pixels belonging to two adjacent virtual pixels (i.e. adjacent first type virtual pixel and second type virtual pixel) are in different repeating units.

For example, the first type virtual pixels and the second type virtual pixels are alternatively arranged in the row direction, and the first type virtual pixels and the second type virtual pixels are also alternatively arranged in the column direction.

For example, a line 701 passing through centers of two sub-pixels (i.e. the first sub-pixel 411 and the third sub-pixel 413b as illustrated in FIG. 16A) in the first type virtual pixel 700 is not parallel to a line 711 passing through centers of two sub-pixels (i.e. the second sub-pixel 412 and the third sub-pixel 423a as illustrated in FIG. 16A) in the second type virtual pixel 710. The lines passing through centers of two sub-pixels of all the first type virtual pixels are parallel, and the lines passing through centers of two sub-pixels of all the second type virtual pixels are parallel.

For example, in each column, centers of the third sub-pixels of all first type virtual pixels and centers of the third sub-pixels of all second type virtual pixels are situated in the same straight line, centers of the first sub-pixels of all first type virtual pixels are situated in the same straight line, and centers of the second sub-pixels of all second type virtual pixels are situated in the same straight line. In each row, centers of the first sub-pixels of all first type virtual pixels and centers of the second sub-pixels of all second type virtual pixels are situated in the same straight line, centers of the third sub-pixels of all first type virtual pixels are situated in the same straight line, and centers of the third sub-pixels of all second type virtual pixels are situated in the same straight line.

For example, for one repeating unit (e.g., the first repeating unit 41 in FIG. 15A), the driving method includes:

S11: acquiring an actual data signal of the first sub-pixel of the ith column and the jth row according to a theory data signal of a first logical sub-pixel of a first logical pixel of (i−1)th column and the (j−1)th row and a theory data signal of a first logical sub-pixel of a second logical pixel of the (i−1)th column and the jth row;

S12: acquiring an actual data signal of the third sub-pixel of the ith column and the jth row according to a theory data signal of a third logical sub-pixel of a third logical pixel of the ith column and the jth row;

S13: acquiring an actual data signal of the second sub-pixel of the (i+1)th column and the jth row according to a theory data signal of a second logical sub-pixel of a fourth logical pixel of the (i+1)th column and the (j−1)th row and a theory data signal of a second logical sub-pixel of a fifth logical pixel of the (i+1)th column and the jth row; and S14: acquiring an actual data signal of the third sub-pixel of the ith column and the (j−1)th row according to a theory data signal of a third logical sub-pixel of a sixth logical pixel of the ith column and the (j−1)th row.

For example, i is a positive integer greater than or equal to 2, and j is a positive integer greater than or equal to 2.

For example, in the embodiments of the present disclosure, each logical pixel (first logical pixel, second logical pixel, third logical pixel, fourth logical pixel, fifth logical pixel or sixth logical pixel) includes a first logical sub-pixel, a second logical sub-pixel and a third logical sub-pixel. Each logical pixel may independently display various colors in the color space, while each virtual pixel may only display a part of the color in the color space. For example, one virtual pixel cannot display pure white. In the present disclosure, the logical pixel represents the coordinate addressing and the primary color brightness which are set by the image signal system regardless of the physical structure (i.e., the composition of the minimum repeating unit and the repeated distribution manner of the minimum repeating unit in the pixel arrangement structure provided by the present disclosure, etc.) of the display.

For example, the theory data signal of each logical sub-pixel refers to a data signal generated by a data driver. For example, when each logical pixel needs to be displayed, three theory data signals, respectively corresponding to a first logical sub-pixel, a second logical sub-pixel and a third logical sub-pixel of the logical pixel, are generated by the data driver, each of the three theory data signals may correspond to a greyscale value ranging from 0 to 255; therefore, the logical pixel can display a color of white. In the pixel arrangement structure provided by the embodiments of the present disclosure, because each virtual pixel only includes two sub-pixels, the number of the data signals generated by the data driver does not correspond to the number of the sub-pixels in the pixel arrangement structure, the data signals generated by the data driver cannot be transmitted to the virtual pixel. The data signals generated by the data driver (the theory data signals corresponding to respective logical sub-pixels) need to be converted to obtain actual data signals of respective sub-pixels in each virtual pixel by the sub-pixel rendering algorithm provided by the embodiments of the present disclosure. The actual data signals are signals transmitted to respective sub-pixels of each virtual pixel in the pixel arrangement structure by data lines.

It should be understood that, the logical pixels may be in an arrangement of an RGBRGB-stripe type, and the logical pixels are arranged in the row direction and the column direction to form an array. A logical pixel is not an actual pixel, and a sub-pixel in a virtual pixel is a sub-pixel that actually exists in a pixel arrangement structure. For example, the number of logical pixels and the number of virtual pixels are the same, and the logical pixels are in a one-to-one correspondence with the virtual pixels. The logical pixels include sub-pixels of three colors such as red, green, and blue, and the virtual pixels only include sub-pixels of two colors selected from red, green and blue. For example, in some embodiments, a display panel has virtual pixels of h1 row and h2 column, i.e., the number of the virtual pixels is h1×h2, accordingly, the number of the logical pixels in the display panel is also h1×h2, and the logic pixels are arranged of h1 row and h2 column. For example, a virtual pixel of ith column and jth row corresponds to a logical pixel of ith column and jth row. The actual data signal of the virtual pixel is obtained based on the theory data signal of the logical pixel. For example, according to the positional relationship and the display requirement, the actual data signal of the sub-pixel (for example, the red sub-pixel in the virtual pixel) in each virtual pixel is obtained by calculating the theory data signals of the same color logical sub-pixels (e.g., red logical sub-pixels in the logical pixels) of a corresponding logical pixel and some of the logical pixels surrounding the corresponding logical pixel.

For example, in step S11, the actual data signal of the first sub-pixel of the ith column and the jth row is represented as:

$$X_{i,j} = (\alpha_1 \cdot x^\gamma_{i-1,j-1} + \alpha_2 \cdot x^\gamma_{i-1,j})^{\frac{1}{\gamma}} \quad (2.1)$$

wherein $X_{i,j}$ represents the actual data signal of the first sub-pixel of the ith column and the jth row, $x_{i-1,j-1}$ represents the theory data signal of the first logical sub-pixel of the first logical pixel of the (i−1)th column and the (j−1)th row, $x_{i-1,j}$ represents the theory data signal of the first logical sub-pixel of the second logical pixel of the (i−1)th column and the jth row, and α1 and α2 respectively represent weight of $X_{i-1,j}$, $x_{i-1,j}$, and γ is a constant.

For example, α1 and α2 may be the same, and α1 and α2 may both be, for example, 0.5. That is, the actual data signal of the first sub-pixel in the virtual pixel is the average value of the theory data signals of the two first logical sub-pixels of the two logical pixels. However, the present disclosure is not limited thereto, and α1 and α2 may also be different. According to the actual pixel arrangement position, in order to prevent edge color shift, α1 and α2 may also be 0.4 or 0.6 or the like.

For example, in step S12, the actual data signal of the third sub-pixel of the ith column and the jth row is represented as:

$$G_{i,j} = g_{i,j} \quad (2.2)$$

wherein $G_{i,j}$ represents the actual data signal of the third sub-pixel of the ith column and the jth row, $g_{i,j}$ represents the theory data signal of the third logical sub-pixel of the third logical pixel of ith column and the jth row.

For example, in step S13, the actual data signal of the second sub-pixel of the (i+1)th column and the jth row is represented as:

$$Y_{i+1,j} = (\beta_1 \cdot y^\gamma_{i+1,j-1} + \beta_2 \cdot y^\gamma_{i+1,j})^{\frac{1}{\gamma}} \quad (2.3)$$

wherein $Y_{i+1,j}$ represents the actual data signal of the second sub-pixel of the (i+1)th column and the jth row, $y_{i+1,j-1}$ represents the theory data signal of the second logical sub-pixel of the fourth logical pixel of (i+1)th column and the (j−1)th row, and represents the theory data signal of the second logical sub-pixel of the fifth logical pixel of the (i+1)th column and the jth row; β1 and β2 respectively represent weight of and $y_{i+1,j}$, γ is a constant.

For example, β1 and β2 may be the same, and β1 and β2 may both be, for example, 0.5. That is, the actual data signal of the second sub-pixel in the virtual pixel is the average value of the theory data signals of the two second logical sub-pixels of the two logical pixels. However, the present disclosure is not limited thereto, and β1 and β2 may also be different. According to the actual pixel arrangement position, in order to prevent edge color shift, β1 and β2 may also be 0.4 or 0.6 or the like.

For example, in step S14, the actual data signal of the third sub-pixel of the ith column and the (j−1)th row is represented as:

$$G_{i,j-1} = g_{i,j-1} \quad (2.4)$$

wherein $G_{i,j-1}$ represents the actual data signal of the third sub-pixel of the ith column and the (j−1)th row, $g_{i,j-1}$ represents the theory data signal of the third logical sub-pixel of the sixth logical pixel of the ith column and the (j−1)th row.

It should be understood that with regard to the weight coefficients α1, α2, β1 and β2 in the formulas (2.1) and (2.3), in some cases, at a physical edge of a display area of a display device, in some examples, when the first sub-pixel and the second sub-pixel are concentrated on the outer side of the physical edge, in order to prevent edge color shift, the weight of the signal of the sub-pixel (for example, the first sub-pixel or the second sub-pixel) corresponding to the outermost logical sub-pixel may be reduced; therefore, a sum of α1 and α2 in the formula (2.1) may be less than 1, and a sum of β1 and β2 in the formula (2.3) may also be less than 1, the specific values of α1, α2, β1 and β2 are set according to actual conditions, and limitations are not imposed in the present disclosure. In other cases, in the display area of the display device, when the image is displayed, it is also necessary to adjust the weight coefficient to correct color shift when the first sub-pixel and the second sub-pixel are concentrated outside an edge of a display pattern. In still other cases, when a special graphic/pattern is displayed, because it is distorted by interference with sub-pixels in the pixel arrangement structure, it may be also necessary to adjust the weight coefficient to correct color shift. In this case, in order to allow brightness of the graphic/pattern to be not fluctuated greatly, the sum of the weight coefficients α1 and α2 is usually 1, and the sum of the weight coefficients β1 and β2 is also usually 1.

For example, γ refers to a relationship between data signal and display brightness, γ may be 2.2. For example, with regard to virtual pixel, in the case where an actual data signal of the first sub-pixel of ith column and jth row is $X_{i,j}$, a display brightness of the first sub-pixel of the ith row and the jth column is represented as: $L_X = C_X \cdot X_{i,j}^\gamma$, wherein $L_X$ refers to a display brightness of the first sub-pixel of the ith column and the jth row, $C_X$ is determined by physical characteristic of the first sub-pixel of the ith column and the jth row. For example, in the case where an actual data signal of the second sub-pixel of (i+1)th column and jth row is $Y_{i+1,j}$, a display brightness of the second sub-pixel of the (i+1)th column and the jth row is represented as: $L_Y = C_Y \cdot Y_{i+1,j}^\gamma$, wherein $L_Y$ refers to a display brightness of the second sub-pixel of the (i+1)th column and the jth row, $C_Y$ is determined by physical characteristic of the second sub-pixel of (i+1)th column and jth row. Brightness of other pixels may be obtained by analogy. With regard to logical pixel, for example, in the case where a theory data signal of the first logical sub-pixel of the first logical pixel is $x_{i-1,j-1}$, a display brightness of the first logical sub-pixel of the first logical pixel is represented as: $L_x = C_x \cdot x_{i-1,j-1}^\gamma$, wherein $L_x$ refers to a display brightness of the first logical sub-pixel of the first logical pixel, $C_x$ is determined by physical characteristic of the first logical sub-pixel of the first logical pixel. For example, in the case where a theory data signal of the second logical sub-pixel of the fourth logical pixel is $y_{i+1,j-1}$, a display brightness of the second logical sub-pixel of the fourth logical pixel is represented as: $L_y = C_y \cdot y_{i+1,j-1}^\gamma$, wherein $L_y$ refers to a display brightness of the second logical sub-pixel of the fourth logical pixel, $C_y$ is determined by physical characteristic of the second logical sub-pixel of the fourth logical pixel. Brightness of other logical sub-pixels may be obtained by analogy.

It should be understood that in the above formulas (2.1) to (2.4), the subscripts i and j represent pixel addressing coordinates of each sub-pixel (for example, a sub-pixel of a virtual pixel or a logical sub-pixel of a logical pixel).

For example, in the pixel arrangement structure provided by the embodiments of the present disclosure, according to formula (2.1), the actual data signal of the first sub-pixel is determined by theory data signals of the first logical sub-pixels in the first logical pixel and the second logical pixel. The first logical pixel and the second logical pixel are in the same column and in different rows. According to formula (2.3), the actual data signal of the second sub-pixel is determined by the theory data signals of second logical sub-pixels in the fourth logical pixel and the fifth logical pixel. The fourth logical pixel and the fifth logical pixel are in the same column and in different rows. According to formulas (2.2) and (2.4), the actual data signal of the third sub-pixel is determined by the theory data signal of the third logical sub-pixel in a corresponding logical pixel. The third sub-pixels in the arrangement structure are in a one-to-one correspondence with the third logical sub-pixels in the logical pixels.

For example, the repeating unit in the pixel arrangement structure may be determined in different division manners. Unlike the manner in which the repeating units illustrated in FIG. 15A and FIG. 15B are divided, in some embodiments, as illustrated in FIG. 15C, each repeating unit 40' includes one first sub-pixel 401' and one second sub-pixel 402', and two third sub-pixels 403a' and 403b'. The first sub-pixel 401' and the second sub-pixel 402' are arranged in a row direction X. Two third sub-pixels (i.e., the third sub-pixel 403a' and the third sub-pixel 403b') are arranged in a column direction Y. In the row direction X, the first sub-pixel 401' and the second sub-pixel 402' are between the two third sub-pixels 403a' and 403b'. In each repeating unit 40', a length of a line connecting a center of the first sub-pixel 401' with a center of the second sub-pixel 402' is less than that of a line connecting a center of the third sub-pixel 403a' with a center of the third sub-pixel 403b'. The line connecting the center of the first sub-pixel 401' with the center of the second sub-pixel 402' and the line connecting the center of the third sub-pixel 403a' with the center of the third sub-pixel 403b' are perpendicular to each other and equally halved by each other.

For example, in the repeating unit illustrated in FIG. 15C, as illustrated in FIG. 16B, if the third sub-pixel 403b' in the repeating unit 40' belongs to a virtual pixel of ith column and jth row, the first sub-pixel 401' in the repeating unit 40' belongs to a virtual pixel of (i+1)th column and (j+1)th row, the second sub-pixel 402' in the repeating unit 40' belongs to a virtual pixel of the ith column and the (j+1)th row, and the third sub-pixel 403a' in the repeating unit 40' belongs to the virtual pixel of the ith column and the (j+1)th row.

In the example illustrated in FIG. 15C and FIG. 16B, in the repeating unit 40', an actual data signal of the third sub-pixel 403b' of the ith column and the jth row is represented as:

$$G_{i,j} = g_{i,j}$$

wherein $G_{i,j}$ represents the actual data signal of the third sub-pixel 403b' of the ith column and the jth row, $g_{i,j}$ represents a theory data signal of a third logical sub-pixel of the logical pixel of the ith column and the jth row;

An actual data signal of the first sub-pixel 401' of the (i+1)th column and the (j+1)th row is represented as:

$$X_{i+1,j+1} = (\alpha_1 \cdot x_{i,j}^\gamma + \alpha_2 \cdot x_{i,j+1}^\gamma)^{\frac{1}{\gamma}}$$

wherein $X_{i+1,j+1}$ represents the actual data signal of the first sub-pixel 401' of the (i+1)th column and the (j+1)th row, $x_{i,j}$ represents a theory data signal of the first logical sub-pixel of the logical pixel of the ith column and the jth row, $x_{i,j+1}$ represents a theory data signal of a first logical sub-pixel of the logical pixel of the ith column and the (j+1)th row.

An actual data signal of the second sub-pixel 402' of the ith column and the (j+1)th row is represented as:

$$Y_{i,j+1} = (\beta_1 \cdot y_{i,j}^\gamma + \beta_2 \cdot y_{i,j+1}^\gamma)^{\frac{1}{\gamma}}$$

wherein $Y_{i,j+1}$ represents the actual data signal of the second sub-pixel 402' of the ith column and the (j+1)th row, $y_{i,j}$ represents a theory data signal of the second logical sub-pixel of the logical pixel of the ith column and the jth row, and $y_{i,j+1}$ represents a theory data signal of a second logical sub-pixel of the logical pixel of the ith column and the (j+1)th row.

An actual data signal of the third sub-pixel 403a' of the ith column and the (j+1)th row is represented as:

$$G_{i,j+1} = g_{i,j+1}$$

wherein $G_{i,j+1}$ represents the actual data signal of the third sub-pixel 403a' of the ith column and the (j+1)th row, $g_{i,j+1}$ represents a theory data signal of a third logical sub-pixel of the logical pixel of the ith column and the (j+1)th row.

In summary, according to the division manner of the repeating unit illustrated in FIG. 15C, the actual data signals of the four sub-pixels in each repeating unit need only to be calculated from the theory data signals of the two logical pixels.

Figure 17A:
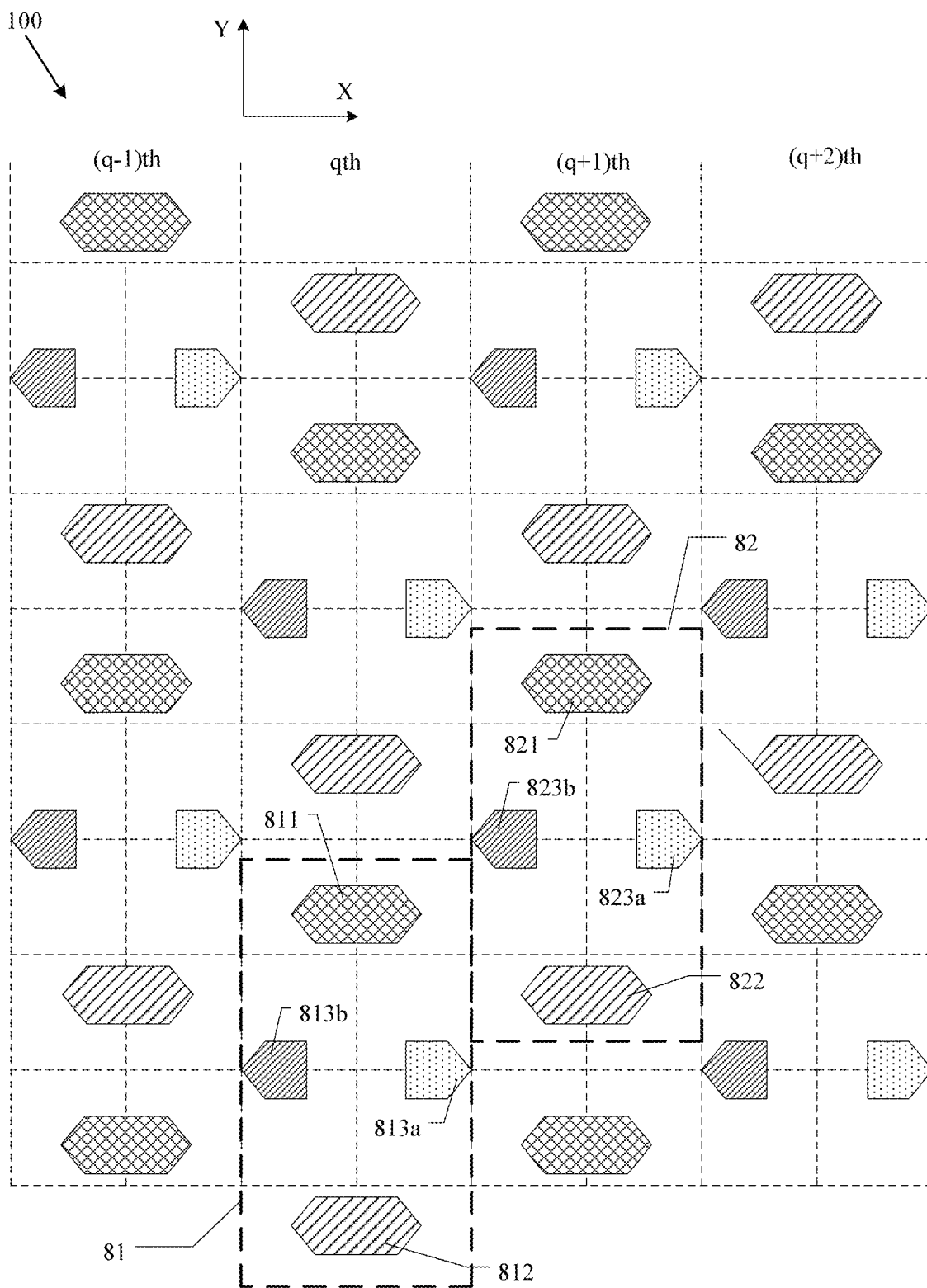
FIG. 17A is a structural diagram illustrating a part of a pixel arrangement structure according to another embodiment of the present disclosure.
Figure 17B:
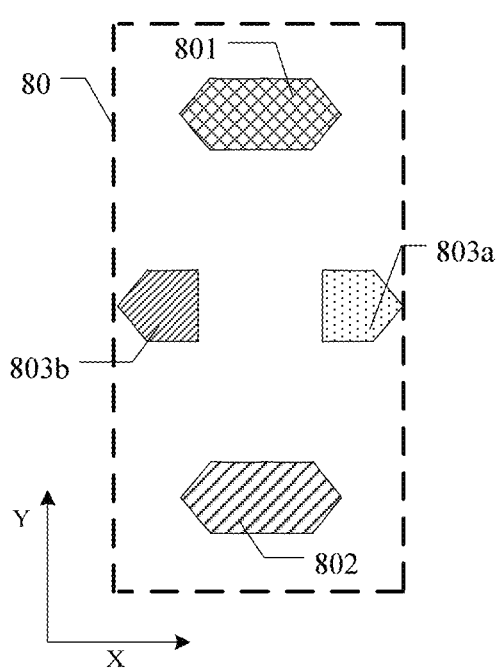
FIG. 17B is a structural diagram illustrating a repeating unit in a pixel arrangement structure according to another embodiment of the present disclosure.

FIG. 17A is a structural diagram illustrating a part of a pixel arrangement structure according to another embodiment of the present disclosure, and FIG. 17B is a structural diagram illustrating a repeating unit in a pixel arrangement structure according to another embodiment of the present disclosure.

For example, as illustrated in FIG. 17A and FIG. 17B, a pixel arrangement structure 200 provided by embodiments of the present disclosure includes a plurality of repeating units 80. The plurality of repeating units 80 are arranged in column direction Y to form a plurality of repeating unit groups. FIG. 17A illustrates four repeating unit groups. The four repeating unit groups are a (q−1)th repeating unit group, a qth repeating unit group, a (q+1)th repeating unit group, and a (q+2)th repeating unit group. For example, q is a positive integer greater than or equal to 2. The plurality of repeating unit groups are arranged in row direction X. That is, the plurality of repeating units 80 are arranged in the row direction X and the column direction Y to form an array.

For example, the row direction X is not parallel to the column direction Y.

For example, as illustrated in FIG. 17B, each repeating unit 80 includes one first sub-pixel 801, one second sub-pixel 802, and two third sub-pixels 803a and 803b.

For example, the plurality of sub-pixels in the pixel arrangement structure 200 form a plurality of virtual pixels arranged in an array. Each of a part of virtual pixels includes one first sub-pixel and one third sub-pixel, or each of the other part of virtual pixels includes one second sub-pixel and one third sub-pixel. For example, as illustrated in FIG. 17A, the qth repeating unit group includes a fifth repeating unit 81, the (q+1)th repeating unit group includes a sixth repeating unit 82. A first sub-pixel 821 and a third sub-pixel 823b which are in the sixth repeating unit 82 form a virtual pixel. A second sub-pixel 822 in the sixth repeating unit 82 and a third sub-pixel 813a in the fifth repeating unit 81 form a virtual pixel.

Figure 18:
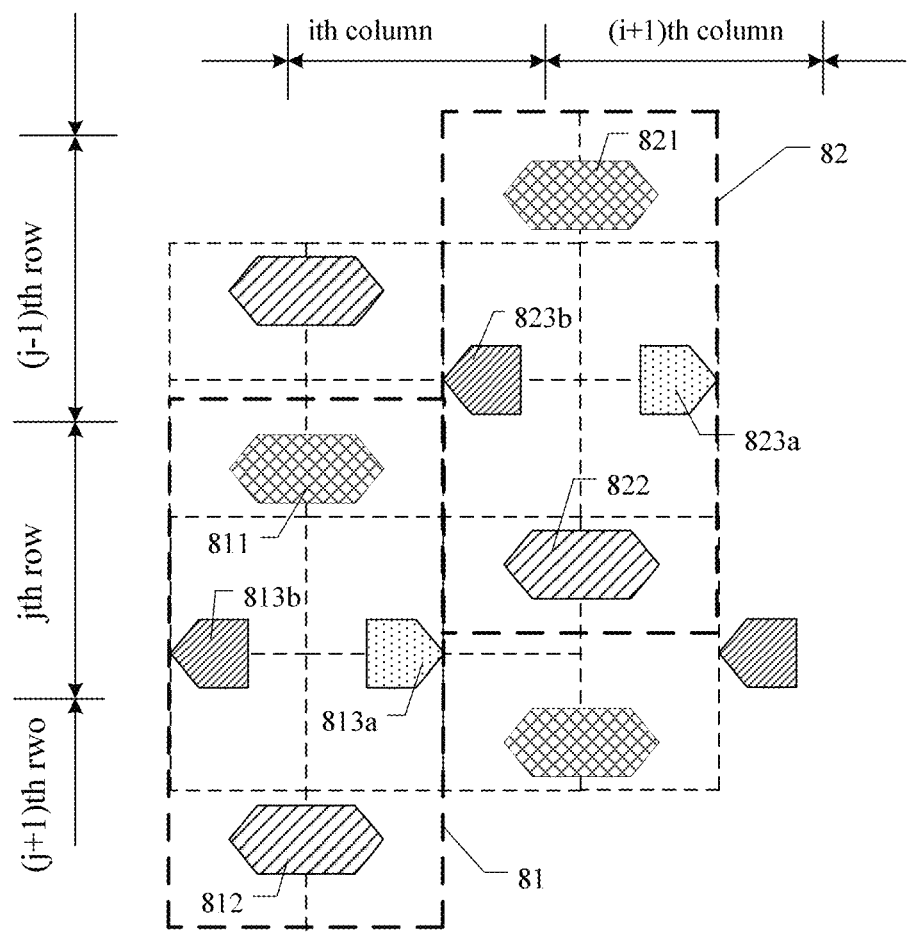
FIG. 18 is a structural diagram illustrating a part of a pixel array in a pixel arrangement structure according to an embodiment of the present disclosure.

FIG. 18 is a structural diagram illustrating a part of a pixel array in a pixel arrangement structure according to an embodiment of the present disclosure. For example, as illustrated in FIG. 18, a plurality of virtual pixels are arranged in the row direction X and the column direction Y to form a pixel array. If the first sub-pixel and a first one of the two third sub-pixels in one repeating unit belong to a virtual pixel of ith column and jth row, the second sub-pixel in the repeating unit belongs to a virtual pixel of ith column and the (j+1)th row, and the other one of the two third sub-pixels in the repeating unit belongs to a virtual pixel of the (i−1)th column and jth row. The positional relationship of the sub-pixels in the repeating unit is described by taking the fifth repeating unit 81 as an example. For example, as illustrated in FIG. 18, in the fifth repeating unit 81, the first sub-pixel 811 and the third sub-pixel 813a belong to a virtual pixel of the ith column and the jth row, the second sub-pixel 812 belongs to a virtual pixel of the ith column and the (j+1)th row, and the third sub-pixel 813b belongs to a virtual pixel of the (i−1)th column and the jth row. That is, in the fifth repeating unit 81, the first sub-pixel 811, the third sub-pixel 813a, and the third sub-pixel 813b are in the same pixel row such as in the jth row, while the second sub-pixel 812 is in the (j+1)th row; the first sub-pixel 811, the second sub-pixel 812 and the third sub-pixel 813a are in the same pixel column such as in the ith column, while the third sub-pixel 813b is in the (i−1)th column.

It should be understood that in the pixel arrangement structure, positional relationship between sub-pixels in other repeating units is the same as the repeating unit as described above, repeated portions will be omitted here. The pixel arrangement structure illustrated in FIG. 17A is obtained, for example, by rotating the entire pixel arrangement structure illustrated in FIG. 15A clockwise by 90 degrees. In case of no conflict, the related description about the pixel arrangement structure of FIG. 15A is also applied to the pixel arrangement structure illustrated in FIG. 17A.

For example, for a repeating unit (e.g, the fifth repeating unit 81 in FIG. 17), as illustrated in FIG. 10, the driving method includes:

S21: acquiring an actual data signal of the first sub-pixel of the ith column and the jth row according to a theory data signal of a first logical sub-pixel of a first logical pixel of (i−1)th column and the (j−1)th row and a theory data signal of a first logical sub-pixel of a second logical pixel of the ith column and the (j−1)th row;

S22: acquiring an actual data signal of the third sub-pixel of the ith column and the jth row according to a theory data signal of a third logical sub-pixel of a third logical pixel of the ith column and the jth row;

S23: acquiring an actual data signal of the second sub-pixel of the ith column and the (j+1)th row according to a theory data signal of a second logical sub-pixel of a fourth logical pixel of the (i−1)th column and (j+1)th row and a theory data signal of a second logical sub-pixel of a fifth logical pixel of the ith column and the (j+1)th row; and S24: acquiring an actual data signal of the third sub-pixel of the (i−1)th column and the jth row according to a theory data signal of a third logical sub-pixel of a sixth logical pixel of the (i−1)th column and the jth row.

For example, i is a positive integer greater than or equal to 2, and j is a positive integer greater than or equal to 2.

For example, in step S21, the actual data signal of the first sub-pixel of the ith column and the jth row is represented as:

$$X_{i,j} = (\alpha_1 \cdot x_{i-1,j-1}^\gamma + \alpha_2 \cdot x_{i,j-1}^\gamma)^{\frac{1}{\gamma}} \quad (3.1)$$

wherein $X_{i,j}$ represents the actual data signal of the first sub-pixel of the ith column and the jth row, $x_{i-1,j-1}$ represents the theory data signal of the first logical sub-pixel of the first logical pixel of the (i−1)th column and the (j−1)th row, $x_{i,j-1}$ represents the theory data signal of the first logical sub-pixel of the second logical pixel of the ith column and the (j−1)th row, and α1 and α2 respectively represent weight of $x_{i-1,j-1}$ and $x_{i,j-1}$, γ is a constant.

For example, α1 and α2 may be the same, and α1 and α2 may both be, for example, 0.5. That is, the actual data signal of the first sub-pixel in the virtual pixel is the average value of the theory data signals of the two first logical sub-pixels of the two logical pixels. However, the present disclosure is not limited thereto, and α1 and α2 may also be different.

For example, in step S22, the actual data signal of the third sub-pixel of the ith column and the jth row is represented as:

$$G_{i,j} = g_{i,j} \quad (3.2)$$

wherein $G_{i,j}$ represents the actual data signal of the third sub-pixel of the ith column and the jth row, $g_{i,j}$ represents the theory data signal of the third logical sub-pixel of the third logical pixel of ith column and the jth row;

For example, in step S23, the actual data signal of the second sub-pixel of the ith column and the (j+1)th row is represented as:

$$Y_{i,j+1} = (\beta_1 \cdot y_{i-1,j+1}^\gamma + \beta_2 \cdot y_{i,j+1}^\gamma)^{\frac{1}{\gamma}} \quad \text{formula (3.3)}$$

wherein $Y_{i,j+1}$ represents the actual data signal of the second sub-pixel of the ith column and the (j+1)th row, $y_{i-1,j+1}$ represents the theory data signal of the second logical sub-pixel of the fourth logical pixel of (i−1)th column and the (j+1)th row, and $y_{i,j+1}$ represents the theory data signal of the second logical sub-pixel of the fifth logical pixel of the ith column and the (j+1)th row; β1 and β2 respectively represent weight of $y_{i-1,j+1}$ and $y_{i,j+1}$, γ is a constant.

For example, β1 and β2 may be the same, and β1 and β2 may both be, for example, 0.5. That is, the actual data signal of the second sub-pixel in the virtual pixel is the average value of the theory data signals of the two second logical sub-pixels of the two logical pixels. However, the present disclosure is not limited thereto, and β1 and β2 may also be different.

For example, in step S24, the actual data signal of the third sub-pixel of the (i−1)th column and the jth row is represented as:

$$G_{i-1,j} = g_{i-1,j}$$

wherein $G_{i-1,j}$ represents the actual data signal of the third sub-pixel of the (i−1)th column and the jth row, $g_{i-1,j}$ represents the theory data signal of the third logical sub-pixel of the sixth logical pixel of the (i−1)th column and the jth row.

For example, γ refers to a relationship between data signal and display brightness, γ may be 2.2.

Figure 19A:
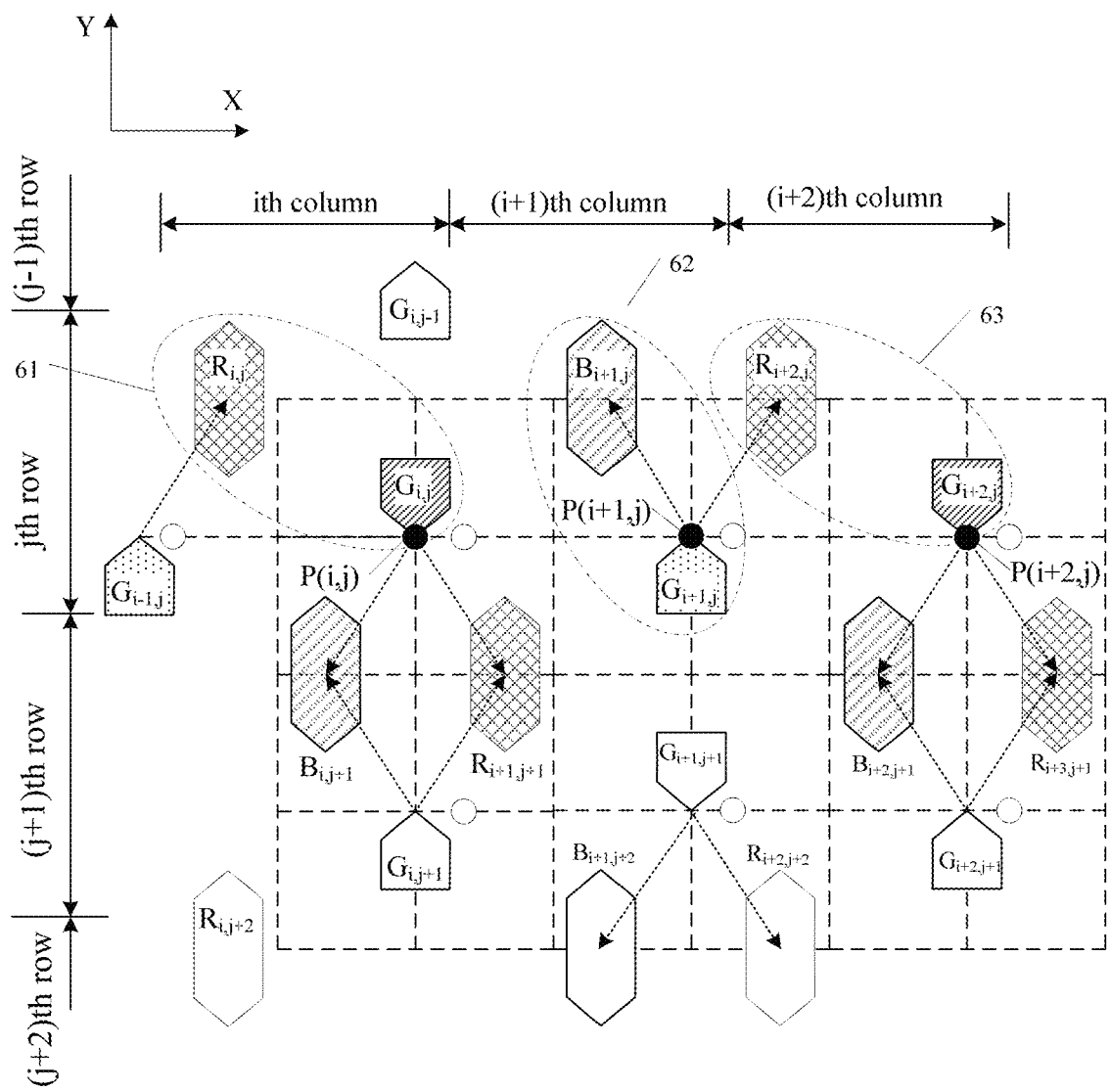
FIG. 19A is a diagram illustrating driving a pixel arrangement structure to display a white horizontal line by a driving method according to an embodiment of the present disclosure.
Figure 19B:
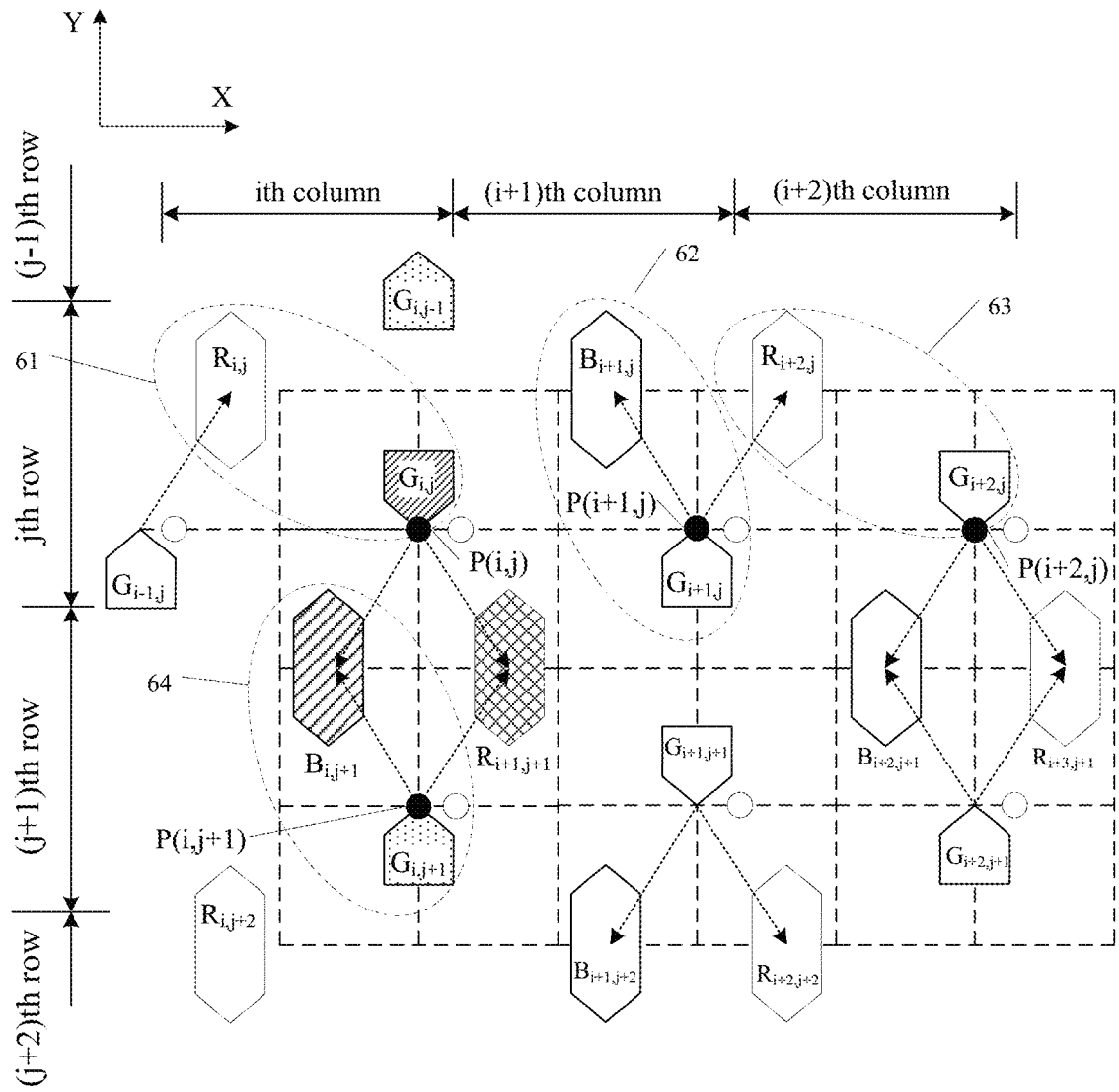
FIG. 19B is a diagram illustrating driving a pixel arrangement structure to display a white vertical line by a driving method according to an embodiment of the present disclosure.

FIG. 19A is a diagram illustrating driving pixel arrangement structure to display a white horizontal line by a driving method according to an embodiment of the present disclosure, and FIG. 19B is a diagram illustrating driving pixel arrangement structure to display a white vertical line by a driving method according to an embodiment of the present disclosure.

For example, when driving sub-pixels in the pixel arrangement structure to display a white horizontal line by a driving method according to an embodiment of the present disclosure, that is, the actual data signals of the sub-pixels are calculated according to formulas (2.1) to (2.4), as illustrated in FIG. 19A, if the jth row displays white, all sub-pixels in the jth row are illuminated. That is, the first virtual pixel 61, the second virtual pixel 62 and the third virtual pixel 63 are all illuminated, and the first sub-pixels of the (j+1)th row and the second sub-pixels of the (j+1)th row are all illuminated. In other words, the second sub-pixel $B_{i,j+1}$ of the ith column and the (j+1)th row, the first sub-pixel $R_{i+1,j+1}$ of the (i+1)th column and the (j+1)th row, the second sub-pixel $B_{i+2,j+1}$ of the (i+2)th column and the (j+1)th row, the first sub-pixel $R_{i+3,j+1}$ of the (i+3)th column and the (j+1)th row are all illuminated. In the jth row, brightness of each first sub-pixel and brightness of each second sub-pixel are both 50% of the maximum brightness (for example, the sub-pixel has a greyscale value of 128), brightness of each third sub-pixels is 100% of the maximum brightness (for example, the sub-pixel has a greyscale value of 255). In the (j+1)th row, brightness of each first sub-pixel and brightness of each second sub-pixel are both 50% of the maximum brightness. That is, each of the second sub-pixel $B_{i,j+1}$, the first sub-pixel $R_{i+1,j+1}$, the second sub-pixel $B_{i+2,j+1}$ and the first sub-pixel $R_{i+3,j+1}$ has a brightness of 50% of the maximum brightness. Thus, in the display panel, the jth row displays white, that is, displays a white horizontal line.

It should be noted that, FIG. 19A also illustrates the third sub-pixel $G_{i-1,j}$ of the (i−1)th column and the jth row, when the jth row display white, the third sub-pixel $G_{i-1,j}$ is also illuminated, and has a brightness of 100% of the maximum brightness.

For example, when driving sub-pixels in the pixel arrangement structure to display a white vertical line by a driving method according to an embodiment of the present disclosure, that is, the actual data signals of the sub-pixels are calculated according to formulas (2.1) to (2.4), as illustrated in FIG. 19B, if the ith column display white, all the second sub-pixels of the ith column and all the third sub-pixels of the ith column are illuminated, and all the first sub-pixels of the (i+1)th column are illuminated. In other words, the third sub-pixel $G_{i,j}$ in the first virtual pixel 61, the second sub-pixel $B_{i,j+1}$ and the third sub-pixel $G_{i,j+1}$ which are in the fourth virtual pixel 64 are illuminated, and the third sub-pixel $G_{i,j-1}$ of the ith column and the (j−1) row and the first sub-pixel $R_{i+1,j+1}$ of the (i+1)th column and the (j+1) row are illuminated. Each second sub-pixel of the ith column and each third sub-pixel of the ith column both have a brightness of 100% of the maximum brightness (for example, the sub-pixel has a greyscale value of 255). Each first sub-pixel of the (i+1)th column has a brightness of 100% of the maximum brightness. That is, each of the third sub-pixel $G_{i,j}$ in the first virtual pixel 61, the second sub-pixel $B_{i,j+1}$ in the fourth virtual pixel 64, the third sub-pixel $G_{i,j+1}$ in the fourth virtual pixel 64, the third sub-pixel $G_{i,j-1}$ of the ith column and (j−1)th row, and the first sub-pixel $R_{i+1,j+1}$ of the (i+1)th column and (j+1)th row has a brightness of 100%. Thus, in the display panel, the ith column displays white, that is, displays a white vertical line.

It should be noted that, when the ith column displays white, all the first sub-pixels of the ith column are not illuminated.

For example, as illustrated in FIG. 19A and FIG. 19B, a circle between the first sub-pixel and the third sub-pixel represents a luminance center of the virtual pixel. P(i,j) (illustrated as a black dot in FIG. 19A) represents a luminance center of the logical pixel of the ith column and the jth row, P(i+1,j) (illustrated as a black dot in FIG. 19A) represents a luminance center of the logical pixel of the (i+1)th column and the jth row, P(i+2,j) (illustrated as a black dot in FIG. 19A) represents a luminance center of the logical pixel of the (i+2)th column and the jth row, P(i,j+1) (illustrated as a black dot in FIG. 19A) represents a luminance center of the logical pixel of the ith column and the (j+1)th row.

Referring to the formulas (2.1-2.3), because the theory data signals of the logical pixel of the ith column and the jth row are distributed to the third sub-pixel $G_{i,j}$ in the first virtual pixel 61, the second sub-pixel $B_{i,j+1}$ of the ith column and the (j+1)th row, the first sub-pixel $R_{i+1,j+1}$, of the (i+1)th column and the (j+1)th row, when the third sub-pixel $G_{i,j}$, the second sub-pixel $B_{i,j+1}$, and the first sub-pixel $R_{i,j+1}$, display, a brightness center is located between the third sub-pixel $G_{i,j}$ in the first virtual pixel 61 and the first sub-pixel $R_{i+1,j+1}$.

Similarly, because the theory data signals of the logical pixel of the (i+1)th column and the jth row are distributed to the second sub-pixel $B_{i+1,j}$ in the second virtual pixel 62, the third sub-pixel $G_{i+1,j}$ in the second virtual pixel 62, and the first sub-pixel $R_{i+2,j}$ of the (i+2)th column and the jth row, when the first sub-pixel $R_{i+2,j}$, the second sub-pixel $B_{i+1,j}$, and the third sub-pixel $G_{i+1,j}$ display, a brightness center is between the third sub-pixel $G_{i+1,j}$ in the second virtual pixel 62 and the first sub-pixel $R_{i+2,j}$.

Similarly, because the theory data signals of the logical pixel of the (i+2)th column and the jth row are distributed to the third sub-pixel $G_{i+2,j}$ in the third virtual pixel 63, the second sub-pixel $B_{i+2,j+1}$ of the (i+2)th column and the (j+1)th row, the first sub-pixel $R_{i+3,j+1}$ of the (i+3)th column and the (j+1)th row, when the first sub-pixel $R_{i+3,j+1}$, the second sub-pixel $B_{i+2,j+1}$, and the third sub-pixel $G_{i+2,j}$ display, a brightness center is between the third sub-pixel $G_{i+2,j}$ in the third virtual pixel 63 and the first sub-pixel $R_{i+3,j+1}$ of the (i+3)th column and the (j+1)th row.

Similarly, because the theory data signals of the logical pixel of the ith column and the (j+1)row are distributed to the second sub-pixel $B_{i,j+1}$ in the fourth virtual pixel 64, the third sub-pixel $G_{i,j+1}$ in the fourth virtual pixel 64, and the first sub-pixel $R_{i+1,j+1}$ of the (i+1)th column and the (j+1)th row, when the first sub-pixel $R_{i+1,j+1}$, the second sub-pixel $B_{i,j+1}$, and the third sub-pixel $G_{i,j+1}$ display, a brightness center is between the third sub-pixel $G_{i,j+1}$ in the fourth virtual pixel 64 and the first sub-pixel $R_{i+1,j+1}$ of the (i+1)th column and (j+1)th row.

As illustrated in FIG. 19A, when a white horizontal line is displayed, in the row direction X, brightness centers of all the virtual pixels of the j row are in the same straight line. As illustrated in FIG. 19B, when a white vertical line is displayed, in the column direction Y, brightness centers of all the virtual pixels of the ith column are in the same straight line.

It should be understood that, in FIG. 19A and FIG. 19B, no data signal is applied to each of the sub-pixels represented with white pattern without shadow, that is, each of the sub-pixels represented with white pattern without shadow does not emit light. In addition, the dotted line with an arrow in FIG. 19A and FIG. 19B indicates sub-pixel addressing.

Descriptions are given to how the driving method described in FIG. 16A and FIG. 16B according to the embodiments of the present disclosure allows brightness centers of the virtual pixels to be situated in a straight line when displaying a white horizontal line or a white vertical line by referring to FIGS. 19A and 19B. Similarly, the driving method illustrated in FIG. 17A and FIG. 17B can also allow brightness centers of the virtual pixels to be situated in a straight line when displaying a white horizontal line or a white vertical line, which is not repeated herein.

In addition, as mentioned above, when the first sub-pixel and the second sub-pixel are concentrated on the outer side of the physical edge, in order to prevent edge color shift, the weight coefficients α1, α2, β1 and β2 can be adjusted. However, the embodiments of the disclosure are not limited thereto. For example, the "physical edge" refers to the physical edge of the display region, and it is included inside the display region. However, the physical edge does not necessarily means there is no pixel structure at the outer side of the physical edge. For example, in manufacturing process, some pixel rows or columns may be fabricated in a region beyond the display region so as to avoid the outermost pixels influence the normal displaying, but these pixels outside the display region may not be used for displaying.

With regard to the pixel arrangement structure provided by the embodiments of the present disclosure, for example, only red sub-pixels and blue sub-pixels exist or only green sub-pixels exist at an outermost edge of the sub-pixel rows. For example, at a boundary of a display image, the red sub-pixels and blue sub-pixels at the outermost edge of a sub-pixel row (column) is protruded outwards with respect to an adjacent row (column) of green sub-pixels at the inner side; therefore, the centers of the red sub-pixels and the centers of the blue sub-pixels are prominent, causing color shift (displaying a purplish color) at a boundary of the display image. At the other side of the boundary of the display image, the outermost green sub-pixel row (column) is protruded outwards with respect to the red and blue sub-pixel row (column) adjacent thereto; therefore, the centers of the green sub-pixels are prominent, causing color shift (displaying a greenish color) at a boundary of the display image. For example, the phenomenon of boundary color shift can be reduced or eliminated by a method of color compensation. Herein, the "boundary of display image" can be a physical edge of a display region, or can be a boundary of an image displayed on a screen. For example, the method of color compensation can be used in a pixel arrangement structure including a plurality of first color sub-pixels, a plurality of second color sub-pixels, and a plurality of third color sub-pixels, the first color sub-pixel and the second color sub-pixels being located in the same row, and the third color sub-pixels which constitutes pixels with at least a portion of the first color sub-pixels and the second color sub-pixels being located in another row. The method of color compensation includes a molding phase. The molding phase includes: acquiring a color shift brightness of a first sub-pixel group at a boundary of a display image in the display panel when being input different grayscales and color shift occurring; acquiring a first initial greyscale of the first sub-pixel group; compensating the color shift brightness to obtain a compensated brightness; acquiring a compensated greyscale corresponding to the compensated brightness; and establishing a correspondence between the first initial grayscale and the compensated grayscale. The color compensation method can correct the color shift at boundary of the display image of the pixel arrangement structure in real time, thereby improving the phenomenon that the boundary of the display image is greenish or purplish.

What are described above is related to the illustrative embodiments of the disclosure only and not limitative to the scope of the disclosure; the scope of the disclosure are defined by the accompany drawings.

What is claimed is:

1. A pixel arrangement structure, comprising a plurality of repeating units, wherein
    each of the plurality of repeating units comprises one first sub-pixel, one second sub-pixel, and two third sub-pixels;
    in each of the plurality of repeating units, the two third sub-pixels are arranged in one of a first direction and a second direction, and the first sub-pixel and the second sub-pixel are arranged in the other one of the first direction and the second direction;
    the plurality of repeating units are arranged in the first direction to form a plurality of repeating unit groups, the plurality of repeating unit groups are arranged in the second direction; and
    the first direction and the second direction are different directions,
    wherein adjacent ones of the plurality of repeating unit groups are shifted from each other in the first direction.

2. The pixel arrangement structure according to claim 1, wherein the first direction and the second direction are respectively two directions which are substantially perpendicular to each other in a same plane.

3. The pixel arrangement structure according to claim 1, wherein the two third sub-pixels are arranged in the second direction, and the first sub-pixel and the second sub-pixel are arranged in the first direction.

4. The pixel arrangement structure according to claim 3, wherein two lines passing through centers of the first sub-pixel and the second sub-pixel in two adjacent ones of the plurality of repeating unit groups have a distance of L therebetween, and a line passing through centers of the first sub-pixel and the second sub-pixel in any one of the plurality of repeating unit groups and a center of the third sub-pixel in an adjacent one of the plurality of repeating unit groups have a minimum distance of about ½ L-¾ L therebetween.

5. The pixel arrangement structure according to claim 4, wherein, in each of the plurality of repeating units, centers of the two third sub-pixels have a distance of about ½ L-1 L therebetween.

6. The pixel arrangement structure according to claim 3, wherein, in each of the plurality of repeating units, adjacent edges of the two third sub-pixels have a distance greater than 12 micrometers.

7. The pixel arrangement structure according to claim 4, wherein a pitch of each of the plurality of repeating units in the first direction is about 2 L.

8. The pixel arrangement structure according to claim 4, wherein the first sub-pixel comprises two portions separated by a center line of the first sub-pixel in the first direction, and centers of the two portions have a distance less than 0.3 L therebetween.

9. The pixel arrangement structure according to claim 3, wherein each of the first sub-pixel and the second sub-pixel is asymmetric with respect to a straight line passing through a center thereof in a second direction.

10. The pixel arrangement structure according to claim 4, wherein each of the first sub-pixel and the second sub-pixel substantially has an elongated shape or an elliptical shape extending in the second direction.

11. The pixel arrangement structure according to claim 10, wherein a ratio of a size of the first sub-pixel or the second sub-pixel in the second direction to a size of the first sub-pixel or the second sub-pixel in the first direction is σ, and σ>1.

12. The pixel arrangement structure according to claim 11, wherein the first sub-pixel is a red sub-pixel, the second sub-pixel is a blue sub-pixel, and the ratio σ of the first sub-pixel is greater than the ratio σ of the second sub-pixel.

13. The pixel arrangement structure according to 12, wherein, the size of the first sub-pixel in the second direction is less than 0.6 L.

14. The pixel arrangement structure according to claim 3, wherein a minimum distance between one third sub-pixel of any one of the plurality of repeating unit groups and an adjacent first sub-pixel of an adjacent one of the plurality of repeating unit groups is a first distance, a minimum distance between one third sub-pixel in any one of the plurality of repeating unit groups and an adjacent second sub-pixel of an adjacent one of the plurality of repeating unit groups is a second distance, the first distance is substantially the same as the second distance.

15. The pixel arrangement structure according to claim 14, wherein a minimum distance between one first sub-pixel of any one of the plurality of repeating unit groups and an adjacent second sub-pixel of an adjacent one of the plurality of repeating unit groups is a third distance, the third distance is substantially the same as the first distance.

16. The pixel arrangement structure according to claim 3, wherein the first direction and a horizontal direction or a vertical direction have an angle of about 40°-50° therebetween.

17. The pixel arrangement structure according to claim 3, wherein, in each of the plurality of repeating units, the first sub-pixel and the second sub-pixel are respectively located at two sides of the two third sub-pixels, a line segment connecting centers of the first sub-pixel and the second sub-pixel is a first line segment, a line segment connecting centers of the two third sub-pixels is a second line segment, a length ratio of the second line segment to the first line segment is less than or equal to ¾.

18. The pixel arrangement structure according to claim 17, wherein the second line segment and the first line segment are substantially perpendicular to each other and equally halved by each other.

19. The pixel arrangement structure according to claim 1, wherein the two third sub-pixels are arranged in the first direction, a center line extending in the second direction of the first sub-pixel or the second sub-pixel located in one of two adjacent ones of the plurality of repeating unit groups is located between two adjacent third sub-pixels in the other one of the two adjacent repeating unit groups;
or, the two third sub-pixels are arranged in the second direction, a center line extending in the second direction of the third sub-pixel located in one of two adjacent ones of the plurality of repeating unit groups is located between the first sub-pixel and the second sub-pixel which are adjacent to each other in other one of the two adjacent repeating unit groups.

20. The pixel arrangement structure according to claim 1, wherein the two third sub-pixels in a same one of the plurality of repeating units are arranged in the second direction, a range in which the two third sub-pixels extend in the first direction is not beyond a maximum range between two edges away from each other in the first direction of one first sub-pixel and one second sub-pixel, which are adjacent to one of the two third sub-pixels in the second direction;
or, the two third sub-pixels in a same one of the plurality of repeating units are arranged in the first direction, a range in which the two third sub-pixels extend in the second direction is not beyond a maximum range between two edges away from each other in the second direction of one first sub-pixel and one second sub-pixel, which are adjacent to one of the two third sub-pixels in the first direction.

21. The pixel arrangement structure according to claim 1, wherein one first sub-pixel and one third sub-pixel which are adjacent to each other form a virtual pixel, one second sub-pixel and one third sub-pixel which are adjacent to each other form a virtual pixel.

22. The pixel arrangement structure according to claim 1, wherein the two third sub-pixels are arranged in the first direction, in the first direction, the first sub-pixel and the second sub-pixel are located between the two third sub-pixels; four sub-pixels in each of the plurality of repeating units form two virtual pixels, one of the two third sub-pixels and the first sub-pixel form one of the two virtual pixels, the other one of the two third sub-pixels and the second sub-pixel form other one of the two virtual pixels;
or, the two third sub-pixels are arranged in the second direction, in the first direction, the two third sub-pixels are located between the first sub-pixel and the second sub-pixel; four sub-pixels in each of the plurality of repeating units form two virtual pixels, one of the two third sub-pixels and the first sub-pixel form one of the two virtual pixels, and the other one of the two third sub-pixels and the second sub-pixel form other one of the two virtual pixels.

23. The pixel arrangement structure according to claim 3, wherein the first direction is a row direction, the second direction is a column direction, the first sub-pixel of one of the plurality of repeating units in a repeating unit group of a xth row and one of the third sub-pixels of the one of the plurality of repeating units close to a repeating unit group of a (x+1)th row form a virtual pixel, the second sub-pixel of the one of the plurality of repeating units and one of the third sub-pixels in a repeating unit group of a (x+1)th row which is adjacent to the second sub-pixel form a virtual pixel;
or, the first direction is a column direction, the second direction is a row direction, the first sub-pixel of one of the plurality of repeating units in a repeating unit group of a xth column and one of the third sub-pixels of the one of the plurality of repeating units close to a repeating unit group of a (x+1)th column form a virtual pixel, the second sub-pixel in the one of the plurality of repeating units and one of the third sub-pixels in a repeating unit group of a (x+1)th column which is adjacent to the second sub-pixel form a virtual pixel,
wherein x is a positive integer.

24. The pixel arrangement structure according to claim 1, wherein, the sub-pixels have a density in the first direction 1.5 times of that of the pixels, the sub-pixels have a density in the second direction 1.5 times of that of the pixels,
wherein each of the plurality of repeating units comprises three columns of sub-pixels, or two columns of pixels, or each of the repeating units comprises three rows of sub-pixels, or two rows of pixels.

25. The pixel arrangement structure according to claim 1, wherein the first sub-pixel and the second sub-pixel both have a trapezoidal shape, two bases of the first sub-pixel and the second sub-pixel are opposite to each other;

each of the two third sub-pixel has a pentagon shape, the pentagon shape comprises a set of opposite sides which are parallel to each other and a perpendicular side, the perpendicular side is perpendicular to the set of opposite sides, two perpendicular sides of the two third sub-pixels are adjacent to each other; and the bases of the first sub-pixel and the second sub-pixel are parallel to the set of opposite sides of each of the two third sub-pixels.

26. The pixel arrangement structure according to claim 1, wherein the first sub-pixel and the second sub-pixel both have a trapezoidal shape, of which a corner at an end point of a long base of the trapezoidal shape being removed, short bases of the first sub-pixel and the second sub-pixel are opposite to each other;

each of the two third sub-pixels has a pentagon shape, the pentagon shape comprises a set of opposite sides which are parallel to each other and a perpendicular side, the perpendicular side is perpendicular to the set of parallel sides, two perpendicular sides of the two third sub-pixels are adjacent to each other; and the bases of the first sub-pixel and the second sub-pixel are parallel to the set of opposite sides of each of the two third sub-pixels.

27. The pixel arrangement structure according to claim 1, wherein both the first sub-pixel and the second sub-pixel have a hexagonal shape, and three sets of opposite sides of the hexagonal shape are respectively parallel;

each of the two third sub-pixels has a pentagon shape, the pentagon shape comprises a set of opposite sides which are parallel to each other and a perpendicular side, the perpendicular side is perpendicular to the set of parallel sides, perpendicular sides of the two third sub-pixels are adjacent to each other; and one of the three sets of opposite sides with the largest length of the first sub-pixel and one of the three sets of opposite sides with the largest length of the second sub-pixel are parallel to the set of opposite sides of each of the two third sub-pixels which are parallel to each other.

28. The pixel arrangement structure according to claim 25, wherein
each of sub-pixels has a shape with rounded corners.

29. A pixel arrangement structure, comprising a plurality of first sub-pixels, a plurality of second sub-pixels, and a plurality of third sub-pixels, wherein the plurality of third sub-pixels are arranged in pairs to form a plurality of third sub-pixel pairs each of which includes two adjacent third sub-pixels, the plurality of third sub-pixel pairs are arranged in a first direction, and one first sub-pixel and one second sub-pixel are provided between any two third sub-pixel pairs adjacent in the first direction to form a plurality of sub-pixel rows, the plurality of sub-pixel rows are arranged in a second direction, the first direction and the second direction are different directions, two third sub-pixels in each of the plurality of third sub-pixel pairs are arranged in one of the first direction and the second direction, the first sub-pixels and the second sub-pixels between the two third sub-pixel pairs adjacent in the first direction are arranged in the other one of the first direction and the second direction, wherein, in an arrangement direction of the two third sub-pixels in each of the plurality of third sub-pixel pairs, a size of each of the plurality of third sub-pixel pairs is greater than a size of the first sub-pixel and the second sub-pixel.

30. The pixel arrangement structure according to claim 29, wherein
adjacent ones of the plurality of sub-pixel rows are shifted from each other in the first direction.

31. A display substrate, comprising the pixel arrangement structure according to claim 1.

32. The display substrate according to claim 31, further comprising: a plurality of main signal lines and a plurality of auxiliary signal lines, wherein the two third sub-pixels are located between two adjacent ones of the plurality of main signal lines, at least one auxiliary signal line is provided between the two adjacent ones of the plurality of main signal lines, and the at least one auxiliary signal line is connected with the two adjacent ones of the plurality of main signal lines, and passes through a gap between the two third sub-pixels.

33. The display substrate according to claim 32, wherein the plurality of main signal lines are configured to supply a reference voltage or a common voltage to the plurality of repeating units.

34. The display substrate according to claim 32, wherein the first sub-pixel, the second sub-pixel and the third sub-pixel each comprises an anode, the plurality of main signal lines and the plurality of auxiliary signal lines are located in a same layer with the anode.

35. The display substrate according to claim 31, further comprising at least one of the following spacers:

a first spacer, located between the first sub-pixel and the third sub-pixel which are adjacent to each other in adjacent ones of the plurality of repeating unit groups;

a second spacer, located between the second sub-pixel and the third sub-pixel which are adjacent to each other in adjacent ones of the plurality of repeating unit groups; and a third spacer, located between the two third sub-pixels in each of the repeating units.

36. The display substrate according to claim 35, wherein the first spacer and the second spacer have an elongated shape, an extending direction of the elongated shape is different from both the first direction and the second direction.

37. The display substrate according to claim 36, wherein the extending direction and the first direction have an angle of 40°-50° or 130°-140° therebetween.

38. The display substrate according to claim 35, wherein the first sub-pixel is a red sub-pixel, the second sub-pixel is a blue sub-pixel, the third sub-pixel is a green sub-pixel, the first spacer is not overlapped with a line passing through centers of the second sub-pixel and the third sub-pixel which are adjacent to each other in adjacent ones of the plurality of repeating unit groups.

39. The display substrate according to claim 35, wherein a projection of the first spacer on a line in the first direction and a projection of the first sub-pixel and the second sub-pixel on the line in the first direction are not overlapped with each other, or partially overlapped with each other.

40. The display substrate according to claim 35, wherein a ratio of a number of the spacers to a number of sub-pixels is in a range from 0.3 to 1.

41. A display device, comprising the display substrate according to claim 31.

42. A driving method for the pixel arrangement structure according to claim 1, wherein the first direction is a row direction, the second direction is a column direction;

the plurality of sub-pixels in the pixel arrangement structure form a plurality of virtual pixels arranged in an array, the virtual pixels include first type virtual pixels and second type virtual pixels, each of the first type virtual pixels comprises one first sub-pixel and one third sub-pixel, and each of the second type virtual pixels comprises one second sub-pixel and one third sub-pixel;

the plurality of virtual pixels are arranged in the row direction and the column direction to form a pixel array, if the first sub-pixel and a first one of the two third sub-pixels in one of the plurality of repeating units belongs to a virtual pixel of ith column and jth row, the second sub-pixel in the one of the plurality of repeating units belongs to a virtual pixel of (i+1) th column and the jth row, and the other one of the two sub-pixels in the one of the plurality of repeating units belongs to a virtual pixel of the ith column and (j−1)th row;

with regard to the one of the plurality of repeating units, the driving method comprises:

acquiring an actual data signal of the first sub-pixel of the ith column and the jth row according to a theory data signal of a first logical sub-pixel of a first logical pixel of (i−1)th column and the (j−1)th row and a theory data signal of a first logical sub-pixel of a second logical pixel of the (i−1)th column and the jth row;

acquiring an actual data signal of the third sub-pixel of the ith column and the jth row according to a theory data signal of a third logical sub-pixel of a third logical pixel of ith column and the jth row;

acquiring an actual data signal of the second sub-pixel of the (i+1)th column and the jth row according to a theory data signal of a second logical sub-pixel of a fourth logical pixel of (i+1)th column and the (j−1)th row and a theory data signal of a second logical sub-pixel of a fifth logical pixel of the (i+1)th column and the jth row; and acquiring an actual data signal of the third sub-pixel of the ith column and the (j−1)th row according to a theory data signal of a third logical sub-pixel of a sixth logical pixel of ith column and the (j−1)th row, wherein i is a positive integer greater than or equal to 2, and j is a positive integer greater than or equal to 2.

43. The driving method according to claim 42, wherein the actual data signal of the first sub-pixel of the ith column and the jth row is represented as:

$$X_{i,j} = (\alpha_1 \cdot x_{i-1,j-1}^\gamma + \alpha_2 \cdot x_{i-1,j}^\gamma)^{\frac{1}{\gamma}}$$

wherein $X_{i,j}$ represents the actual data signal of the first sub-pixel of the ith column and the jth row, $x_{i-1,j-1}$ represents the theory data signal of the first logical sub-pixel of the first logical pixel of the (i−1)th column and the (j−1)th row, $x_{i-1,j}$ represents the theory data signal of the first logical sub-pixel of the second logical pixel of the (i−1)th column and the jth row, and α1 and α2 respectively represent weight of $X_{i-1,j}$, $x_{i-1,j}$, and γ is a constant;

the actual data signal of the third sub-pixel of the ith column and the jth row is represented as:

$$G_{i,j} = g_{i,j}$$

wherein $G_{i,j}$ represents the actual data signal of the third sub-pixel of the ith column and the jth row, $g_{i,j}$ represents the theory data signal of the third logical sub-pixel of the third logical pixel of ith column and the jth row;

the actual data signal of the second sub-pixel of the (i+1)th column and the jth row is represented as:

$$Y_{i+1,j} = (\beta_1 \cdot y_{i+1,j-1}^\gamma + \beta_2 \cdot y_{i+1,j}^\gamma)^{\frac{1}{\gamma}}$$

wherein $Y_{i+1,j}$ represents the actual data signal of the second sub-pixel of the (i+1)th column and the jth row, $y_{i+1,j-1}$ represents the theory data signal of the second logical sub-pixel of the fourth logical pixel of (i+1)th column and the (j−1)th row, and $y_{i+1,j}$ represents the theory data signal of the second logical sub-pixel of the fifth logical pixel of the (i+1)th column and the jth row; β1 and β2 respectively represent weight of $y_{i+1,j-1}$ and $y_{i+1,j}$, the actual data signal of the third sub-pixel of the ith column and the (j−1)th row is represented as:

$$G_{i,j-1} = g_{i,j-1}$$

wherein $G_{i,j-1}$ represents the actual data signal of the third sub-pixel of the ith column and the (j−1)th row, $g_{i,j-1}$ represents the theory data signal of the third logical sub-pixel of the sixth logical pixel of the ith column and the (j−1)th row.

44. A driving method of the pixel arrangement structure according to claim 1, wherein the first direction is a column direction, the second direction is a row direction;

the plurality of sub-pixels in the pixel arrangement structure form a plurality of virtual pixels arranged in an array, the virtual pixels include first type virtual pixels and second type virtual pixels, each of the first type virtual pixels comprises one first sub-pixel and one third sub-pixel, and each of the second type virtual pixels comprises one second sub-pixel and one third sub-pixel;

the plurality of virtual pixels are arranged in the row direction and the column direction to form a pixel array, if the first sub-pixel and one of the two third sub-pixels in one of the plurality of repeating units belongs to a virtual pixel of ith column and jth row, the second sub-pixel in the one of the plurality of repeating units belongs to a virtual pixel of ith column and the (j+1)th row, and the other one of the two sub-pixels in the one of the plurality of repeating units belongs to a virtual pixel of the (i−1)th column and jth row;

with regard to the one of the plurality of repeating units, the driving method comprises:

acquiring an actual data signal of the first sub-pixel of the ith column and the jth row according to a theory data signal of a first logical sub-pixel of a first logical pixel of (i−1)th column and the (j−1)th row and a theory data signal of a first logical sub-pixel of a second logical pixel of the ith column and the (j−1)th row;

acquiring an actual data signal of the third sub-pixel of the ith column and the jth row according to a theory data signal of a third logical sub-pixel of a third logical pixel of the ith column and the jth row;

acquiring an actual data signal of the second sub-pixel of the ith column and the (j+1)th row according to a theory data signal of a second logical sub-pixel of a fourth logical pixel of (i−1)th column and the (j+1)th row and a theory data signal of a second logical sub-pixel of a fifth logical pixel of the ith column and the (j+1)th row; and acquiring an actual data signal of the third sub-pixel of the (i−1)th column and the jth row according to a theory data signal of a third logical sub-pixel of a sixth logical pixel of (i−1)th column and the jth row, wherein i is a positive integer greater than or equal to 2, and j is a positive integer greater than or equal to 2.

45. The driving method according to claim 44, wherein the actual data signal of the first sub-pixel of the ith column and the jth row is represented as:

$$X_{i,j} = (\alpha_1 \cdot x^\gamma_{i-1,j-1} + \alpha_2 \cdot x^\gamma_{i,j-1})^{\frac{1}{\gamma}}$$

wherein $X_{i,j}$ represents the actual data signal of the first sub-pixel of the ith column and the jth row, represents the theory data signal of the first logical sub-pixel of the first logical pixel of the (i−1)th column and the (j−1)th row, $x_{i-1,j}$ represents the theory data signal of the first logical sub-pixel of the second logical pixel of the ith column and the (j−1)th row, and α1 and α2 respectively represent weight of $x_{i-1,j-1}$ and $x_{i,j-1}$, γ is a constant;

the actual data signal of the third sub-pixel of the ith column and the jth row is represented as:

$$G_{i,j} = g_{i,j}$$

wherein $G_{i,j}$ represents the actual data signal of the third sub-pixel of the ith column and the jth row, $g_{i,j}$ represents the theory data signal of the third logical sub-pixel of the third logical pixel of ith column and the jth row;

the actual data signal of the second sub-pixel of the ith column and the (j+1)th row is represented as:

$$Y_{i,j+1} = (\beta_1 \cdot y^\gamma_{i-1,j+1} + \beta_2 \cdot y^\gamma_{i,j+1})^{\frac{1}{\gamma}}$$

wherein $Y_{i,j+1}$ represents the actual data signal of the second sub-pixel of the ith column and the (j+1)th row, $y_{i-1,j+1}$ represents the theory data signal of the second logical sub-pixel of the fourth logical pixel of (i−1)th column and the (j+1)th row, and $y_{i,j+1}$ represents the theory data signal of the second logical sub-pixel of the fifth logical pixel of the ith column and the (j+1)th row; β1 and β2 respectively represent weight of $y_{i-1,j+1}$ and $y_{i,j+1}$, the actual data signal of the third sub-pixel of the (i−1)th column and the jth row is represented as:

$$G_{i-1,j} = g_{i-1,j}$$

wherein $G_{i-1,j}$ represents the actual data signal of the third sub-pixel of the (i−1)th column and the jth row, $g_{i-1,j}$ represents the theory data signal of the third logical sub-pixel of the sixth logical pixel of (i−1)th column and the jth row.

46. A pixel arrangement structure, comprising a plurality of first sub-pixels, a plurality of second sub-pixels, and a plurality of third sub-pixels,
wherein the plurality of third sub-pixels are arranged in pairs to form a plurality of third sub-pixel pairs each of which includes two adjacent third sub-pixels, one first sub-pixel and one second sub-pixel form one mixed sub-pixel pair,
the plurality of third sub-pixel pairs and a plurality of mixed sub-pixel pairs are alternately arranged in a row direction and a column direction,
three first sub-pixels and three second sub-pixels are disposed around each of the plurality of third sub-pixel pairs, the three first sub-pixels and the three second sub-pixels are alternately arranged in a circumferential direction,
four third sub-pixel pairs are disposed around each of the plurality of mixed sub-pixel pairs, and are respectively located at two sides of each of the plurality of mixed sub-pixel pairs in the row direction and two sides of each of the plurality of mixed sub-pixel pairs in the column direction,
wherein an interval between two sub-pixels in the mixed sub-pixel pair is greater than that in the third sub-pixel pair.

47. The pixel arrangement structure according to claim 46, wherein the third sub-pixels in the third sub-pixel pair are arranged in one of a first direction and a second direction, the first sub-pixel and the second sub-pixel in the mixed sub-pixel pair are arranged in the other one of the first direction and the second direction.

* * * * *

UNITED STATES PATENT AND TRADEMARK OFFICE
CERTIFICATE OF CORRECTION

PATENT NO. : 10,854,684 B2
APPLICATION NO. : 16/234777
DATED : December 1, 2020
INVENTOR(S) : Huangfu et al.

Page 1 of 1

It is certified that error appears in the above-identified patent and that said Letters Patent is hereby corrected as shown below:

In the Claims

In Column 53, Line 19, Claim 45 please change:
"and the jth row, represents"
To read:
--and the jth row, Xi-1,j-1 represents--

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*